(12) United States Patent  
Liao et al.

(10) Patent No.: US 12,506,078 B2  
(45) Date of Patent: Dec. 23, 2025

(54) SEMICONDUCTOR DEVICES WITH FRONT SIDE TO BACKSIDE CONDUCTIVE PATHS AND METHODS OF FABRICATION THEREOF

(71) Applicant: TAIWAN SEMICONDUCTOR MANUFACTURING COMPANY, LTD., Hsinchu (TW)

(72) Inventors: Yi-Bo Liao, Hsinchu (TW); Yu-Xuan Huang, Hsinchu (TW); Hou-Yu Chen, Hsinchu (TW); Kuan-Lun Cheng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 875 days.

(21) Appl. No.: 17/460,482

(22) Filed: Aug. 30, 2021

(65) Prior Publication Data

US 2023/0063786 A1   Mar. 2, 2023

(51) Int. Cl.
  *H01L 23/528*  (2006.01)
  *H01L 21/02*   (2006.01)
  *H10D 30/01*   (2025.01)
  *H10D 30/67*   (2025.01)
  *H10D 62/10*   (2025.01)
  *H10D 64/01*   (2025.01)
  *H10D 64/62*   (2025.01)

(52) U.S. Cl.
  CPC ...... *H01L 23/5286* (2013.01); *H01L 21/0259* (2013.01); *H10D 30/031* (2025.01); *H10D 30/6729* (2025.01); *H10D 30/6735* (2025.01); *H10D 30/6757* (2025.01); *H10D 62/118* (2025.01); *H10D 64/01* (2025.01); *H10D 64/017* (2025.01); *H10D 64/62* (2025.01)

(58) Field of Classification Search
  CPC ............ H01L 23/5286; H01L 21/0259; H01L 29/0665; H01L 29/401; H01L 29/41733; H01L 29/42392; H01L 29/45; H01L 29/66545; H01L 29/66742; H01L 29/78696; H10D 30/031; H10D 30/6729; H10D 30/6735; H10D 30/6757; H10D 62/118; H10D 64/01; H10D 64/017; H10D 64/62
  See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,379,025 B1 * | 6/2016 | Basker ............... H10D 84/038 |
| 9,412,817 B2 | 8/2016 | Yang et al. |
| 9,412,828 B2 | 8/2016 | Ching et al. |

(Continued)

*Primary Examiner* — Benjamin Tzu-Hung Liu  
(74) *Attorney, Agent, or Firm* — NZ Carr Law Office

(57) ABSTRACT

Embodiments of the present disclosure provide semiconductor devices having a front side to backside conductive path through a source/drain feature. In some embodiments, the front side to backside conductive path may be formed through a source/drain feature in a standard cell. The other embodiments, the front side to backside conductive path is formed through a source/drain feature in a filler cell. The front side to backside conductive path enables flexible routing for local connections, backside signal connections, and/or backside power rail connection.

20 Claims, 53 Drawing Sheets

(56) References Cited

U.S. PATENT DOCUMENTS

| | | |
|---|---|---|
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2019/0371890 A1* | 12/2019 | Goktepeli ............ H10D 86/201 |
| 2019/0378790 A1* | 12/2019 | Bohr .................. H10D 30/6219 |
| 2019/0378836 A1* | 12/2019 | Wang .............. H01L 21/823475 |
| 2020/0066854 A1* | 2/2020 | Nelson .................... H01L 29/78 |
| 2022/0399336 A1* | 12/2022 | Guler .................. H01L 29/7851 |

* cited by examiner

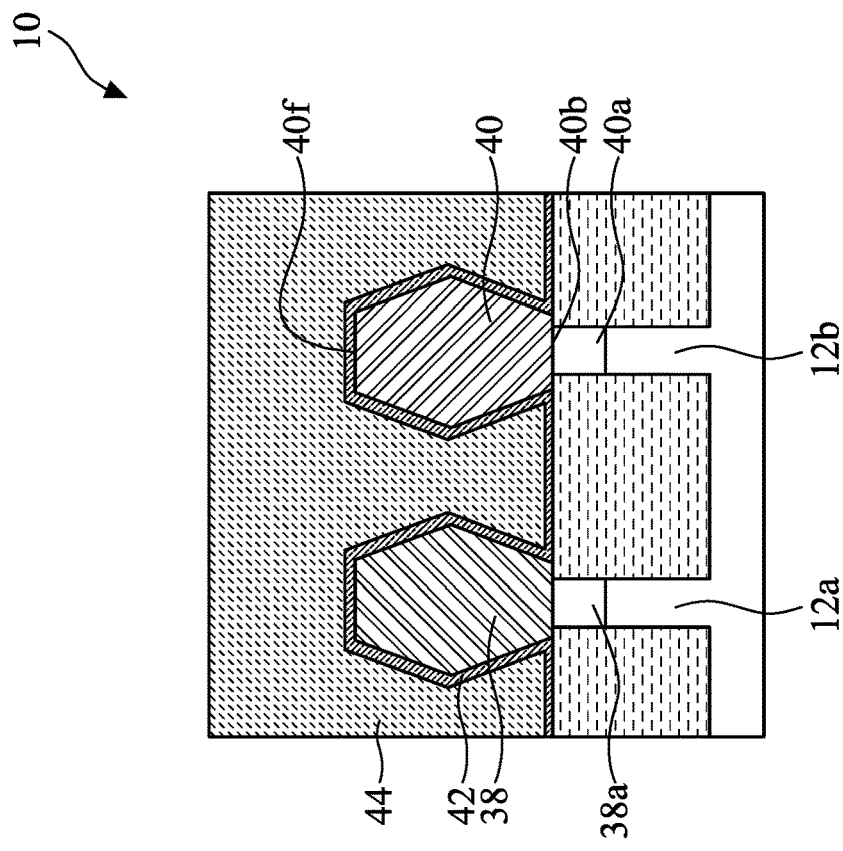
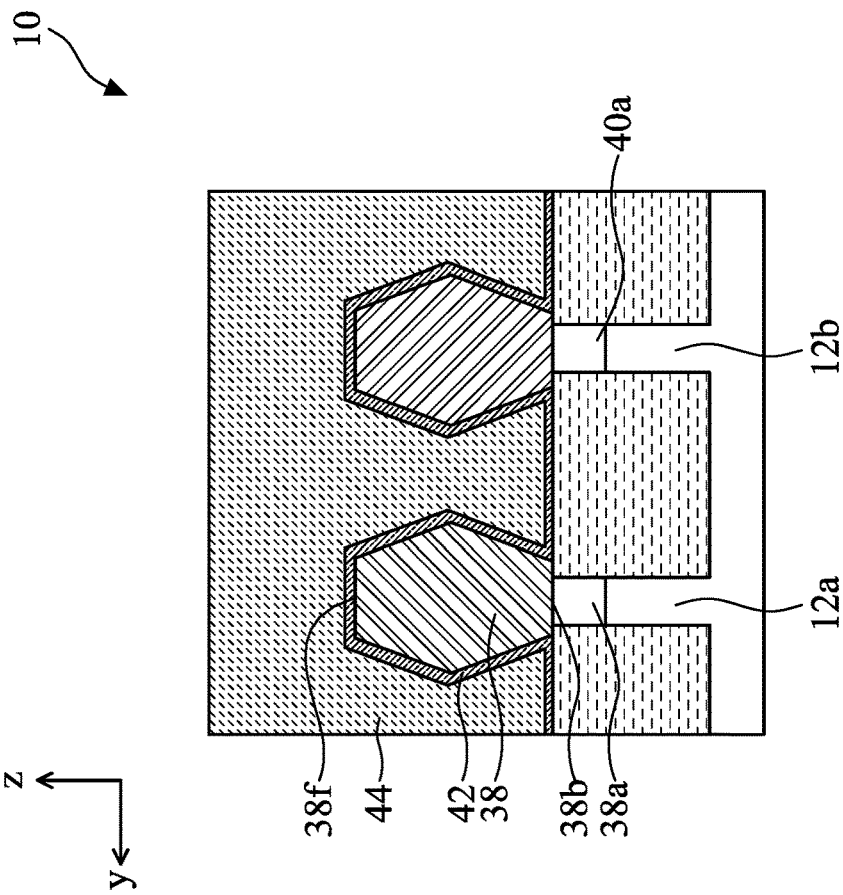
Fig. 10B
Fig. 10C

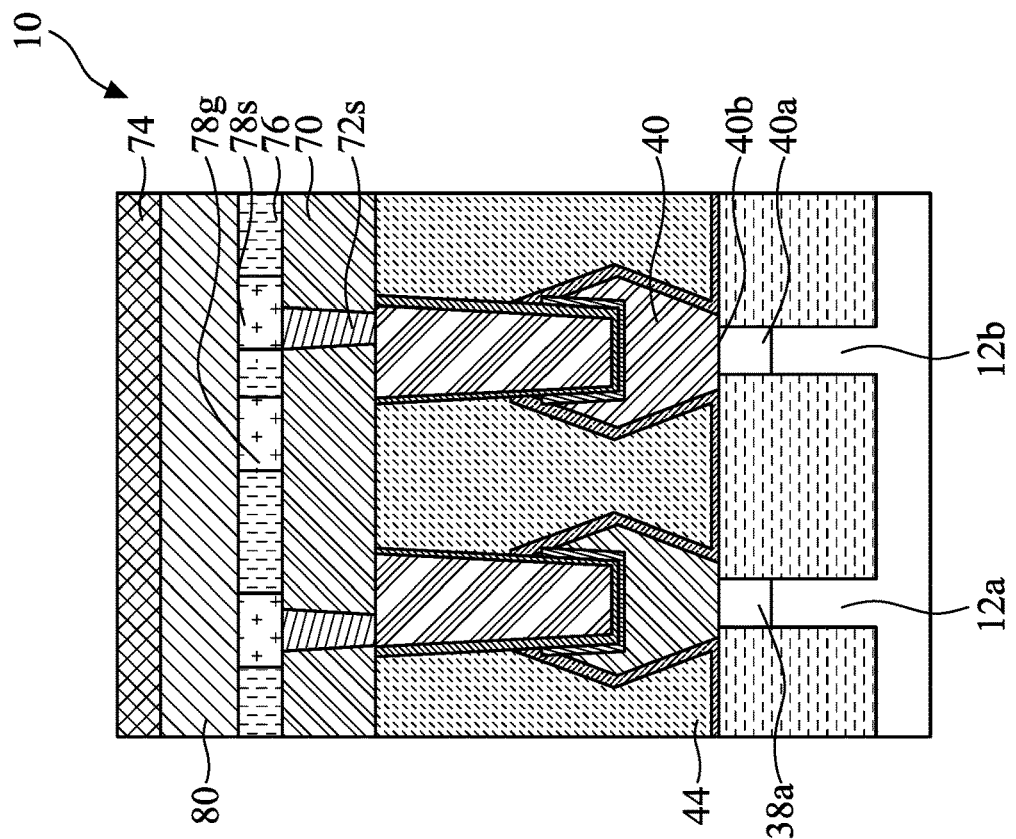
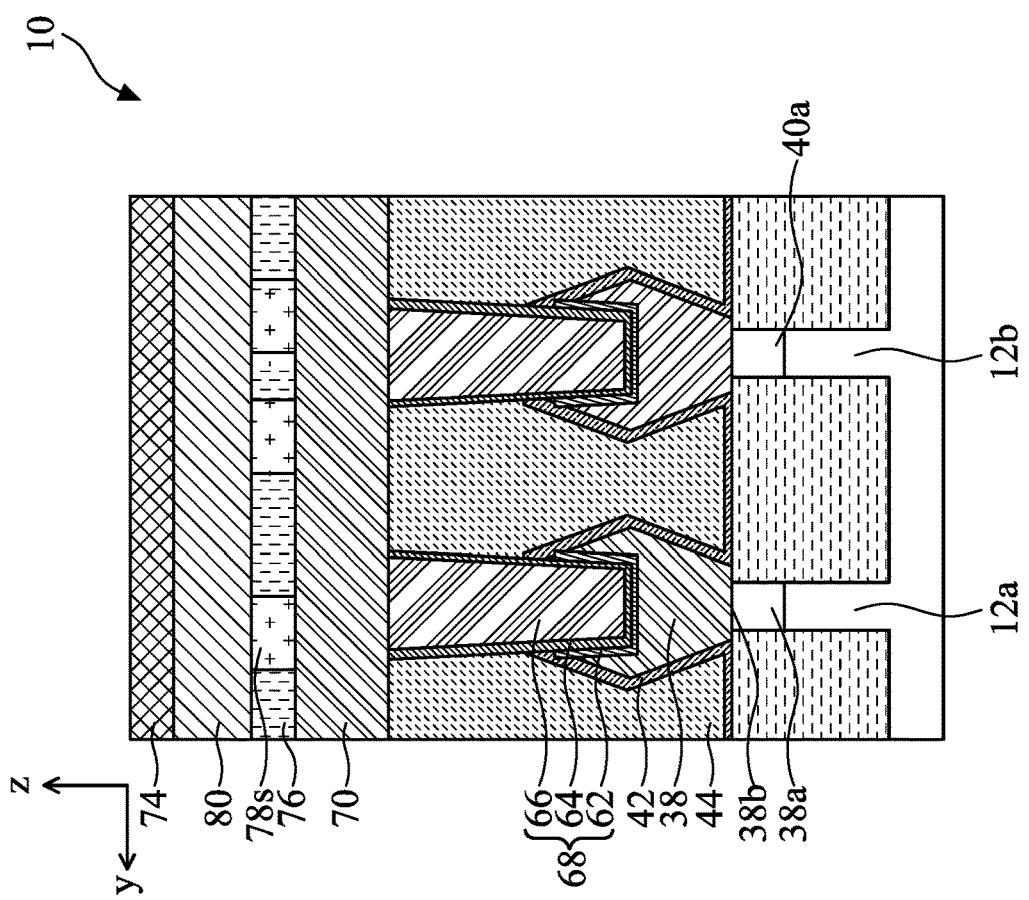
Fig. 12B
Fig. 12C

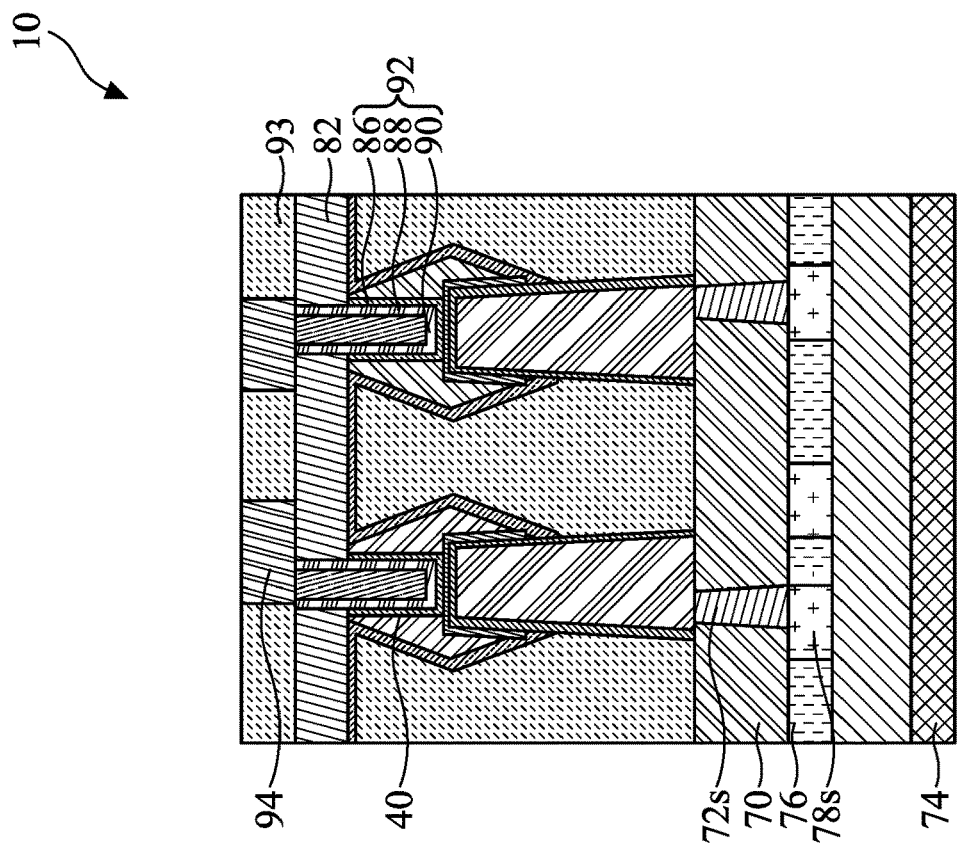
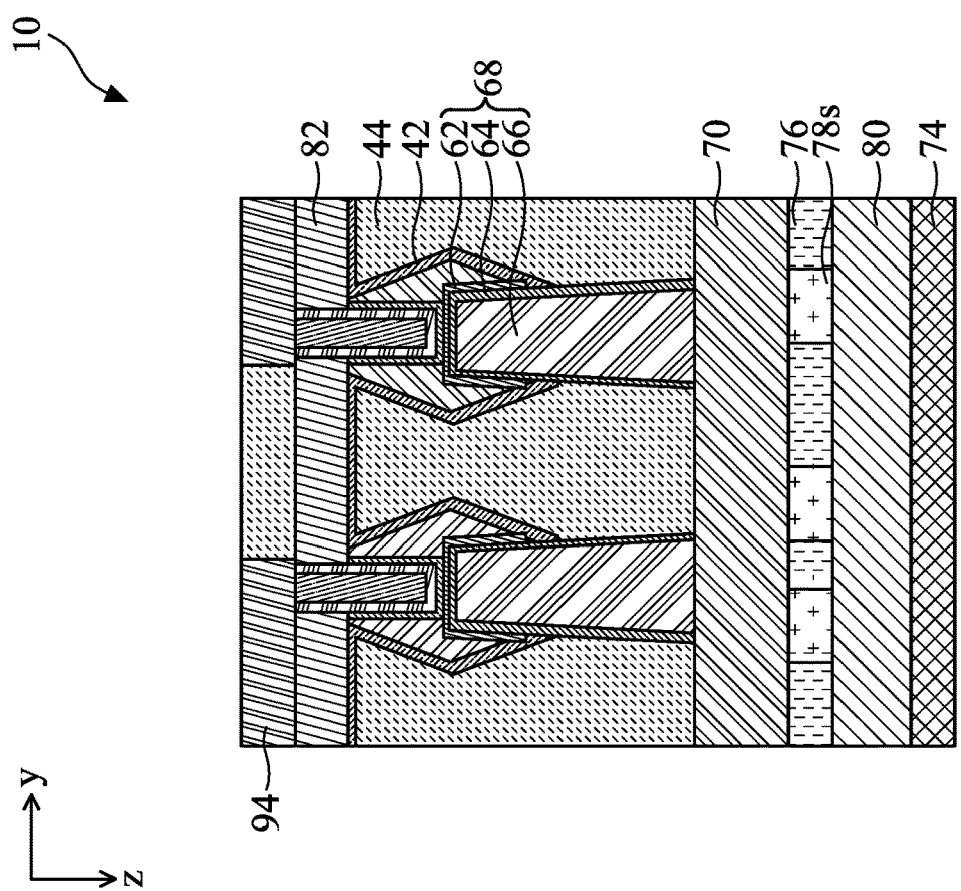
Fig. 18C
Fig. 18B

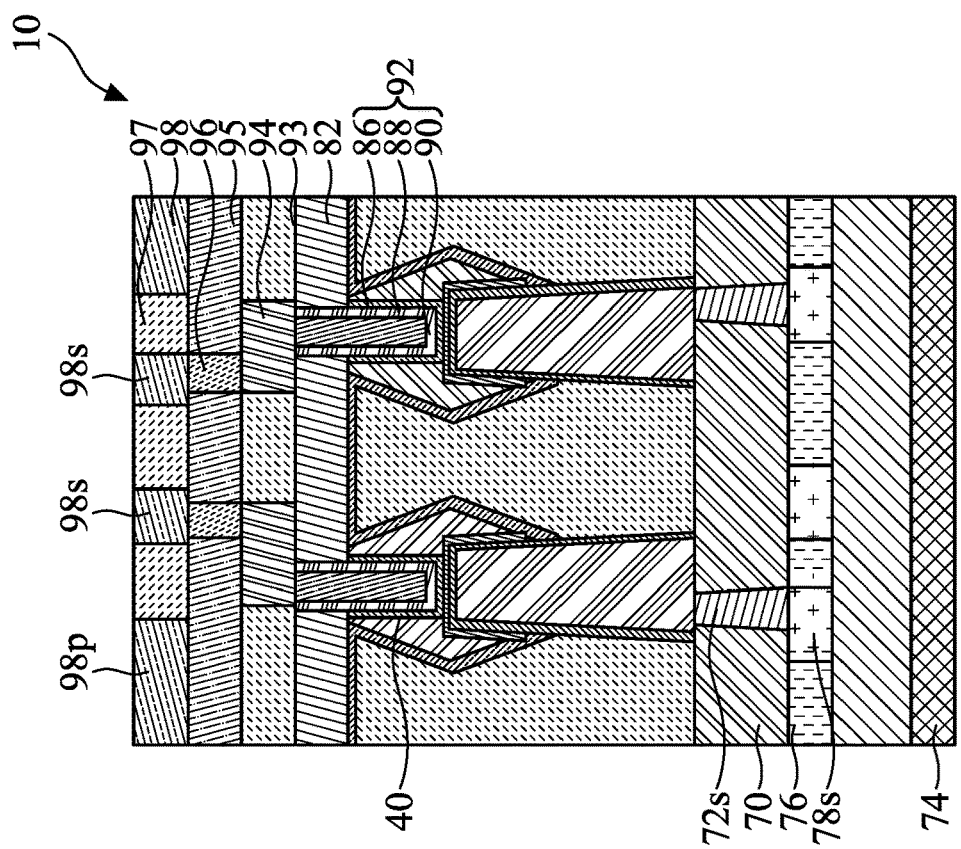
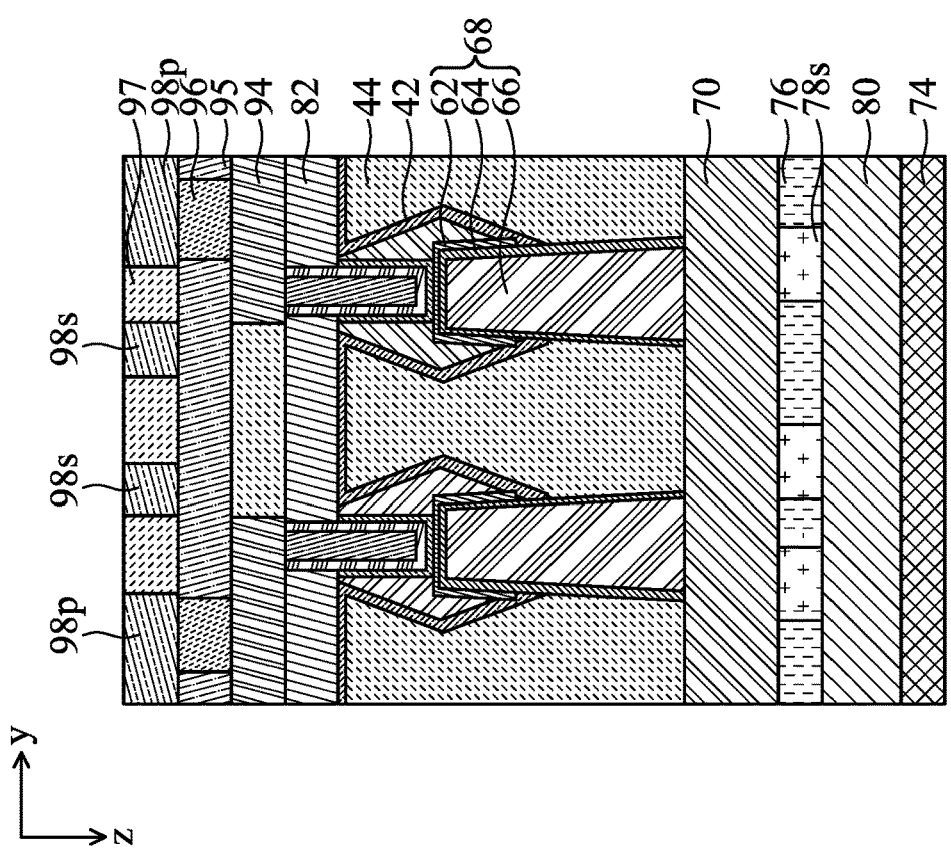
Fig. 19C
Fig. 19B

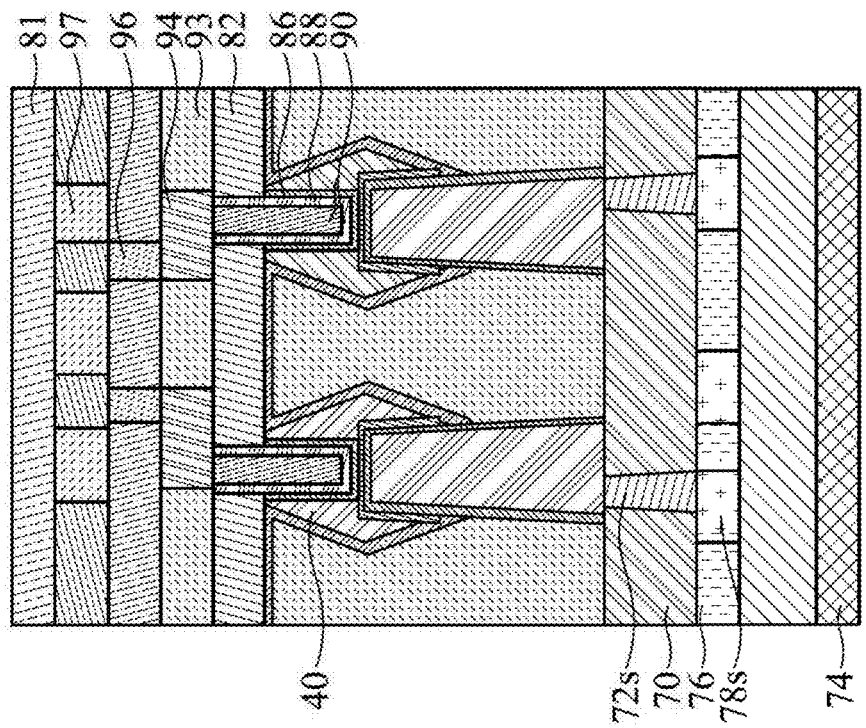
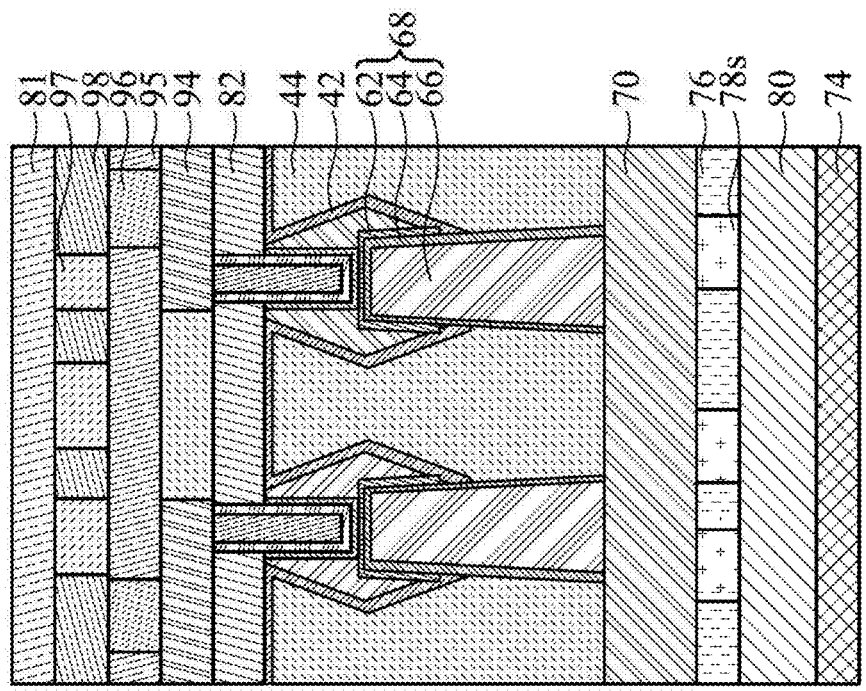
Fig. 20B
Fig. 20C

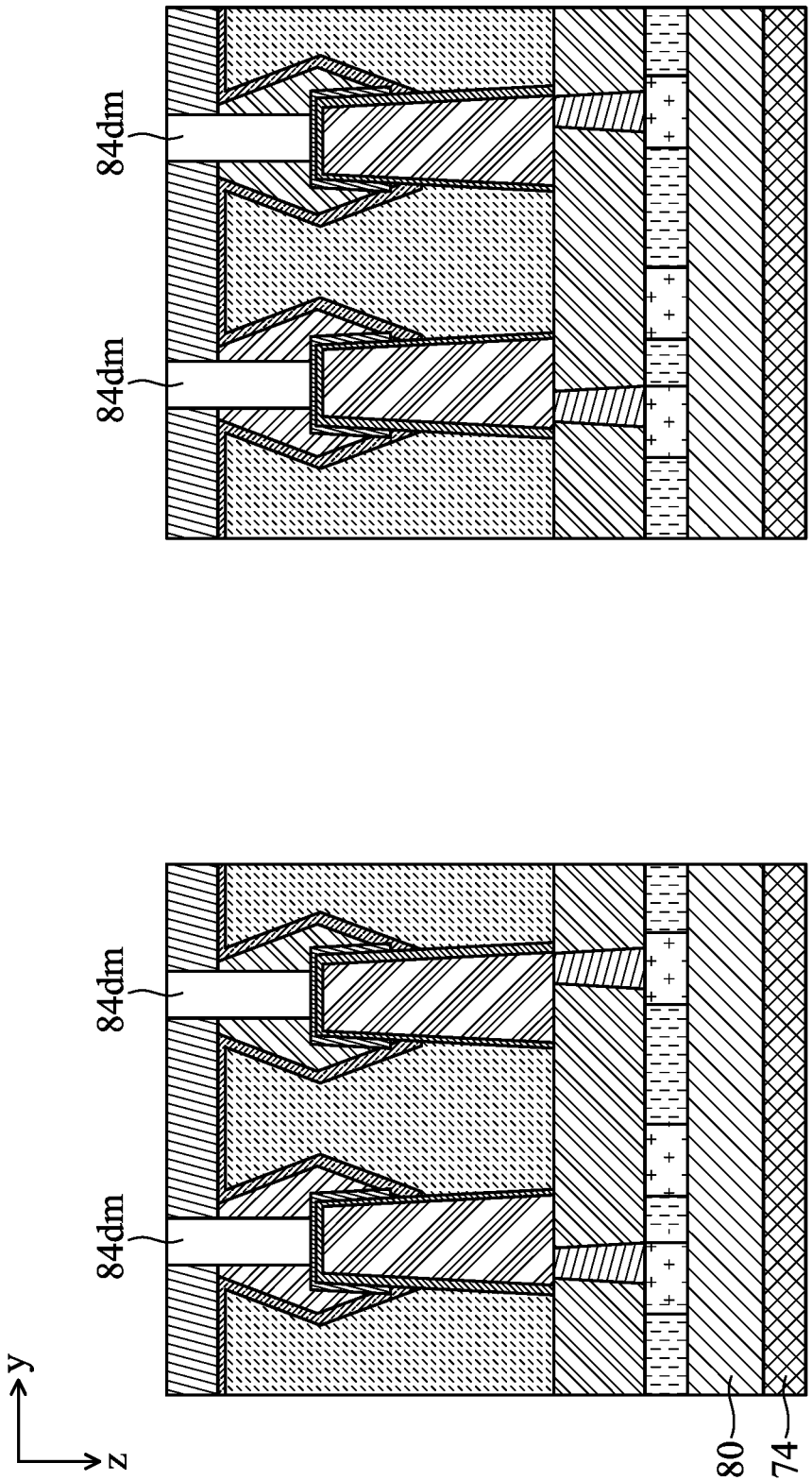

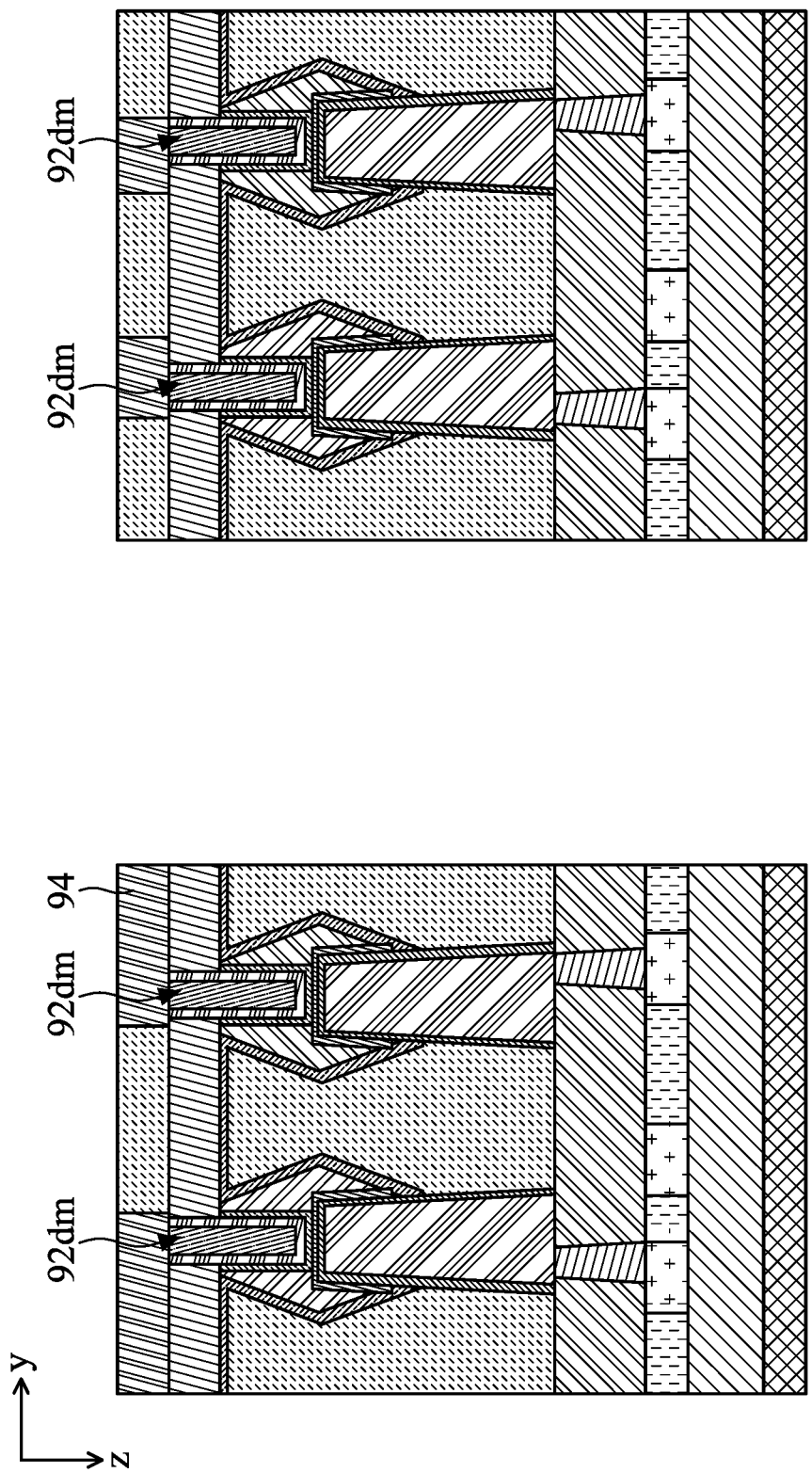

SEMICONDUCTOR DEVICES WITH FRONT SIDE TO BACKSIDE CONDUCTIVE PATHS AND METHODS OF FABRICATION THEREOF

BACKGROUND

The semiconductor industry has experienced continuous rapid growth due to constant improvements in the integration density of various electronic components. For the most part, this improvement in integration density has come from repeated reductions in minimum feature size, allowing more components to be integrated into a given chip area. As minimum feature size reduces, stacking architectures, such as power rail and signal routings, also needs improvements to achieve density increase.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 to 8, FIGS. 9A-B, FIGS. 10A-E, FIGS. 11A-C, FIGS. 12A-D to FIGS. 13A-D, and FIGS. 14A-C to FIGS. 20A-C schematically illustrate various stages of manufacturing a semiconductor device according to embodiments of the present disclosure.

DETAILED DESCRIPTION

Figure 1:
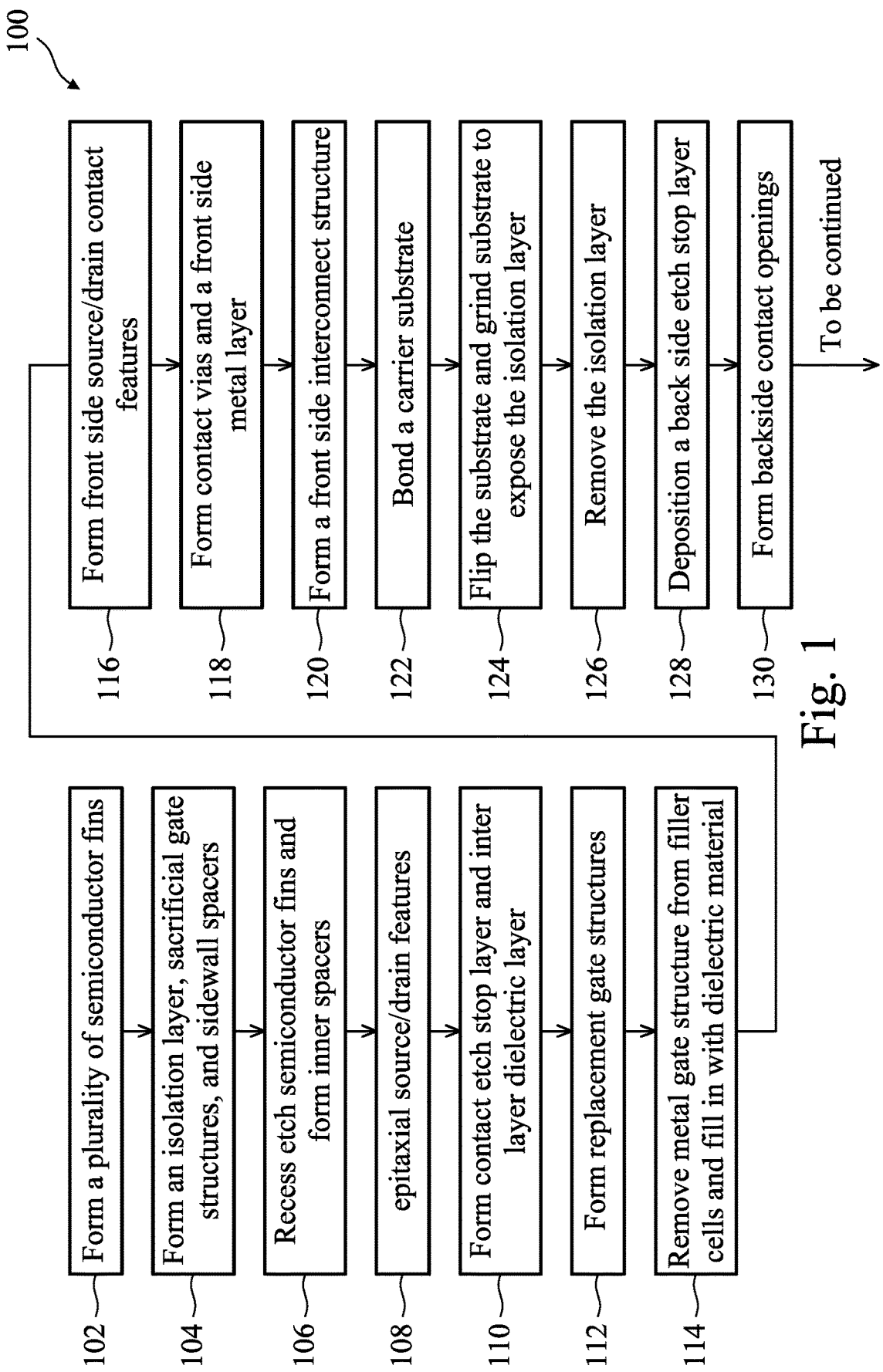
FIG. 1 is a flow chart of a method for manufacturing of a semiconductor device according to embodiments of the present disclosure.
Figure 1:
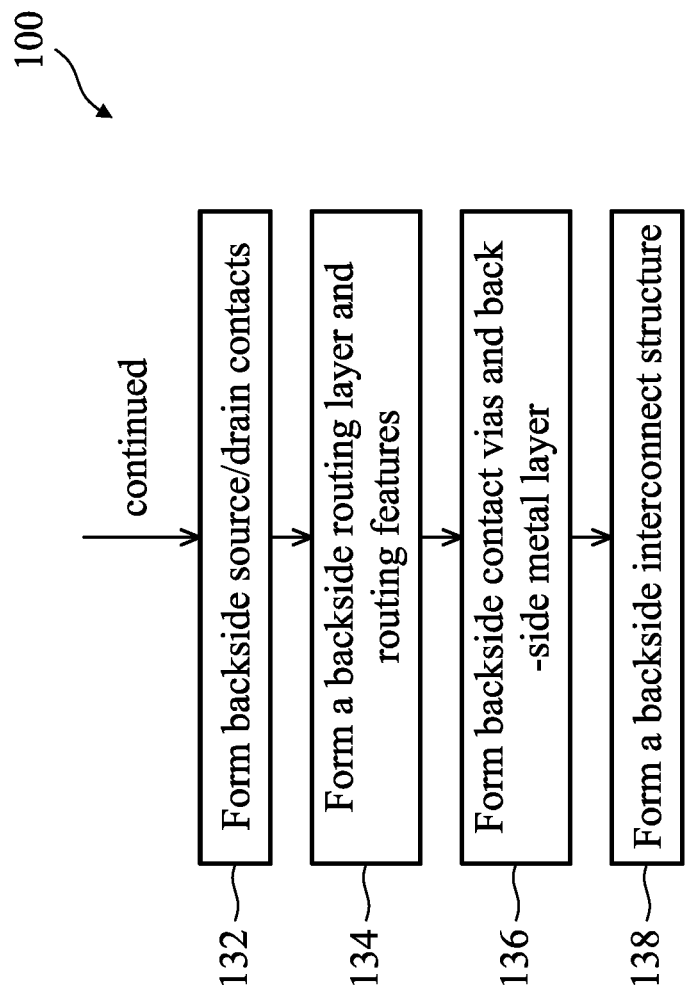

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 64 degrees or at other orientations) and the spatially relative descriptors used herein may likewise be interpreted accordingly.

The foregoing broadly outlines some aspects of embodiments described in this disclosure. While some embodiments described herein are described in the context of nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In addition, although method embodiments may be described in a particular order, various other method embodiments may be performed in any logical order and may include fewer or more steps than what is described herein. In the present disclosure, a source/drain refers to a source and/or a drain. A source and a drain are interchangeably used.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

An integrated circuit (IC) typically includes a plurality of semiconductor devices, such as field-effect transistors and metal interconnection layers formed on a semiconductor substrate. The interconnection layers, designed to connect the semiconductor devices to power supplies, input/output signals, and to each other, may include signal lines and power rails, such as a positive voltage rail (VDD) and a ground rail (GND). As semiconductor device size shrinks, space for metal power rails and signal lines decreases.

Embodiments of the present disclosure provide semiconductor devices having a front side to backside conductive path through a source/drain feature. In some embodiments, the front side to backside conductive path may be formed through a source/drain feature in a standard transistor cell. In other embodiments, the front side to backside conductive path is formed through a source/drain feature in a filler transistor cell. The front side to backside conductive path enables flexible routing for local connections, backside signal connections, and/or backside power rail connection.

FIG. 1 is a flow chart of a method 100 for manufacturing of a semiconductor device 10 according to embodiments of the present disclosure. FIGS. 2 to 8, FIGS. 9A-B, FIGS. 10A-E, and FIGS. 11A-C to FIGS. 20A-C schematically illustrate various stages of manufacturing the semiconductor device 10 according to embodiments of the present disclosure. FIGS. 2-8 are schematic perspective views of the semiconductor device 10 at various stages of the manufacturing process according to embodiments of the present disclosure. Additional operations can be provided before, during, and after operations/processes in the method 100, and some of the operations described below can be replaced or eliminated, for additional embodiments of the method. The order of the operations/processes may be interchangeable.

Figure 2:
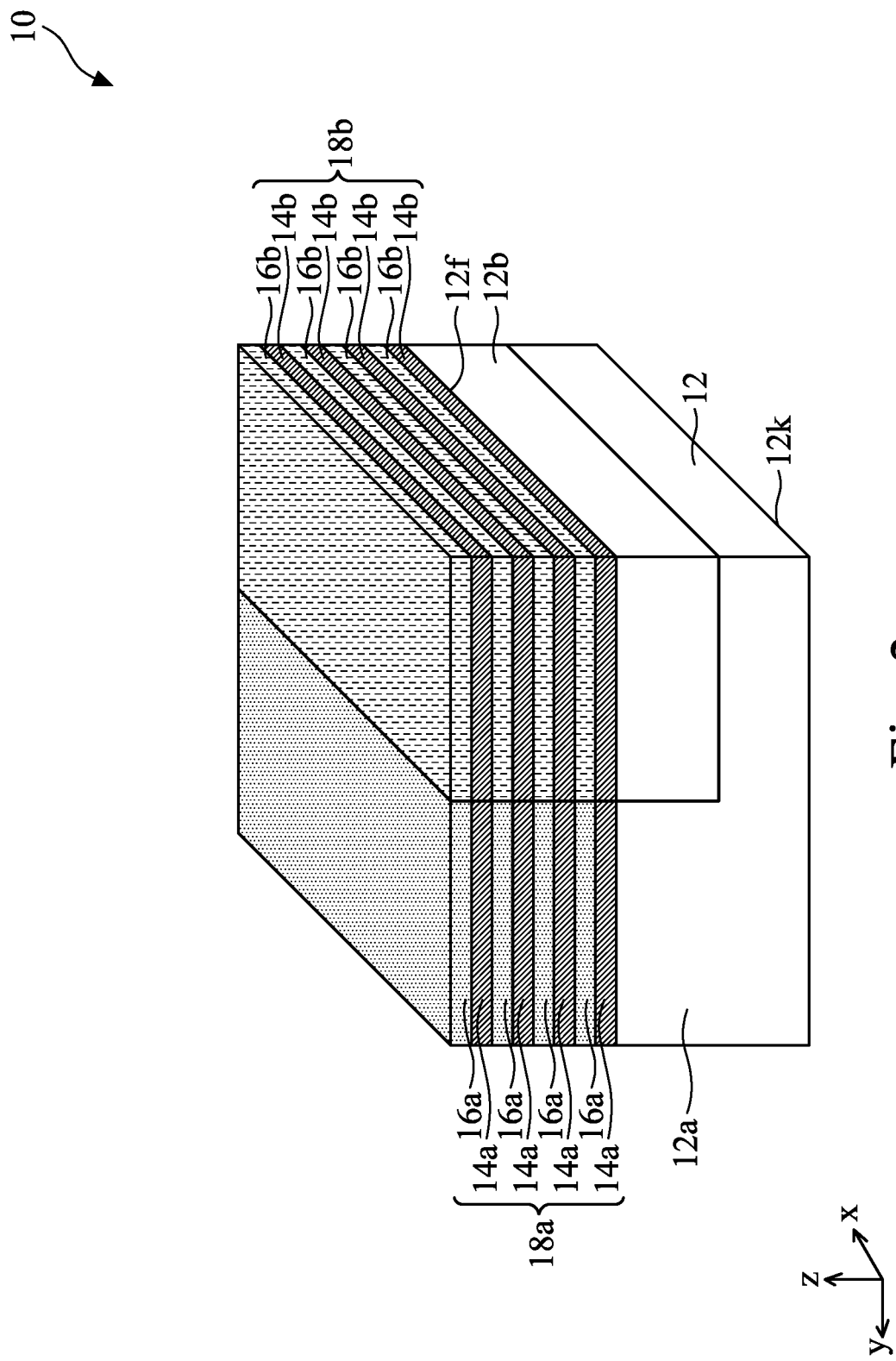
Figure 3:
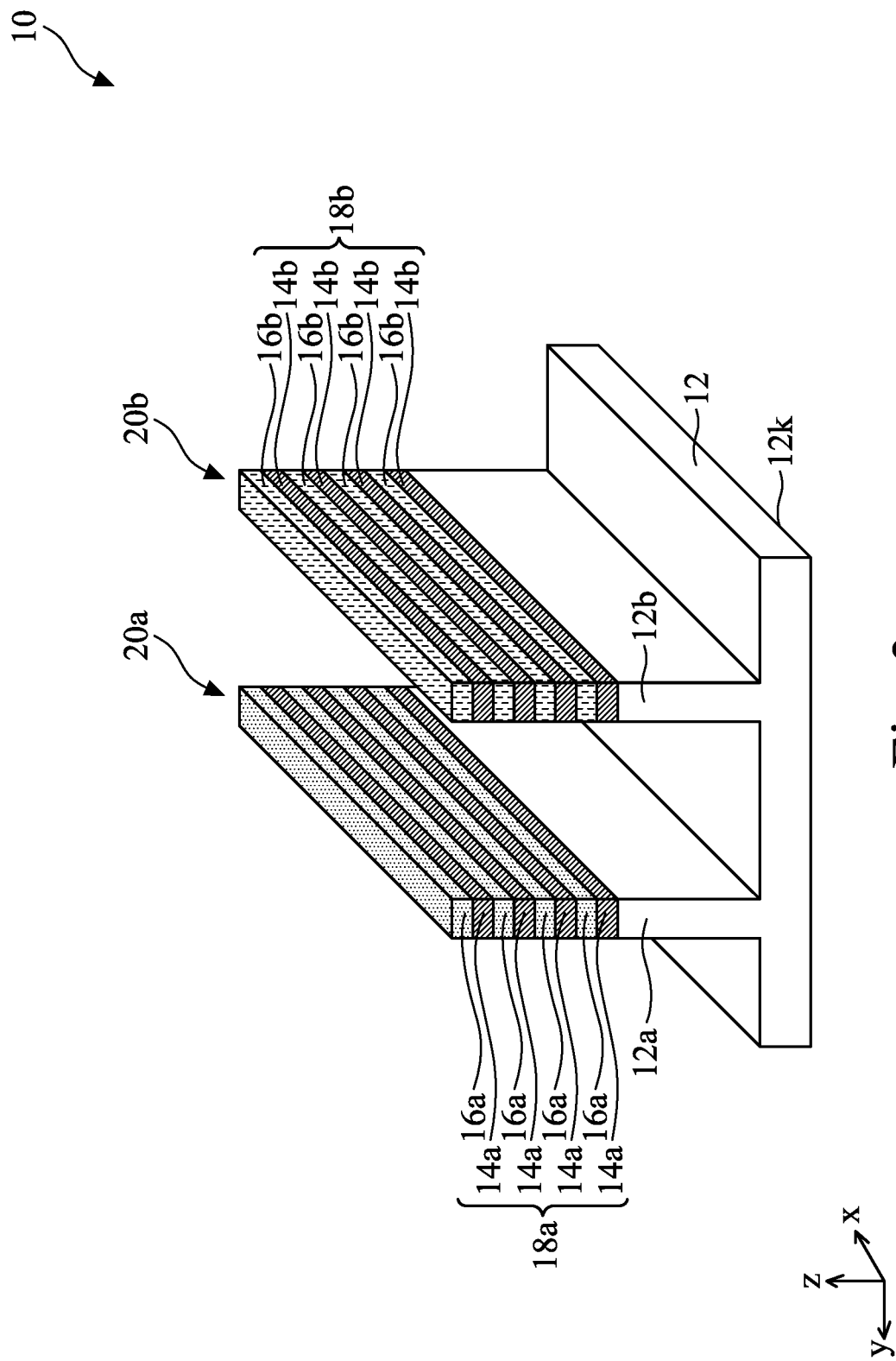

The method 100 begins at operation 102 where a plurality of semiconductor fins 20a, 20b are formed over a substrate 12, as shown in FIGS. 2 and 3. FIGS. 2 and 3 are schematic perspective views of the substrate 12 during operation 102.

In FIG. 2, the substrate 12 is provided to form the semiconductor device 10 thereon. The substrate 12 may include a single crystalline semiconductor material such as, but not limited to Si, Ge, SiGe, GaAs, InSb, GaP, GaSb, InAlAs, InGaAs, GaSbP, GaAsSb, and InP. The substrate 12 may include various doping configurations depending on circuit design. For example, different doping profiles, e.g., n-wells, p-wells, may be formed in the substrate 12 in regions designed for different device types, such as n-type field effect transistors (nFET), and p-type field effect transistors (pFET). In some embodiments, the substrate 12 may be a silicon-on-insulator (SOI) substrate including an insulator structure (not shown) for enhancement. The substrate 12 has a front side 12f and a backside 12k. In operation 102, the substrate 12 is being processed from the front side 12f.

In the embodiment shown in FIG. 2, the substrate 12 includes a p-doped region or p-well 12b and an n-doped region or n-well 12a. One or more n-type devices, such as nFETs, are to be formed over and/or within p-well 12bb. One or more p-type devices, such as pFETs, are to be formed over and/or within n-well 12a. FIG. 2 shows that the p-well 12b is in a doped local region of a doped substrate, which is not limiting. In other embodiments, the p-well 12b and the n-well 12a may be separated by one or more insulation bodies, e.g., shallow trench insulation ("STI").

A semiconductor stack 18a is formed over the n-well 12a. The semiconductor stack 18a includes alternating semiconductor layers made of different materials to facilitate formation of nanosheet channels in a multi-gate n-type device, such as nanosheet channel pFETs. In some embodiments, the semiconductor stack 18a includes first semiconductor layers 14a interposed by second semiconductor layers 16a. The first semiconductor layers 14a and second semiconductor layers 16a have different compositions. In some embodiments, the two semiconductor layers 14a and 16a provide for different oxidation rates and/or different etch selectivity. In later fabrication stages, portions of the second semiconductor layers 16a form nanosheet channels in a multi-gate device. Four first semiconductor layers 14a and four second semiconductor layers 16a are alternately arranged as illustrated in FIG. 2 as an example. More or less semiconductor layers 14a and 16a may be included in the semiconductor stack 18a depending on the desired number of channels in the semiconductor device to be formed. In some embodiments, the number of semiconductor layers 14a and 16a is between 1 and 10.

In some embodiments, the first semiconductor layer 14a may include silicon germanium (SiGe). The first semiconductor layer 14a may be a SiGe layer including more than 25% Ge in molar ratio. For example, the first semiconductor layer 14a may be a SiGe layer including Ge in a molar ration in a range between 25% and 50%. In some embodiments, the first semiconductor layer 14a and the first semiconductor layer 14? have substantially the same composition. The second semiconductor layer 16a may include silicon, Ge, a compound semiconductor such as SiC, GeAs, GaP, InP, InAs, and/or InSb, an alloy semiconductor such as SiGe, GaAsP, AlInAs, AlGaAs, InGaAs, GaInP, and/or GaInAsP, or combinations thereof. In some embodiments, the second semiconductor layer 16a may be a Ge layer. The second semiconductor layer 16a may include p-type dopants, boron etc.

A semiconductor stack 18b is formed over the p-well 12b. The semiconductor stack 18b includes alternating semiconductor layers made of different materials to facilitate formation of nanosheet channels in a multi-gate n-type device, such as nanosheet channel nFETs. In some embodiments, the semiconductor stack 18b includes third semiconductor layers 14b interposed by fourth semiconductor layers 16b. The third semiconductor layers 14b and fourth semiconductor layers 16b have different compositions. In some embodiments, the two semiconductor layers 14b and 16b provide for different oxidation rates and/or different etch selectivity. In later fabrication stages, portions of the fourth semiconductor layers 16b form nanosheet channels in a multi-gate device. Four third semiconductor layers 14b and four fourth semiconductor layers 16b are alternately arranged as illustrated in FIG. 2 as an example. More or less semiconductor layers 14b and 16b may be included in the semiconductor stack 18b depending on the desired number of channels in the semiconductor device to be formed. In some embodiments, the number of semiconductor layers 14b and 16b is between 1 and 10.

In some embodiments, the third semiconductor layer 14b may include silicon germanium (SiGe). The third semiconductor layer 14b may be a SiGe layer including more than 25% Ge in molar ratio. For example, the third semiconductor layer 14b may be a SiGe layer including Ge in a molar ration in a range between 25% and 50%. The fourth semiconductor layer 16b may include silicon (Si). In some embodiments, the fourth semiconductor layer 16b may include n-type dopants, such as phosphorus (P), arsenic (As), etc.

The semiconductor layers 14a, 14b, 16a, 16b may be formed by a molecular beam epitaxy (MBE) process, a metalorganic chemical vapor deposition (MOCVD) process, and/or other suitable epitaxial growth processes.

In some embodiments, each semiconductor layer 16a, 16b has a thickness in a range between about 5 nm and about 30 nm. In other embodiments, each second semiconductor layer 16a, 16b has a thickness in a range between about 10 nm and about 20 nm. In some embodiments, each semiconductor layer 16a, 16b has a thickness in a range between about 6 nm and about 12 nm. In some embodiments, the semiconductor layers 16a in the semiconductor stack 18a and the semiconductor layers 16b in the semiconductor stack 18b are uniform in thickness.

The semiconductor layers 14a, 14b may eventually be removed and serve to define a vertical distance between adjacent channel regions for a subsequently formed multi-gate device. In some embodiments, the thickness of the semiconductor layer 14a, 14b is equal to or greater than the thickness of the semiconductor layer 16a, 16b. In some embodiments, each semiconductor layer 14a, 14b has a thickness in a range between about 5 nm and about 50 nm. In other embodiments, each semiconductor layer 14a, 14b has a thickness in a range between about 10 nm and about 30 nm.

The semiconductor stacks 18a, 18b may be formed separately. For example, the semiconductor stack 18a is first formed over the entire substrate, i.e. over both the n-well 12a and the p-well 12b then recesses are formed in the semiconductor stacks 18a in areas over the p-well 12b to expose the p-well 12b, and the semiconductor stack 18b is then formed in the recesses over the p-well 12b while the semiconductor stack 18a is covered by a mask layer.

In FIG. 3, the semiconductor fins 20a, 20b are formed from the semiconductor stacks 18a, 18b and a portion of the n-well 12a, the p-well 12b underneath respectively. Each semiconductor fin 20a, 20b has an active portion formed from the semiconductor stacks 18a, 18b, and a well portion formed in the n-well 12a, the p-well 12b, respectively.

Figure 4:
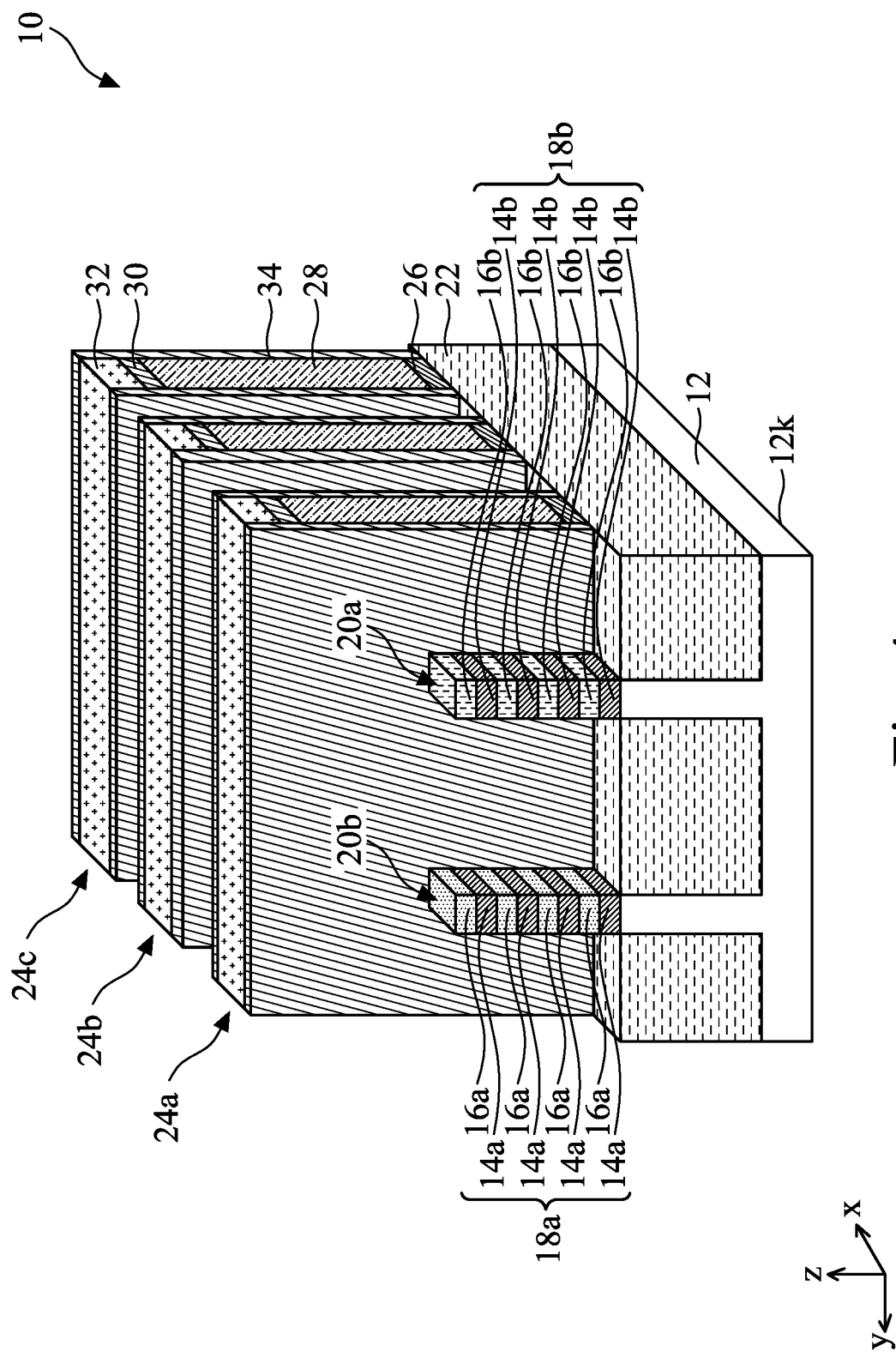

In operation 104, an isolation layer 22, sacrificial gate structures 24a, 24b, 24c, and sidewall spacers 34 are subsequently formed, as shown in FIG. 4. The isolation layer 22 is filled in the trenches between the semiconductor fins 20a, 20b and then etched back to below the semiconductor stacks 18a, 18b of the semiconductor fins 20a, 20b. The isolation layer 22 is formed over the substrate 12 to cover at least a part of the well portions of the semiconductor fins 20a, 20b. The isolation layer 22 may be formed by a high density plasma chemical vapor deposition (HDP-CVD), a flowable CVD (FCVD), or other suitable deposition process. In some embodiments, the isolation layer 22 may include silicon oxide, silicon nitride, silicon oxynitride, fluorine-doped silicate glass (FSG), a low-k dielectric, combinations thereof. In some embodiments, the isolation layer 22 is formed to cover the semiconductor fins 20a, 20b by a suitable deposition process to fill the trenches between the semiconductor fins 20a, 20b, and then recess etched using a suitable anisotropic etching process to expose the active portions of the semiconductor fins 20a, 20b.

The sacrificial gate structures 24a, 24b, 24c are formed over the isolation layer 22 and over the exposed portions of the semiconductor fins 20a, 20b. The sacrificial gate structures 24a, 24b, 24c are formed over portions of the semiconductor fins 20a, 20b which are to be channel regions. The sacrificial gate structures 24a, 24b, 24c may include a sacrificial gate dielectric layer 26, a sacrificial gate electrode layer 28, a pad layer 30, and a mask layer 32.

The sacrificial gate dielectric layer 26 may be formed conformally over the semiconductor fins 20a, 20b, and the isolation layer 22. In some embodiments, the sacrificial gate dielectric layer 26 may be deposited by a CVD process, a sub-atmospheric CVD (SACVD) process, a FCVD process, an ALD process, a PVD process, or other suitable process. The sacrificial gate dielectric layer 26 may include one or more layers of dielectric material, such as $SiO_2$, SiN, a high-k dielectric material, and/or other suitable dielectric material.

The sacrificial gate electrode layer 28 may be blanket deposited on the over the sacrificial gate dielectric layer 26. The sacrificial gate electrode layer 28 includes silicon such as polycrystalline silicon or amorphous silicon. The thickness of the sacrificial gate electrode layer is in a range between about 42 nm and about 200 nm. In some embodiments, the sacrificial gate electrode layer 28 is subjected to a planarization operation. The sacrificial gate electrode layer 28 may be deposited using CVD, including LPCVD and PECVD, PVD, ALD, or other suitable process.

Subsequently, the pad layer 30 and the mask layer 32 are formed over the sacrificial gate electrode layer 28. The pad layer 30 may include silicon nitride. The mask layer 32 may include silicon oxide. Next, a patterning operation is performed on the mask layer 32, the pad layer 30, the sacrificial gate electrode layer 28 and the sacrificial gate dielectric layer 26 to form the sacrificial gate structures 24a, 24b, 24c.

The sidewall spacers 34 are formed on sidewalls of each sacrificial gate structure 24a, 24b, 24c, as shown in FIG. 4. After the sacrificial gate structures 24a, 24b, 24c are formed, the sidewall spacers 34 are formed by a blanket deposition of an insulating material followed by anisotropic etch to remove insulating material from horizontal surfaces. The sidewall spacers 34 may have a thickness in a range between about 4 nm and about 7 nm. In some embodiments, the insulating material of the sidewall spacers 34 is a silicon nitride-based material, such as SiN, SiON, SiOCN or SiCN and combinations thereof.

Figure 5:
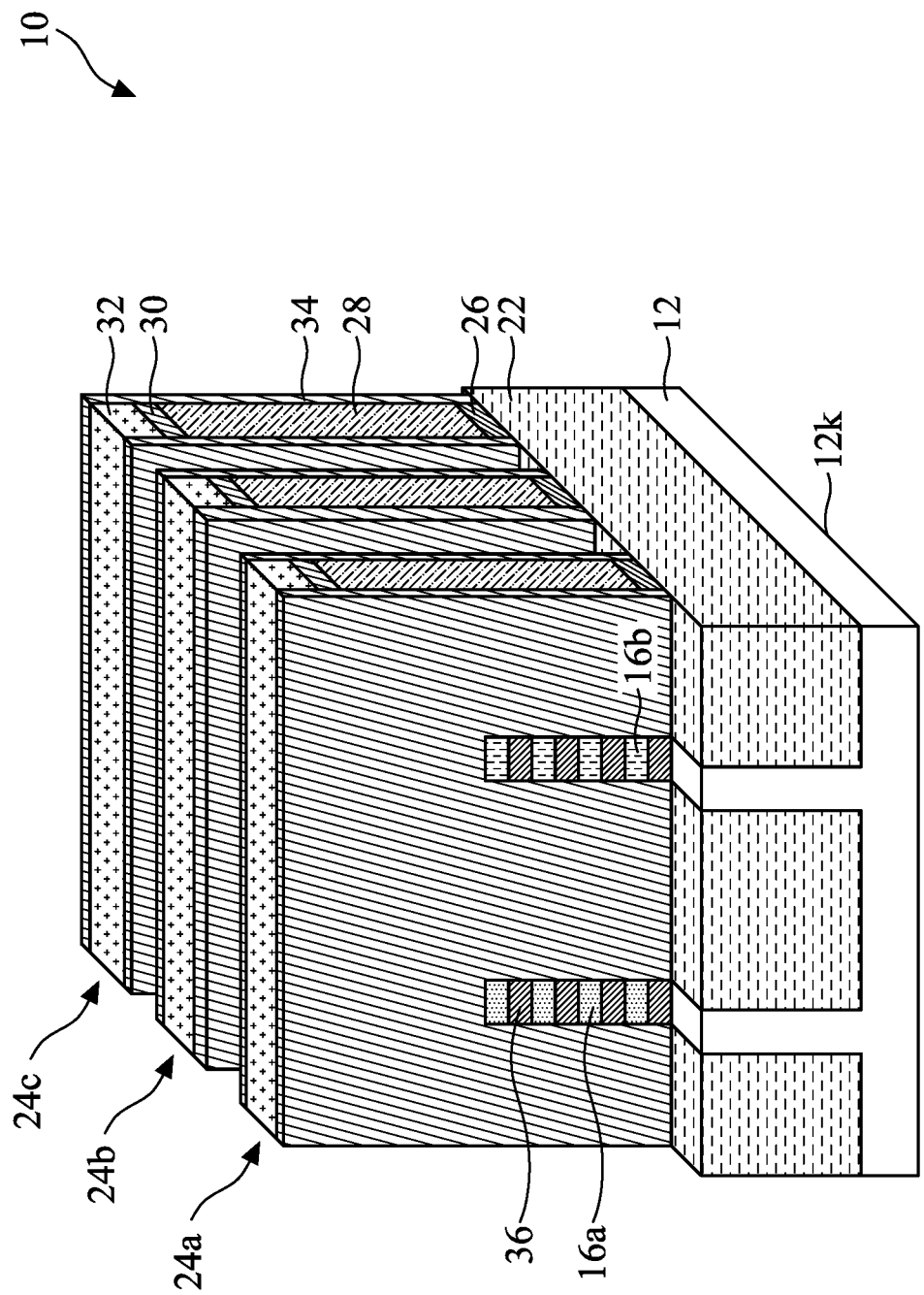

In operation 106, the exposed semiconductor fins 20a, 20b are etched and inner spacers 36 are formed, as shown in FIG. 5. Even though described together in each operation, processes for regions for p-type devices, i.e. over the n-well 12a, and for n-type devices, i.e. over the p-well 12b, may be performed separately using patterned masks and different processing recipes.

The semiconductor fins 20a, 20b not covered by the sacrificial gate structures 24a, 24b, 24c are etched to expose well portions of each semiconductor fin 20a, 20b. In some embodiments, suitable dry etching and/or wet etching may be used to remove the semiconductor layers 14a, 14b, 16a, 16b, together or separately.

After recess etch of the semiconductor fins 20a, 20b, the inner spacers 36 are formed. To form the inner spacers 36, the semiconductor layers 14a, 14b under the sidewall spacers 34 are selectively etched from the semiconductor layers 16a, 16b along the horizontal direction, or x-direction, to form spacer cavities. In some embodiments, the semiconductor layers 14a, 14b can be selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. In some embodiments, an etching thickness of the semiconductor layers 14a, 14b is in a range between about 2 nm and about 10 nm along the X direction.

After forming the spacer cavities, the inner spacers 36 are formed in the spacer cavities by conformally deposit and then partially remove an insulating layer. The insulating layer can be formed by ALD or any other suitable method. The subsequent etch process removes most of the insulating layer except inside the cavities, resulting in the inner spacers 36. The inner spacers 36 have a thickness along the X direction in a range from about 4 nm to about 7 nm.

Figure 6:
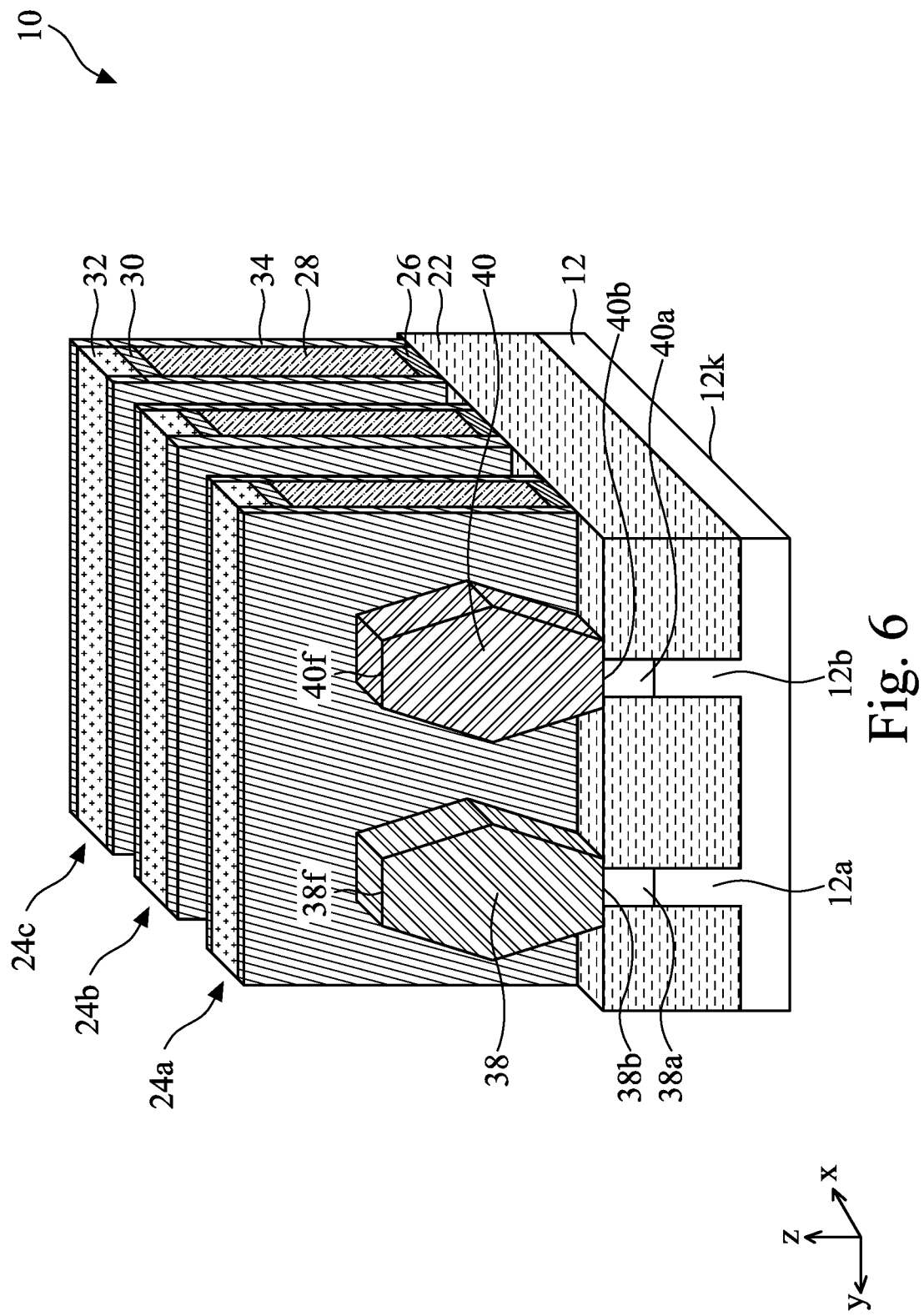

In operation 108, epitaxial source/drain features 38, 40 are formed, as shown in FIG. 6. As discussed above, the epitaxial source/drain features 38 for the p-type devices and the epitaxial source/drain features 40 for the n-type devices are formed using patterned masks and different epitaxial processes.

Optionally, backside contact alignment features 38a, 40a may be formed prior to formation of the epitaxial source/drain features 38, 40. The backside contact alignment features 38a, 40a may be formed by removing a portion of the well portion of the semiconductor fins 20a, 20b between the isolation layer 22, and refilling the cavities with a semiconductor material with etch selectivity relative to the substrate and may be used to form contact holes for backside source/drain contact features.

The backside contact alignment features 38a, 40a may be formed by any suitable method, such as by CVD, CVD epitaxy, molecular beam epitaxy (MBE), or any suitable deposition technique. In some embodiments, the backside contact alignment features 38a, 40a are formed by a bottom up deposition process. In some embodiments, the backside contact alignment features 38a, 40a are formed from SiGe having a germanium composition percentage between about 50% and 95%. Alternatively, the backside contact alignment features 38a, 40a may include other materials such as Si, Ge, a compound semiconductor such as SiC, GeAs, GaP, InP, InAs, and/or InSb, an alloy semiconductor such as GaAsP, AlInAs, AlGaAs, InGaAs, GaInP, and/or GaInAsP, or combinations thereof.

The epitaxial source/drain features 38 for the p-type devices may include one or more layers of Si, SiGe, Ge with p-type dopants, such as boron (B), for a p-type device, such as pFET. In some embodiments, the epitaxial source/drain features 38 may be SiGeB material, wherein boron is a dopant. The epitaxial source/drain features 40 for n-type devices may include one or more layers of Si, SiP, SiC and SiCP. The epitaxial source/drain features 40 also include n-type dopants, such as phosphorus (P), arsenic (As), etc. In some embodiments, the epitaxial source/drain features 40 may be a Si layer includes phosphorus dopants.

The epitaxial source/drain features 38, 40 shown in FIG. 6 have a hexagonal shape. However, the epitaxial source/drain features 38, 40 may be other shapes according to the design. The epitaxial source/drain features 38 for the p-type devices and the epitaxial source/drain features 40 for the n-type devices may have different shapes.

As shown in FIG. 6, each epitaxial source/drain feature 38 has a front side 38f and a backside 38b opposing the front side 38f. The backside 38b faces the n-well 12a of the substrate 12 or the backside contact alignment feature 38a. In some embodiments, the backside 38b is in contact with the isolation layer 22. The front side 38f may include a facet where the epitaxial source/drain feature 38 stop growing. Each epitaxial source/drain feature 40 has a front side 40f and a backside 40b opposing the front side 40f. The backside 40b faces the p-well 12b of the substrate 12 or the backside contact alignment feature 40a. In some embodiments, the backside 40b is in contact with the isolation layer 22. The front side 40f may include a facet where the epitaxial source/drain feature 40 stop growing.

Figure 7:
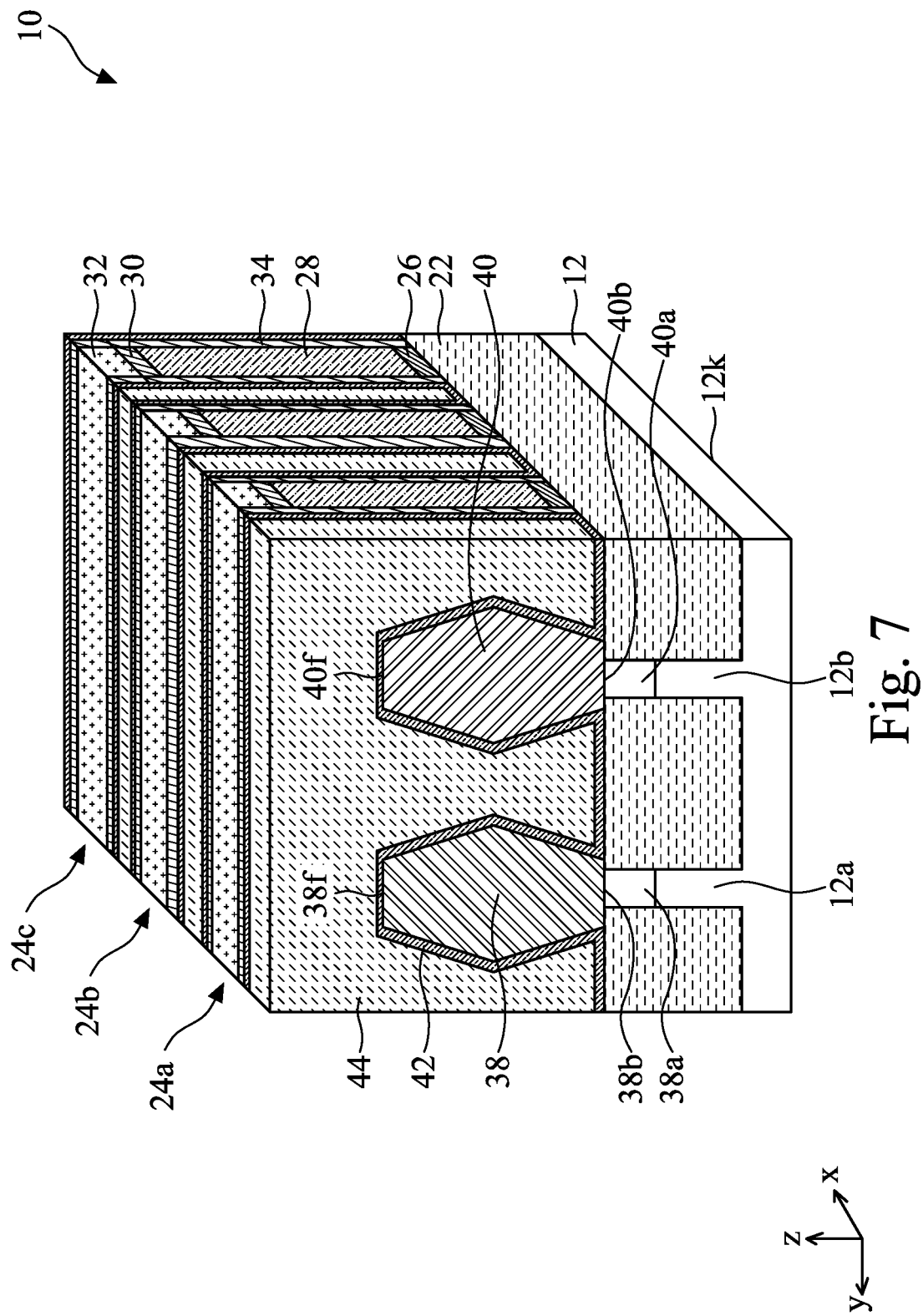

In operation 110, a contact etch stop layer (CESL) 42 and an interlayer dielectric (ILD) layer 44 are formed over the exposed surfaces as shown in FIG. 7. The CESL 42 is formed on the epitaxial source/drain features 38, 40 the sidewall spacers 34, and the isolation layer 22. In some embodiments, the front sides 38f, 40f of the epitaxial source/drain features 38, 40 are in contact with the CESL 42. The backsides 38b, 40b of the epitaxial source/drain features 38, 40 is are not contact with the CESL 42. In some embodiments, the CESL 42 has a thickness in a range between about 4 nm and about 7 nm. The CESL 42 may include $Si_3N_4$, SiON, SiCN or any other suitable material, and may be formed by CVD, PVD, or ALD.

The interlayer dielectric (ILD) layer 44 is formed over the CESL 42. The materials for the ILD layer 44 include compounds comprising Si, 0, C, and/or H, such as silicon oxide, SiCOH and SiOC. Organic materials, such as polymers, may be used for the ILD layer 44. The ILD layer 44 protects the epitaxial source/drain features 38, 40 during the removal of the sacrificial gate structures 24a, 24b, 24c.

Figure 8:
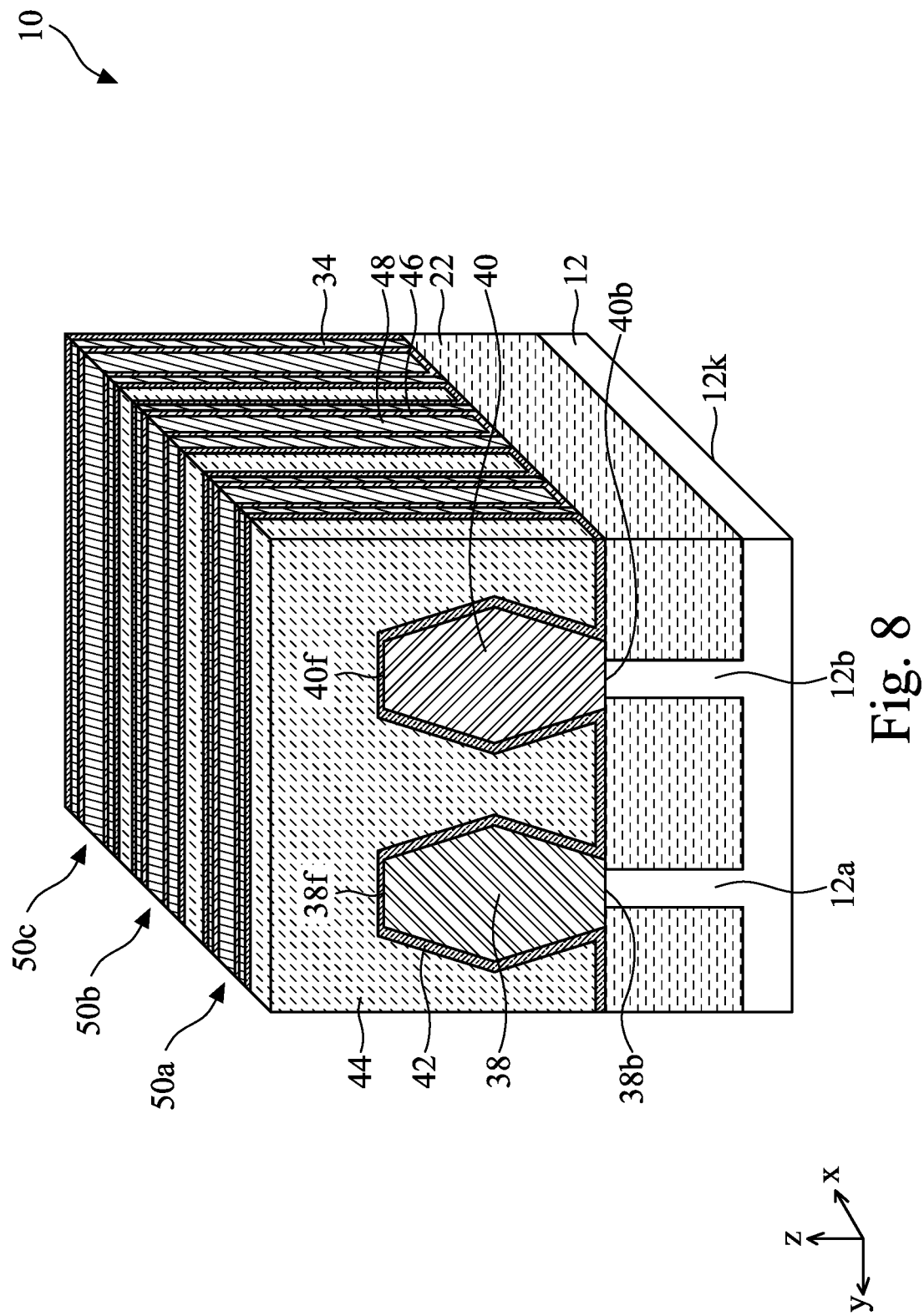

In operation 112, replacement gate structures 50a, 50b, 50c are formed, as shown in FIG. 8. Prior to performing the replacement gate process, a planarization operation, such as CMP, is performed to expose the sacrificial gate electrode layer 28 for subsequent removal of the sacrificial gate structures 24a, 24b, 24c. The planarization process removes portions of the ILD layer 44 and the CESL 42, the hard mask 32 and the pad layer 30 to expose to the sacrificial gate electrode layer 28. The sacrificial gate electrode layer 28 can be removed using plasma dry etching and/or wet etching. When the sacrificial gate electrode layer 28 is polysilicon, a wet etchant such as a Tetramethylammonium hydroxide (TMAH) solution can be used to selectively remove the sacrificial gate electrode layer 28 without removing the dielectric materials of the ILD layer 44 and the CESL 42. The sacrificial gate dielectric layer 26 may be removed using a suitable etch process after removal of the sacrificial gate electrode layer.

After removal of the sacrificial gate structures 24a, 24b, 24c, the semiconductor layers 14a, 14b, 16a, 16b are exposed. The semiconductor layers 14a, 14b are then selectively removed resulting in nanosheets of the semiconductor layers 16a, 16b. In some embodiments, the semiconductor layers 14a, 14b can be removed during the same etch process or different processes. The semiconductor layers 14a, 14b can be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solution.

A gate dielectric layer 46, and a gate electrode layer 48 are formed in the gate cavities as shown in FIG. 8. The gate dielectric layer 46 and the gate electrode layer 48 are collectively referred to as a replacement gate structures 50a, 50b, 50c. The gate dielectric layer 46 is formed on exposed surfaces after removal of the sacrificial gate structures 24a, 24b, 24c. In some embodiments, the gate dielectric layer 46 may have different composition and dimensions for the n-type devices and p-type devices and are formed separately using patterned mask layers and different deposition recipes.

The gate dielectric layer 46 may include one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate dielectric layer 46 may be formed by CVD, ALD or any suitable method. In some embodiments, the thickness of the gate dielectric layer 46n is in a range between about 1 nm and about 6 nm. In some embodiments, an interfacial layer (not shown) is formed between the semiconductor layers 16a, 16b and the gate dielectric layer 46.

The gate electrode layer 48 is formed on the gate dielectric layers 46 to fill the gate cavities. The gate electrode layer 48 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In some embodiments, the gate electrode layer 48 may be formed by CVD, ALD, electro-plating, or other suitable method. After the formation of the gate electrode layer 48, a planarization process, such as a CMP process, is performed to remove excess deposition of the gate electrode material and expose the top surface of the ILD layer 44.

Figure 9A:
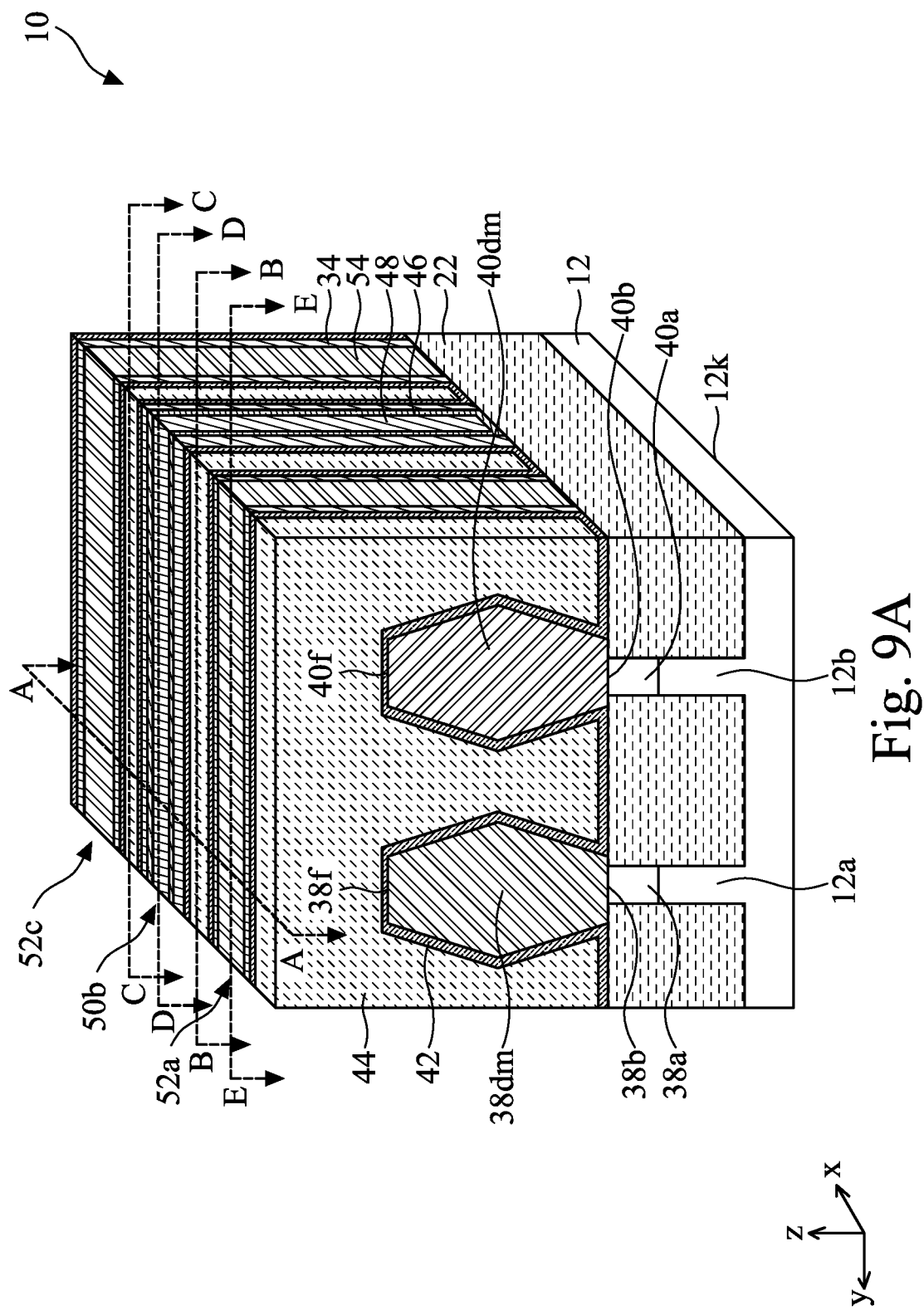
Figure 9B:
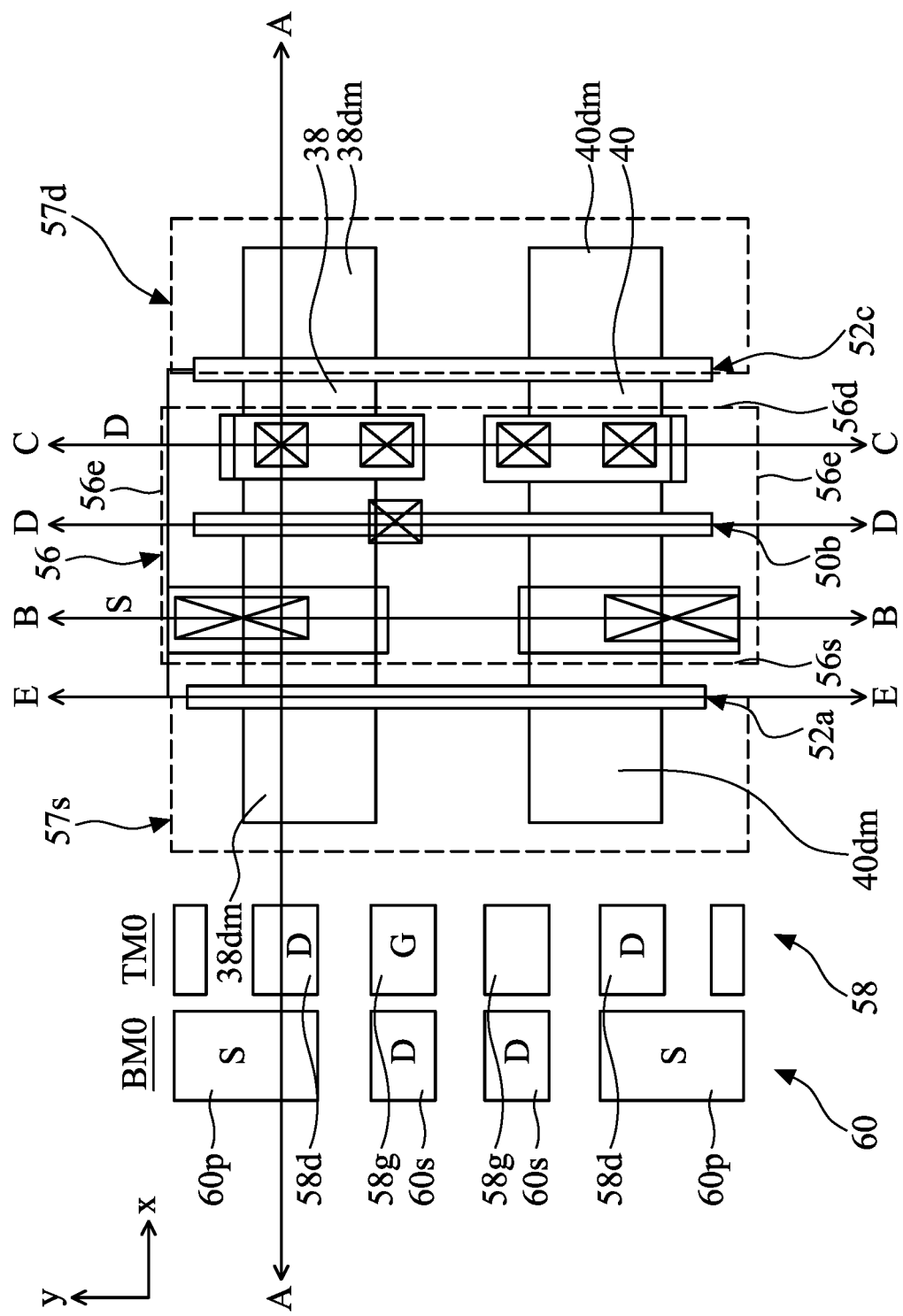

FIG. 9A is a schematic perspective view of the semiconductor device 10 after operation 114. FIG. 9B is a schematic plan view of the semiconductor device 10 showing the lay out of the semiconductor device 10. FIGS. 10A-10E are sectional views of the FIG. 9A. Lines A-A, B-B, C-C, D-D, and E-E in FIGS. 9A-B indicate cut lines of various views in FIGS. 10A-E, and FIGS. 11A-C to FIGS. 20A-C described below. Particularly, FIGS. 10A-20A are schematic cross-sectional views along lines A-A in FIGS. 9A-B, FIGS. 10B-20B are schematic cross-sectional views along lines B-B in FIGS. 9A-B, FIGS. 10C-20C are schematic cross-sectional views along lines C-C in FIGS. 9A-B, FIGS. 10D, 12D, and 13D are schematic cross-sectional views along lines D-D in FIGS. 9A-B, and FIG. 10E is a schematic cross-sectional view along lines E-E in FIGS. 9A-B.

In operation 114, the replacement gate structures in filler cells are replaced with dummy gate structures, as shown in FIGS. 9A-B, and FIGS. 10A-10E. As described below, operation 114 may be performed optionally to electronically isolate source/drain features 38 in filler cells from the source/drain features 38 in standard cells. Particularly, the gate electrode layer 48, the gate dielectric layer 46, and the nanosheets of semiconductor layers 16a, 16b in the replacement gate structures 50a, 50c are removed, and a filler dielectric material 54 is filled in the space between the sidewall spacers 34. With layers of materials replaced with the filler dielectric material 54, the replacement gate structures 50a, 50c are referred to as dummy gate structures 52a, 52c. The dummy gate structures 52a, 52c are parts of filler cells discussed below.

In integrated circuit design, standard cells are often laid out and saved in a circuit library. When an integrated circuit is designed, the standard cells are retrieved from the circuit library, and are placed and routed. The placement is performed using a computer, which runs a tool for designing integrated circuits. The standard cells are placed as a plurality of rows that are parallel to each other. The edges of some standard cells may be abutted. Other standard cells, however, cannot be abutted. In these cases, filler cells are inserted between the standard cells in order to separate the standard cells from each other. Filler cells may be arranged as one or a plurality of rows and allocated between standard cells to ensure that design rules and process rules are not violated in manufacturing integrated circuits on physical substrates.

A standard cell may include one or more transistors, which may be Fin Field-Effect Transistors (FinFETs), planar transistors, or the like. A standard cell may be designed to achieve certain logic functions, such as an inverter, a NOR gate, a NAND gate, a XOR gate, or any others. The transistors in a standard cell may include a p-type transistor, an n-type transistor, or combinations thereof.

FIG. 9B is a schematic layout of the semiconductor device 10. The semiconductor device 10 includes a standard cell 56, and two filler cells 57s, 57d positioned on edges of the standard cell 56. It is appreciated that the standard cell 56 may include more transistors and may have designs more complicated than shown in FIG. 9B.

The standard cell 56, shown in the example, includes the replacement gate structure 52b and the epitaxial source/drain features 38, 40 positioned on opposite sides of the replacement gate structure 50b. For illustration purposes, source regions of transistors in the standard cell 56 are marked as "S," and the drain regions of the transistor are marked as "D." However, the source regions and drain regions may be used interchangeably. The notation "S/D" and "source/drain" refer to a region that may be a source region or a drain region.

The standard cell 56 includes edge 56s, 56d on opposite sides of standard cell 56. The edge 56s is adjacent to the source regions and the edge 56d is adjacent to the drain regions. Edges 56s and 56d are parallel to the Y direction and perpendicular to the X direction. The standard cell 56 further includes edges 56e perpendicular to edges 56s, 56d. The edges 56e may be abutted to other standard cells in the same row. In some embodiments, power supply lines may extend in the X direction, and have edges aligned to edges 56e.

The filler cell 57s is positioned against the edge 56s of the standard cell 56. The filler cell 57d is positioned against the edge 56d of the standard cell 56. The filler cell 57s includes the dummy gate structure 52a and the source/drain features 38dm, 40dm. Similarly, the filler cell 57d includes the dummy gate structure 52c and the source/drain features 38dm, 40dm. It should be noted that the standard cell and filler cells may be arranged differently according to the circuit design. The structure of filler cells 57s, 57d may also be arranged differently according to circuit design and processing convenience.

According to embodiments of the present disclosure, the semiconductor device 10 includes a front side metal layer and a backside metal layer that are used to provide power and signal connections to the transistors. A metal layer refers to a layer including one of more dielectric materials having embedded metal lines. The front side metal layer is formed over the front side 38f, 40f of the source/drain features 38, 40. The backside metal layer is a metal layer formed below the backside 38b, 40b of the source/drain features 38, 40. According to embodiments of the present disclosure, a conductive path may be formed through source/drain features to connect metal lines in the front side metal layer to metal lines in the backside metal layer. In some embodiments, the conductive path is formed through the source/drain features in standard cells, such as the source/drain features 38, 40 in the standard cell 56. In other embodiments, the conductive path is formed through the source/drain features in filler cells, such as the source/drain features 38dm, 40dm in the filler cells 57s, 57d.

In FIG. 9B, a bar group 58 indicates widths and locations in the Y direction of metal lines in the front side metal layer. In the example, metal lines in the front side metal layer extend along the X direction. Widths of the metal lines refer to dimensions of the metal lines in the Y direction. Locations in the Y direction of metal lines in connection with source/drain contacts are indicated by locations of bars 58d in the Y direction. Widths of metal lines in connection with source/drain contacts are indicated by dimension of the bars 58d in the Y direction. Locations in the Y direction of metal lines in connection with the gate electrode layer 48 are indicated by locations of bars 58g in the Y direction. Widths of metal lines in connection with the gate electrode layer 48 are indicated by dimension of the bars 58g in the Y direction. In some embodiments, the metal lines in the front side metal layer are configured to connect with signal lines while a power rail is connected to through metal lines in the backside metal layer. The metal lines in the front side metal layer may have substantially the same width.

Similarly, a bar group 60 indicates widths of metal lines in the backside metal layer. In the example, metal lines in the front side metal layer extend along the X direction. Widths of the metal lines refer to dimensions of the metal lines in the Y direction. Locations in the Y direction of metal lines in connection with backside source/drain contacts are indicated by locations of bars 60s, 60p in the Y direction. Widths of metal lines in connection with the backside source/drain contacts are indicated by dimension of the bars 60s, 60p in the Y direction. The bars 60s correspond to metal lines in connection with signal lines, and the bars 60p correspond to metal lines in connection with a power rail. In the example of FIG. 9B, the metal lines connecting to a power rail are located near the exteriors and are wider while the metal lines connecting to signal lines are near the center region and are narrower.

Figure 10A:
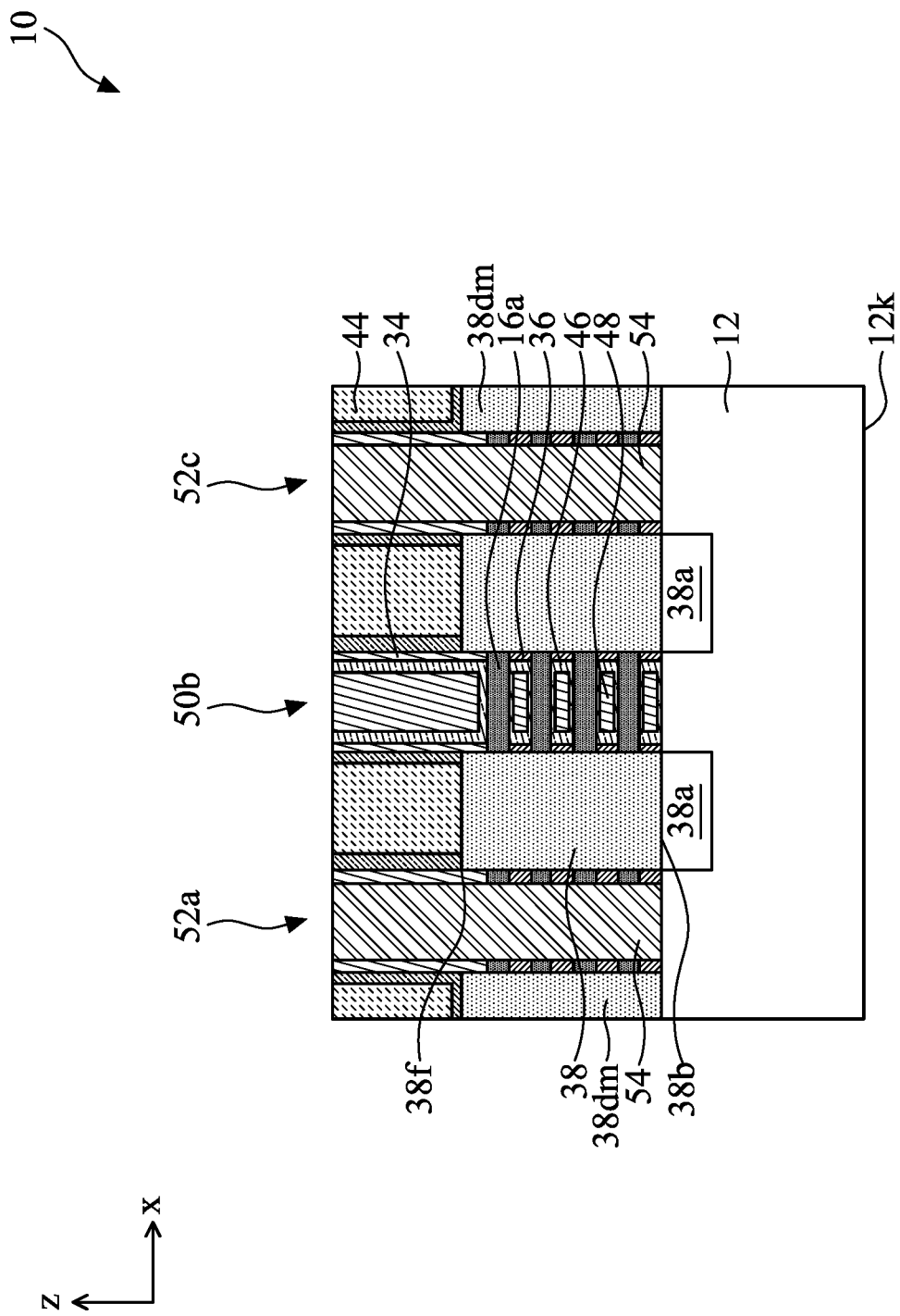
Figure 10E:
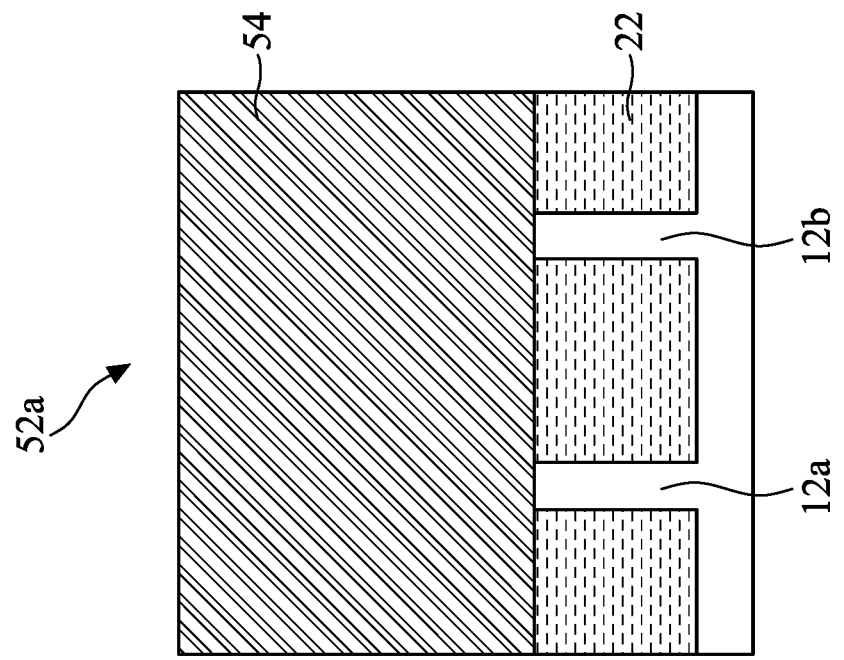
Figure 10D:
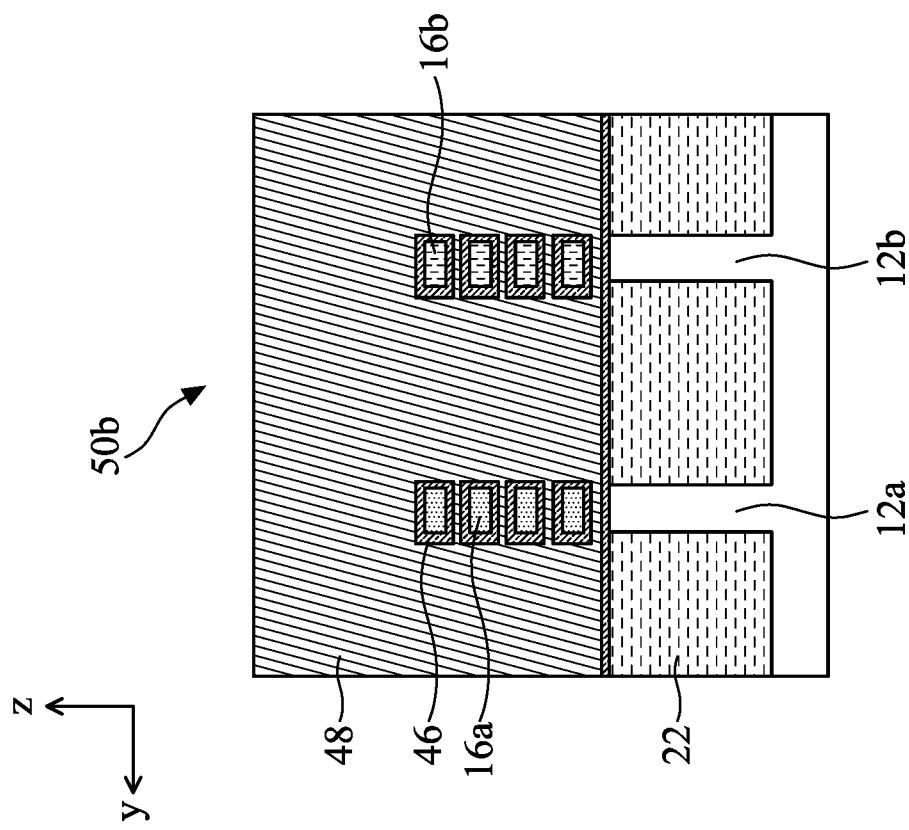

As shown in FIGS. 9A, 10A, and 10E, after operation 114, the source/drain features 38dm, 40dm in the filler cells 57s, 57d and the source/drain features 38, 40 in the standard cell 56 are electronically isolated by the filler dielectric material 54 in the dummy gate structures 52a, 52c. FIGS. 11A-C to FIGS. 20A-C schematically illustrate various stages of forming a conductive path through the source/drain features 38, 40 in the standard cell 56.

Figure 11A:
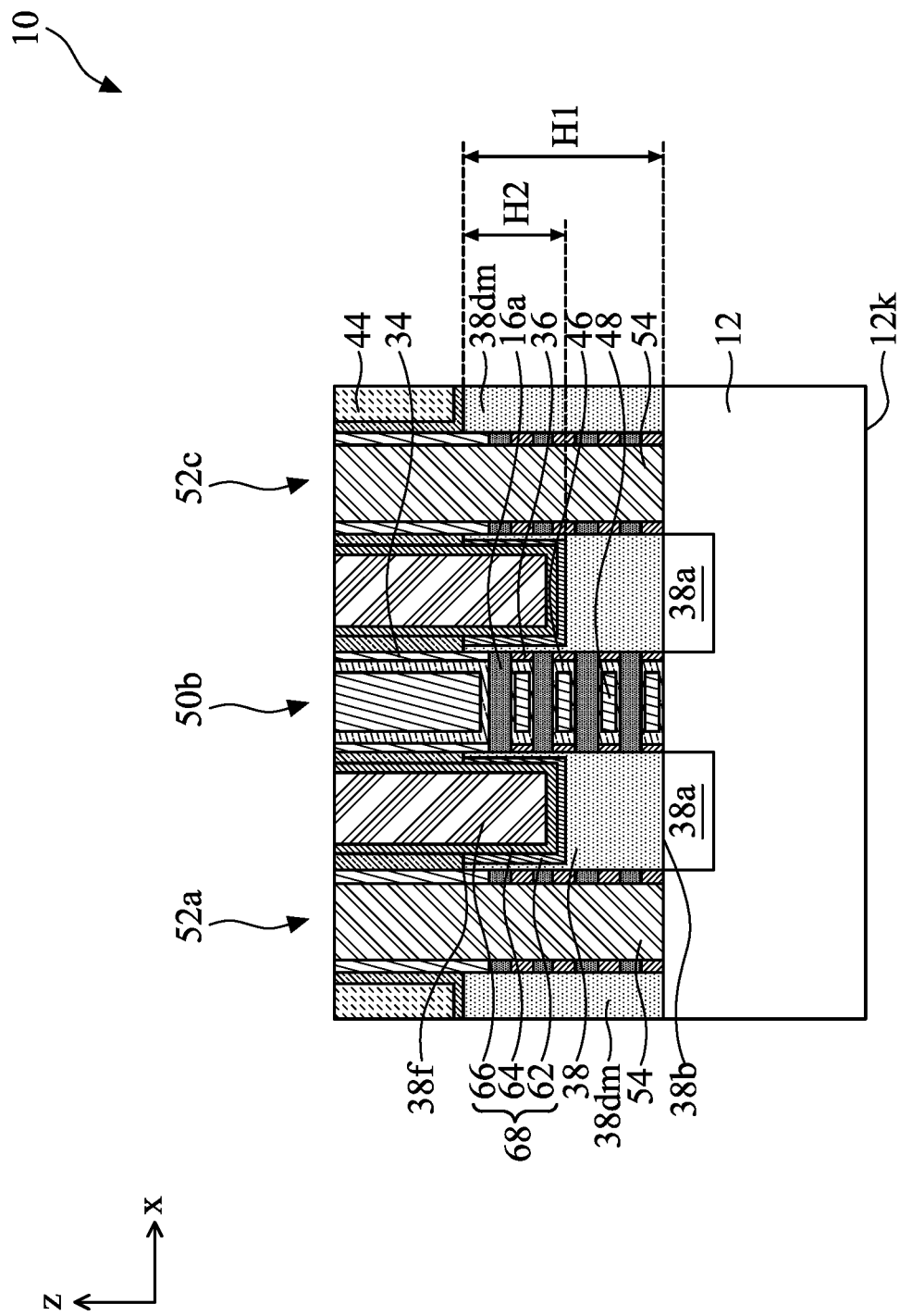
Figure 11C:
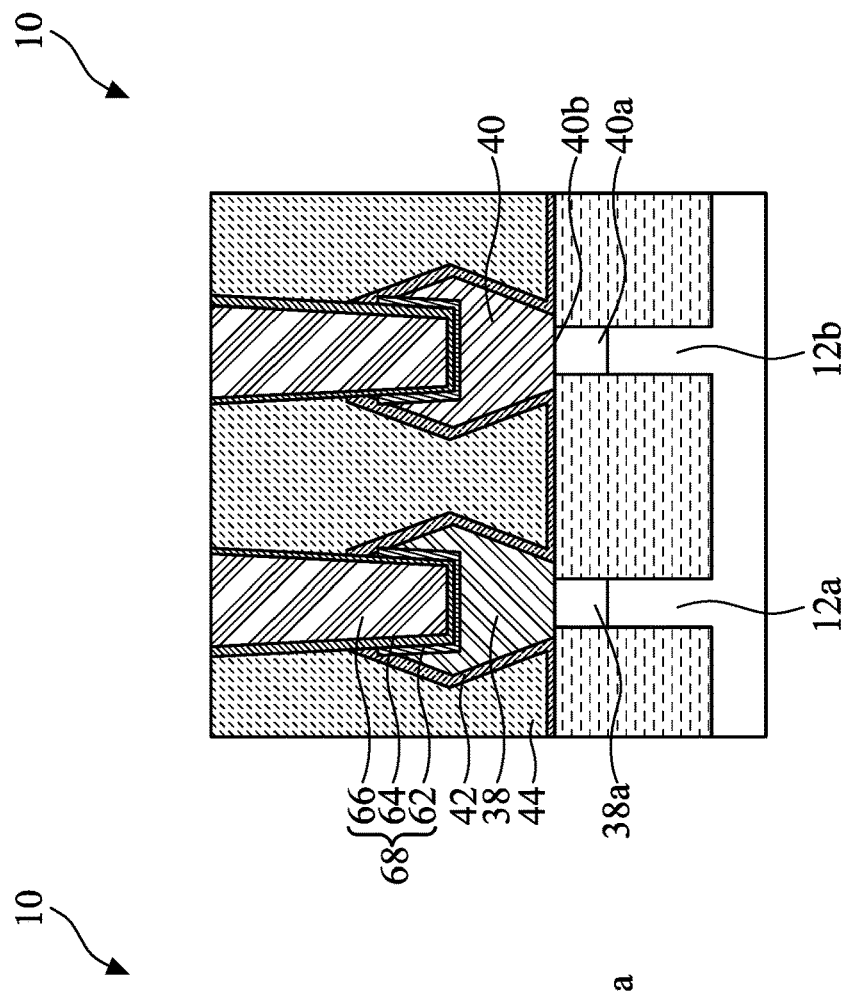
Figure 11B:
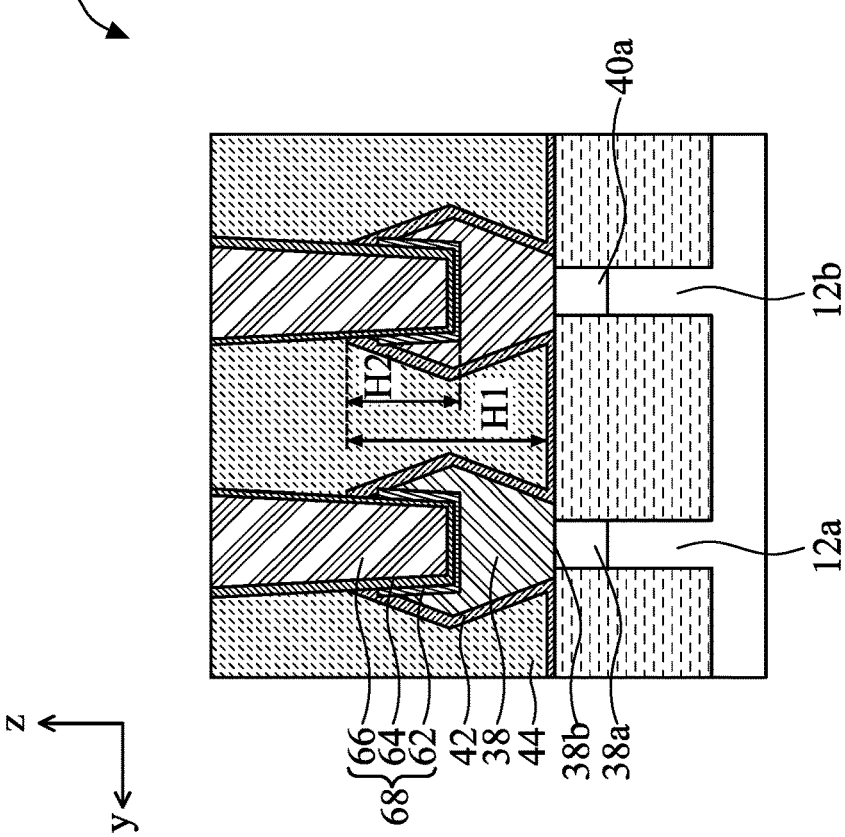

In operation 116, front side source/drain contact features 68 are formed, as shown in FIGS. 11A-C. Each of the front side source/drain contact features 68 may include a silicide layer 62, a barrier layer 64, and a metal feature 66. In some embodiments, the barrier layer 64 may be omitted.

Contact holes are first formed through the ILD layer 44 and the CESL 42 to expose the front side 38f, 40f of the source/drain features 38, 40. In some embodiments, the source/drain features 38, 40 may be etched and subsequently filled with a conductive material to form the front side source/drain contact features 68. In some embodiments, portions of the source/drain features 38, 40 are etched to form the contact holes to enable a conductive path through the source/drain features 38, 40. As shown in FIG. 11A, the source/drain features 38, 40 may have a height H1 along the Z direction. A height H2 of the front side source/drain contact features 68 are embedded in the source/drain features 38, 40. In some embodiments, a ratio of H2 over H1 may be in a range between about 5% to about 95%. A ratio lower than 5% may be not enough to establish a contact area large enough for a desired conductivity. A ratio higher than 95% will cover backside contact openings 84 and 84dm depths.

Suitable photolithographic and etching techniques are used to form the contact holes through various layers. After the formation of the contact holes, the silicide layer 62 is selectively formed over an exposed top surface of the epitaxial source/drain features 38, 40 exposed by the contact holes. The silicide layer 62 conductively couples the epitaxial source/drain features 38, 40 to the subsequently formed interconnect structures. The silicide layer 62 may be formed by depositing a metal source layer to cover exposed surfaces including the exposed surfaces of the epitaxial source/drain features 38, 40 and performing a rapid thermal annealing process. In some embodiments, the metal source layer includes a metal layer selected from W, Co, Ni, Ti, Mo, and Ta, or a metal nitride layer selected from tungsten nitride, cobalt nitride, nickel nitride, titanium nitride, molybdenum nitride, and tantalum nitride. After the formation of the metal source layer, a rapid thermal anneal process is performed, for example, a rapid anneal a rapid anneal at a temperature between about 420° C. and about 800° C. During the rapid anneal process, the portion of the metal source layer over the epitaxial source/drain features 38, 40 reacts with silicon in the epitaxial source/drain features 38, 40, to form the silicide layer 62. Unreacted portion of the metal source layer is then removed. In some embodiments, the silicide layer 62 includes one or more of WSi, CoSi, NiSi, TiSi, MoSi, and TaSi. In some embodiments, the silicide layer 62 has a thickness in a range between about 3 nm and 10 nm.

After formation of the silicide layer 62, the barrier layer 64 may be optionally formed over the exposed surfaces in the contact hole. The barrier layer 64 may include titanium, titanium nitride, tantalum, tantalum nitride, or the like. The metal feature 66 is then formed by filling the contact holes with a conductive material. In some embodiments, the conductive material for the source/drain contact may be formed by CVD, PVD, plating, ALD, or other suitable technique. In some embodiments, the conductive material may include TiN, TaN, Ta, Ti, Hf, Zr, Ni, W, Co, Cu, Ag, Al, Zn, Ca, Au, Mg, Mo, Cr, or the like. Subsequently, a CMP process is performed to remove excessive conductive material and expose the ILD layer 44 and the gate electrode layer 48.

In operation 118, contact vias 72s to the front side source/drain contact features 68, contact vias 72g to the gate electrode layer 48, and metal lines 78s, 78g in connection with the contact vias 72s, 72g are formed, as shown in FIGS. 12A-D. In FIGS. 12A-D, the contact vias 72s, 72g are formed in a second ILD layer 70. The metal lines 78s, 78g are formed in a front side metal layer 76.

The second ILD layer 70 is formed by depositing a dielectric material over the ILD layer 44 and the gate structure 52a, 50b, 52c after the CMP process in operation 116. The front side metal layer 76 is the formed over the second ILD layer 70 by depositing one or more layers of dielectric material layers. In some embodiments, the front side metal layer 76 may include an etch stop layer to enable a patterning process, such as a damascene patterning process, through the second ILD layer 70 and the front side metal layer 76. In some embodiments, the front side metal layer 76 may be formed from materials that can be selectively etched from the second ILD layer 70. In other embodiments, one or more etch stop layers are formed between the second ILD layer 70 and the front side metal layer 76. A patterning process, such as a damascene process, is performed to form contact openings for the contact vias 72s, 72g in the second ILD layer 70 and for the metal lines 78s, 78g in the front side metal layer 76.

In some embodiments, a barrier layer, (not shown) may be formed in the contact openings for the contact vias and the metal lines prior to formation of the contact vias 72s, 72g and metal lines 78s, 78g. The barrier layer may include titanium, titanium nitride, tantalum, tantalum nitride, or the like. The contact vias 72s, 72g and metal lines 78s, 78g are formed by filling the contact openings with a conductive material. In some embodiments, the conductive material for the gate contact may be formed by CVD, PVD, plating, ALD, or other suitable technique. In some embodiments, the conductive material may include TiN, TaN, Ta, Ti, Hf, Zr, Ni, W, Co, Cu, Ag, Al, Zn, Ca, Au, Mg, Mo, Cr, or the like. Subsequently, a CMP process is performed to remove excessive conductive material and expose the front side metal layer 76 and the metal lines 78s, 78g embedded therein.

Figure 12A:
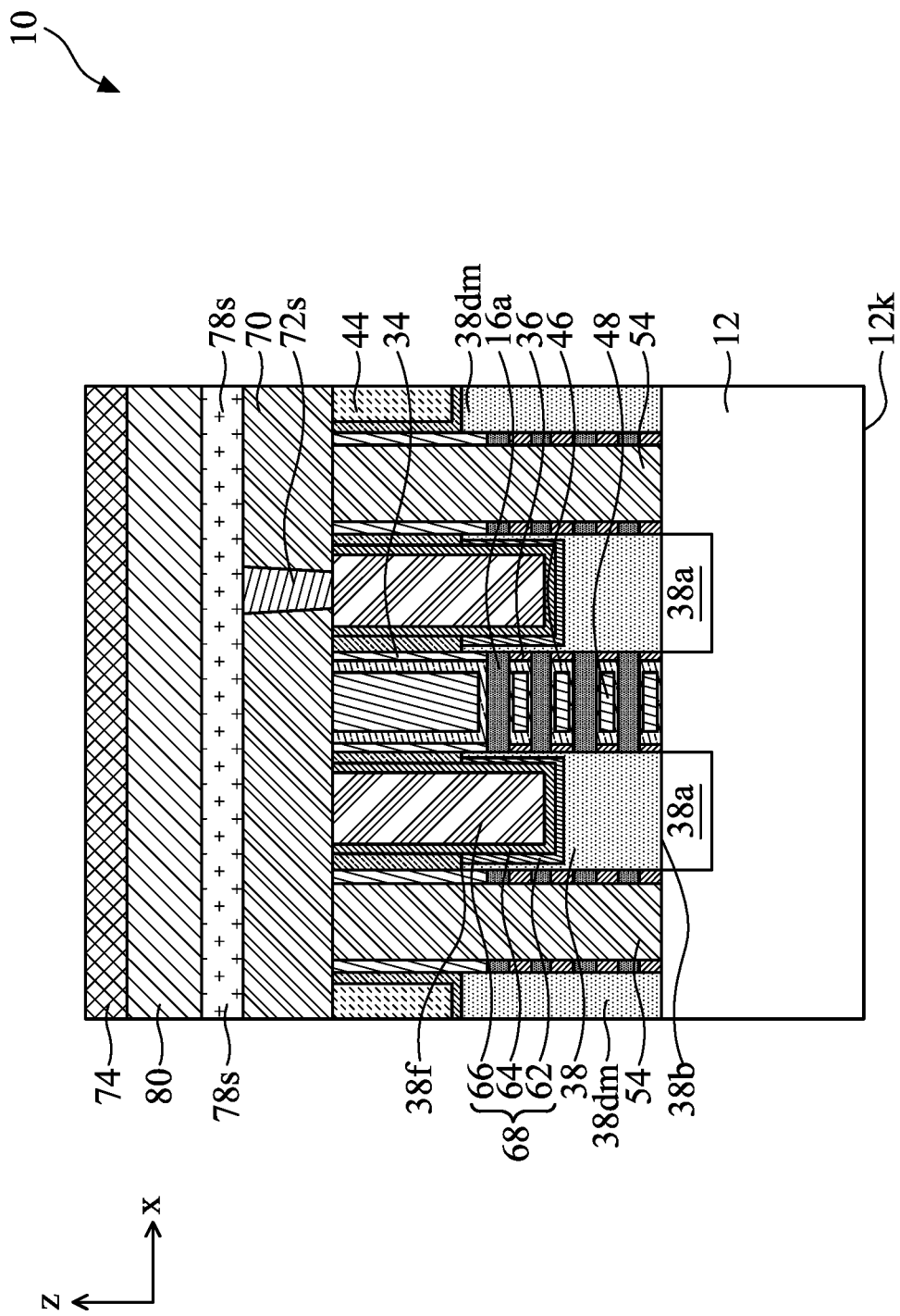
Figure 12D:
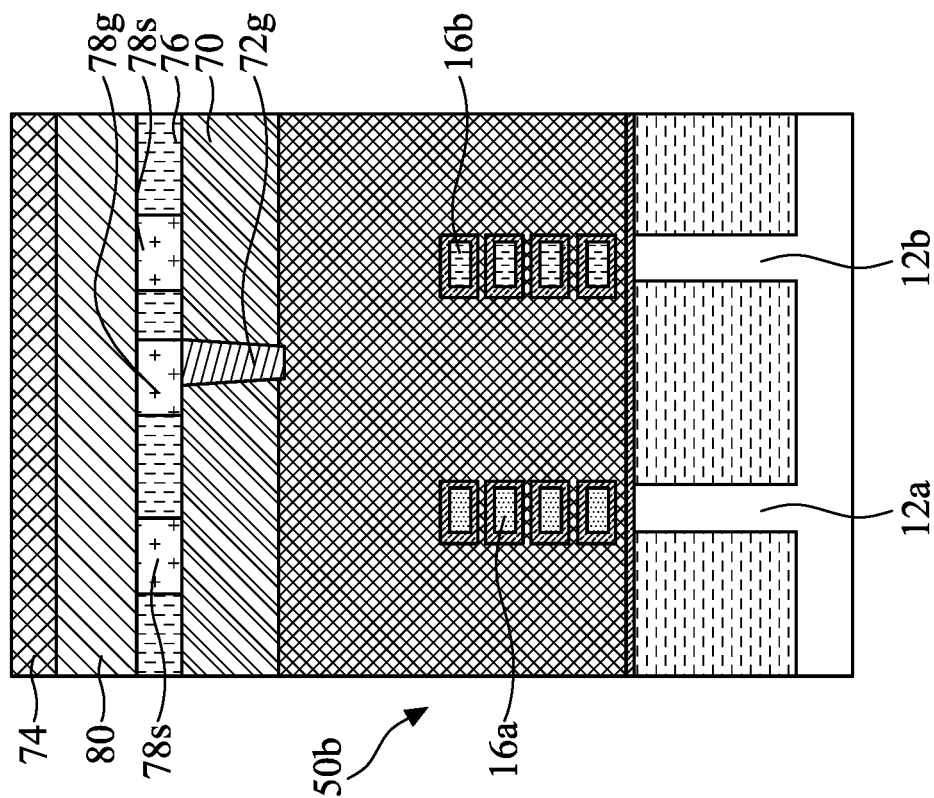
Figure 13A:
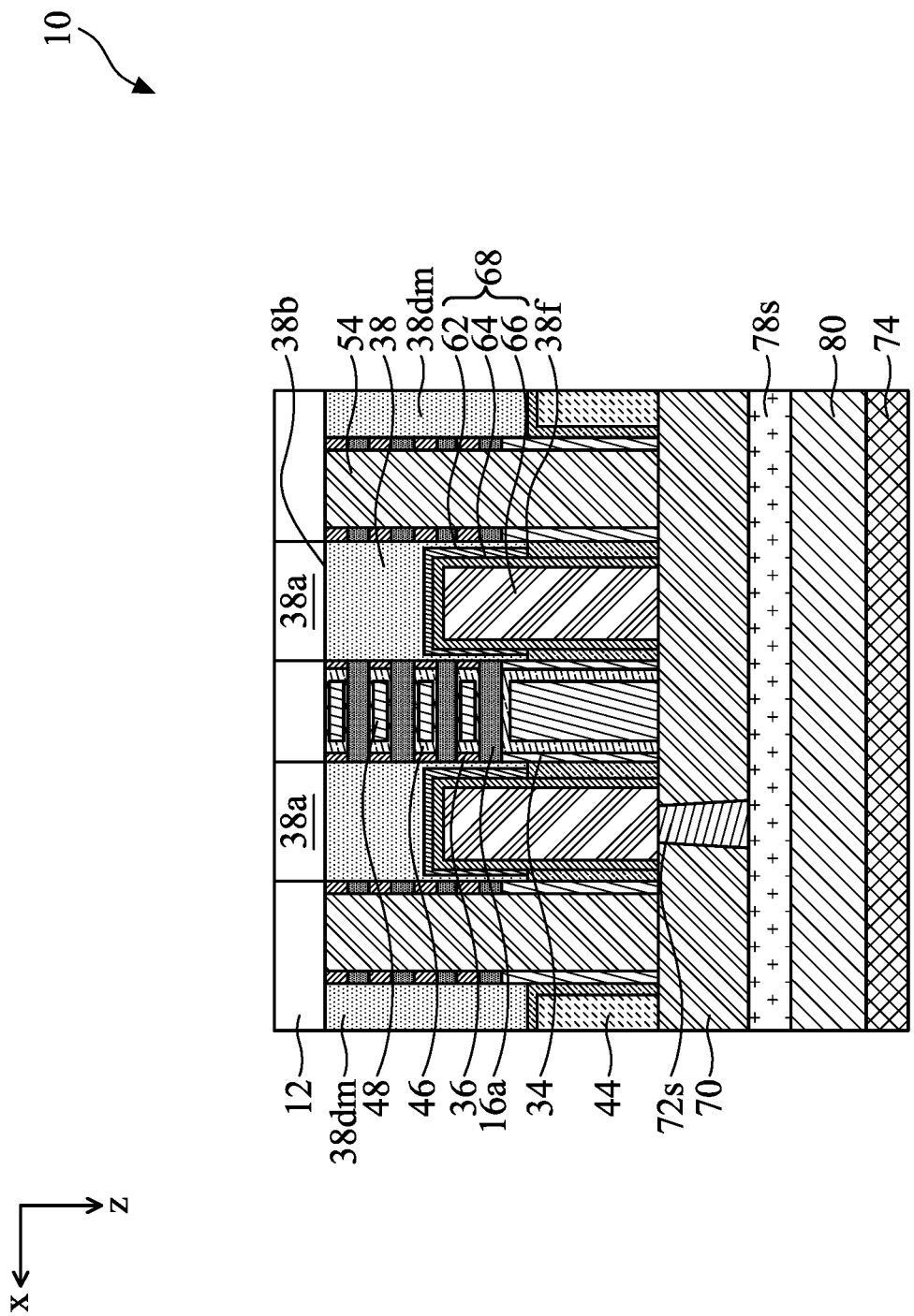
Figures 13B, 13C:
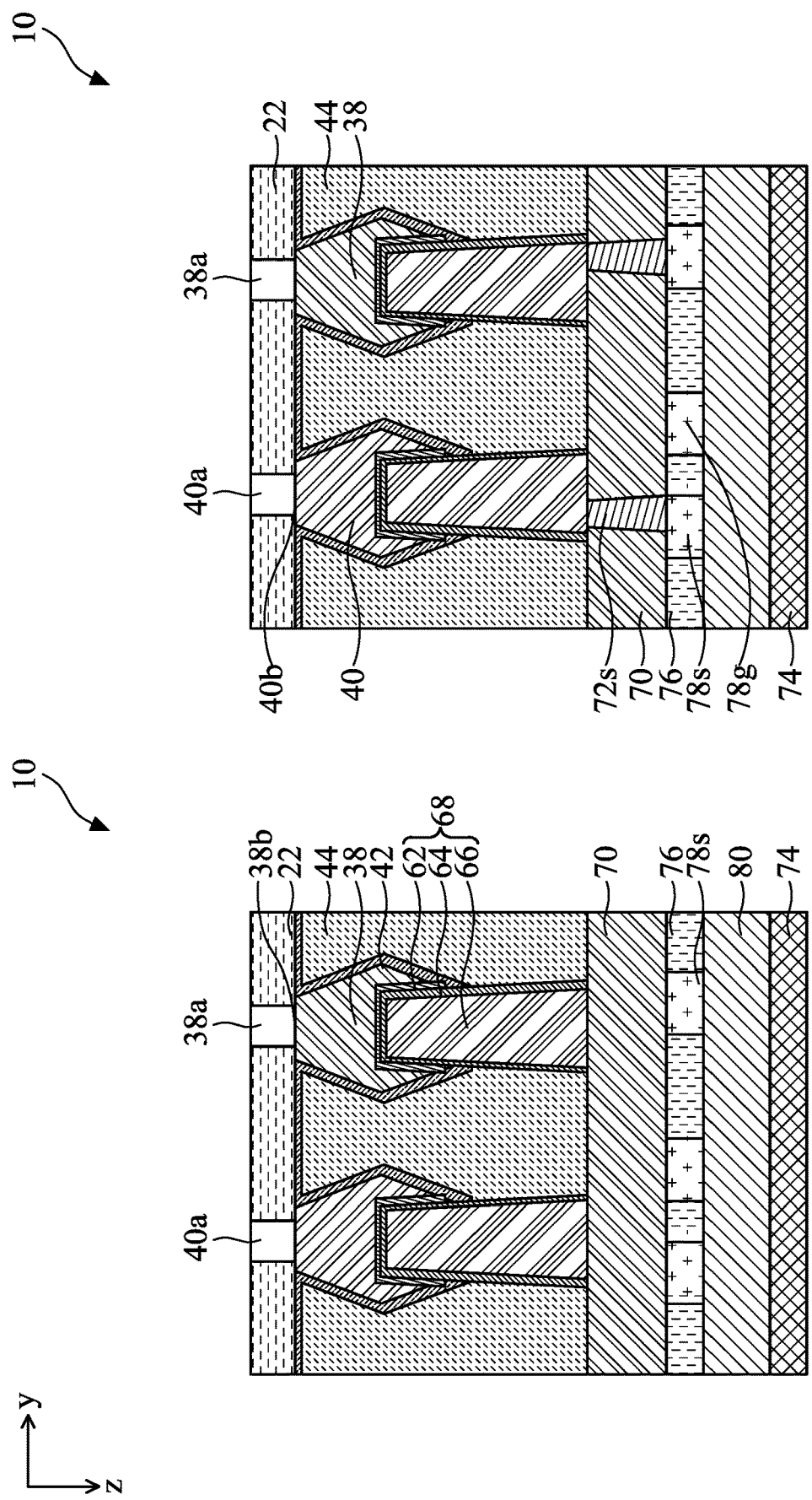
Figure 13D:
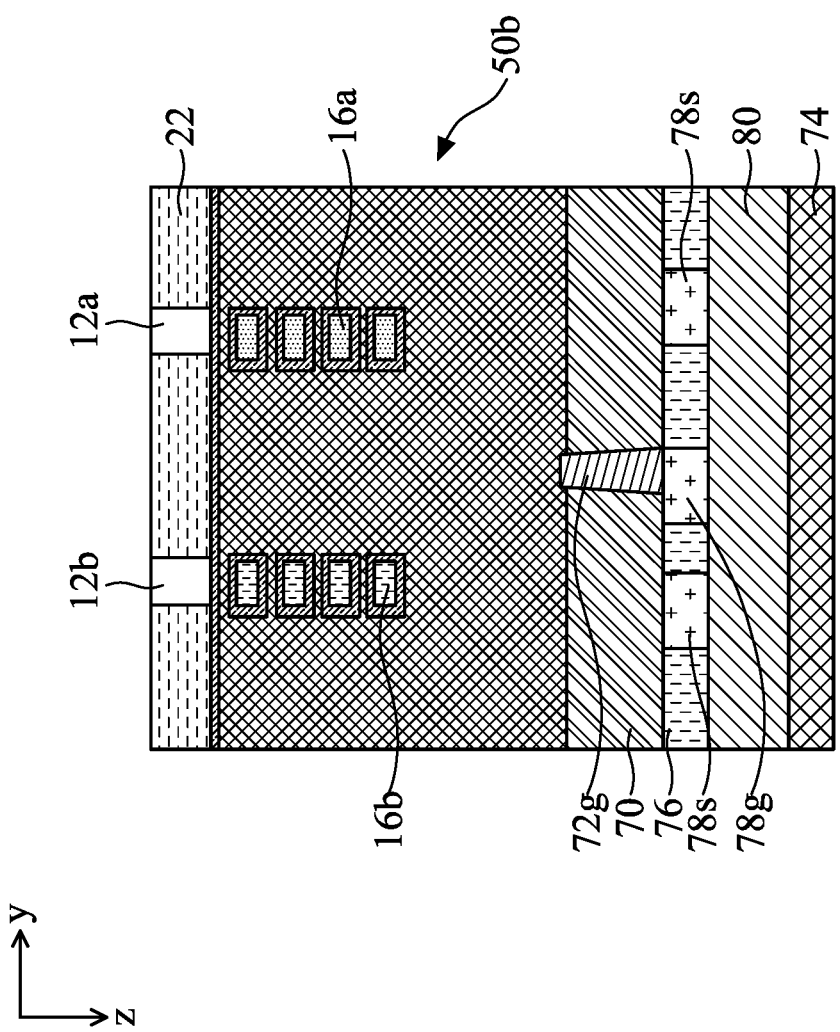

As shown in FIGS. 12A and 12D, the contact vias 72g connect between the gate electrode layer 48 and the metal lines 78g. In some embodiments, a cut metal gate process may be performed to separate metal gate, such as the gate structure 50b, into multiple portions prior to formation of the contact vias 72g and metal lines 78g. The cut metal gate process is not described herein for clarity.

The contact vias 72s connect between the source/drain contact features 68 to the metal lines 78s, as shown in FIG.

12C. In the example of FIGS. 12A-D, only the source/drain contact features 68 extending from the source/drain features 38, 40 on the drain side (as shown in FIG. 9B) are connected to the metal lines 78s in the front side metal layer 76. In some embodiments, the metal lines 78s are signal lines.

The source/drain contact features 68 extending from the source/drain features 38, 40 on the source side are floating, or not further connected to any contacts on the front side, as shown in FIG. 12B. The source/drain features 38, 40 in the source side may be connected to a power rail through a backside connection as described below. The source/drain contact features 68 on the source side may be formed to satisfy design rules or to provide structural support to the semiconductor device 10. For the same reason, front side source/drain contact features 68 may also be formed in the source/drain features 38dm, 40dm in the filler cells 57s, 57d. Alternatively, the front side source/drain contact features 68 may be omitted from any source/drain features 38, 40 that are not intended to connect to any metal lines from the front side.

In some embodiments, arrangement, location and dimension, of the metal lines 78s, 78g in the front side metal layer 76 are similar to the arrangement indicated by the bar group 58 in FIG. 9B.

In operation 120, a front side interconnect structure 80 is formed over on the front side metal layer 76 as shown in FIGS. 12A-D. The front side interconnect structure 80 includes multiple dielectric layers having metal lines and vias (not shown) formed therein. The metal lines and vias in the front side interconnect structure 80 may be formed of copper or copper alloys, and may be formed using one or more damascene processes. The front side interconnect structure 80 may include multiple sets of inter-layer dielectric (ILD) layers and inter-metal dielectrics (IMDs) layers. In some embodiments, the front side interconnect structure 80 includes metal lines and vias for connecting signal lines only, but not connecting to power rails or connections to power rails. In other embodiments, the front side interconnect structure 80 includes a portion of power rails. Power rails indicate conductive lines connecting between the epitaxial source/drain features 38, 40 and a power source, such as VDD, and VSS (GND).

In operation 122, a carrier substrate 74 is temporarily bonded to a top side of the front side interconnect structure 80 after the formation of the front side interconnect structure 80, as shown in FIGS. 12A-D. The carrier substrate 74 serves to provide mechanical support for the front side interconnect structure 80 and devices formed on the substrate 12.

In operation 124, the carrier substrate 74 along with the substrate 12 is flipped over so that the backside of the substrate 12 (i.e., the backside 12k) is facing up for backside processing. A backside grinding is performed to expose the isolation layer 22, the backside contact alignment features 38a, 40a, the n-well 12a and p-well 12b of the substrate 12, as shown in FIGS. 13A-13D.

Figure 14A:
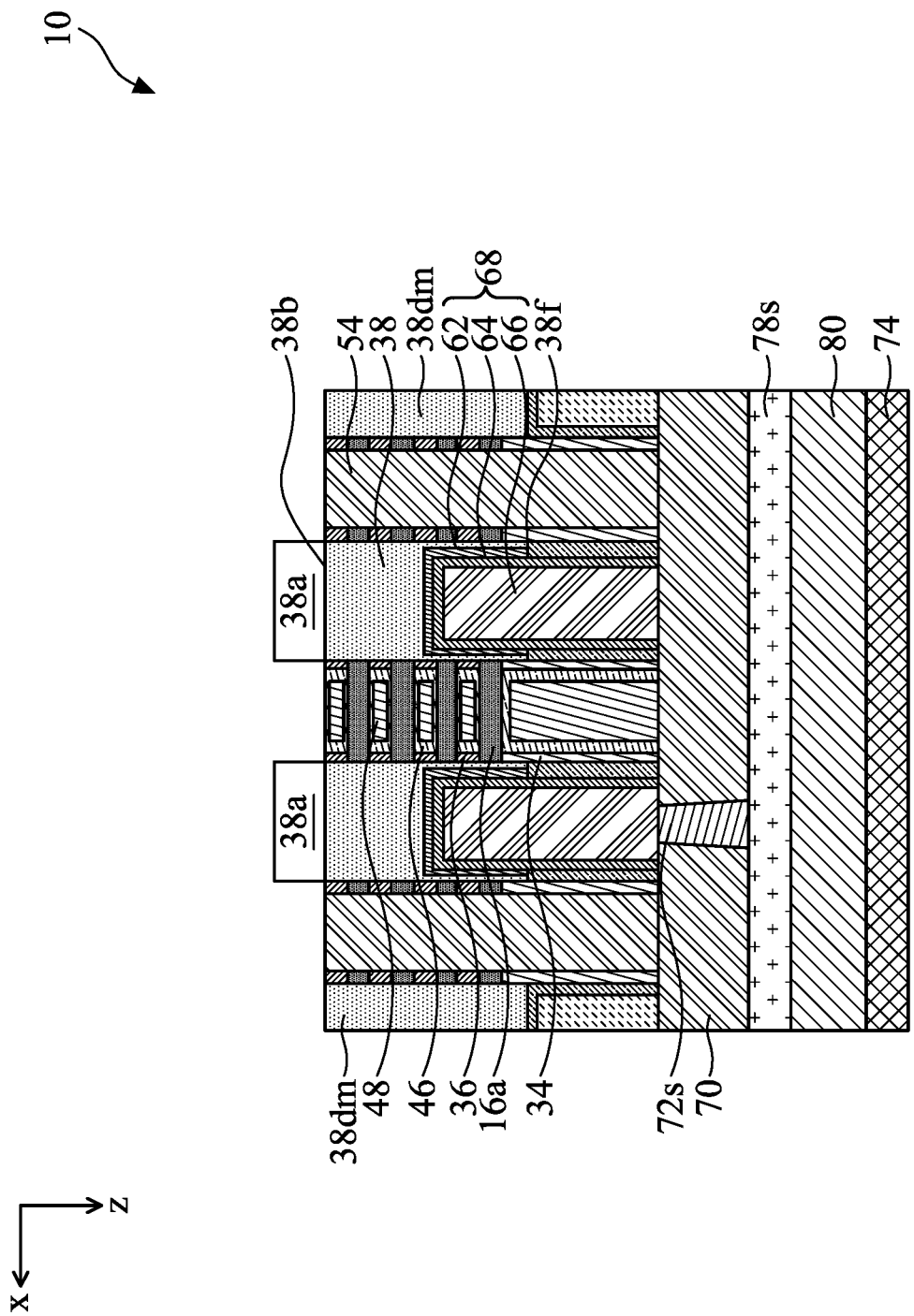
Figure 14C:
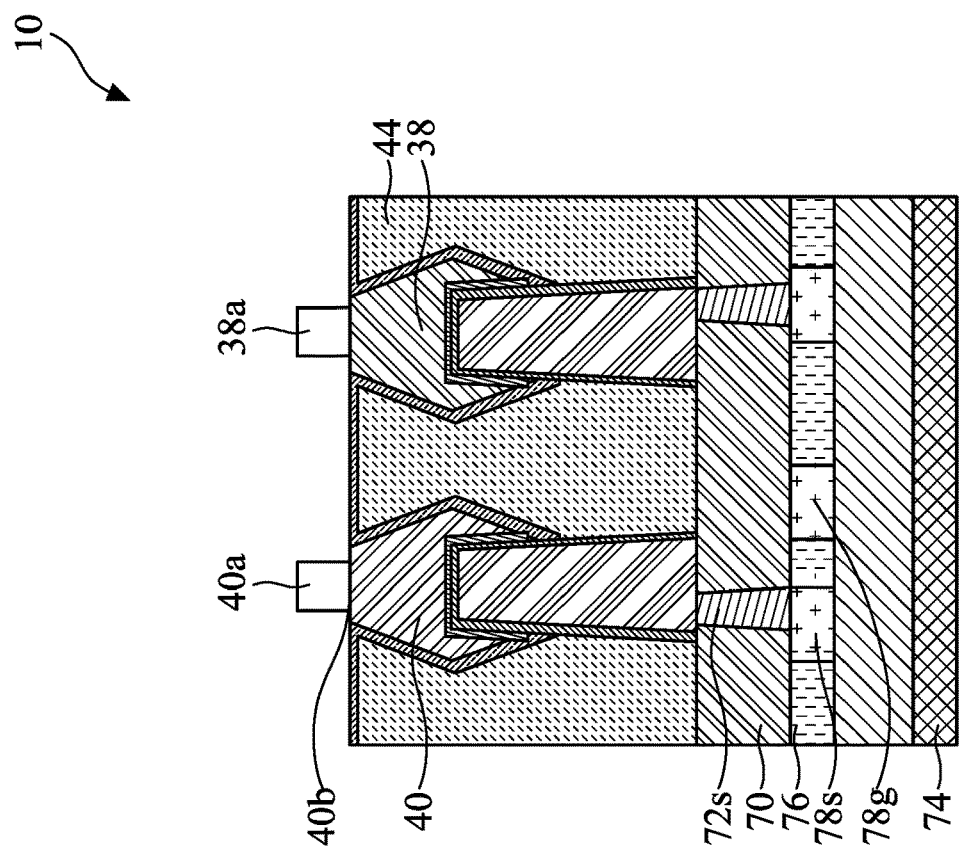
Figure 14B:
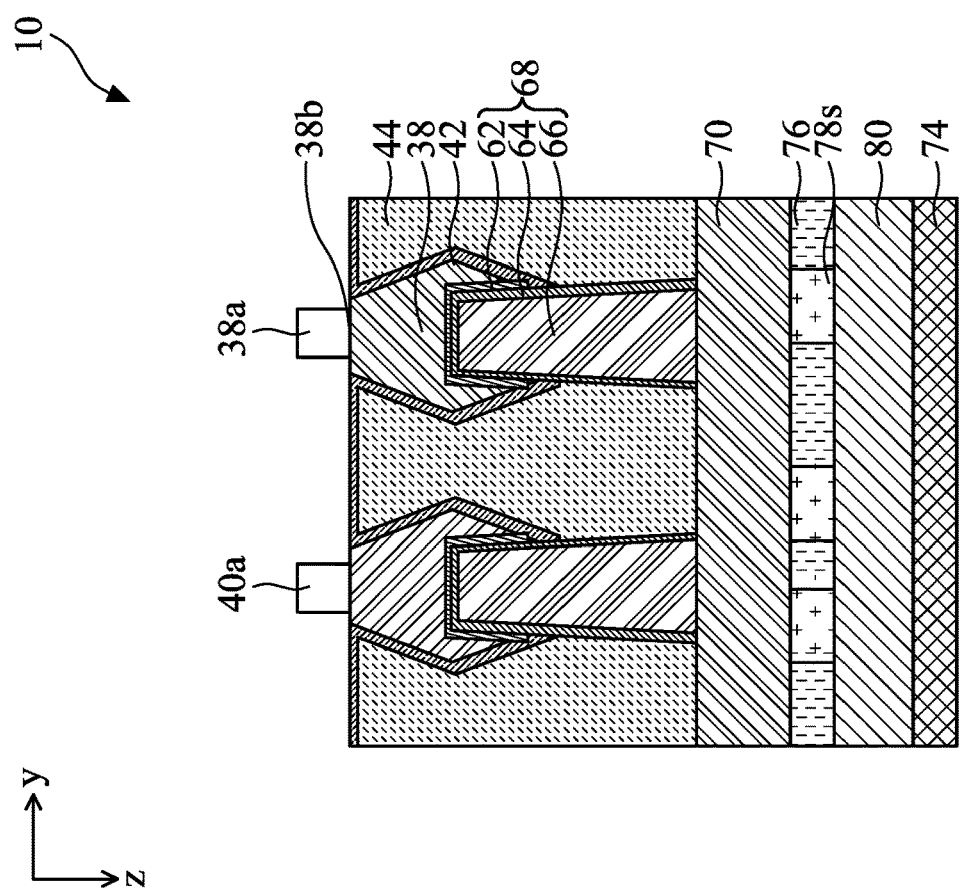

In operation 126, the isolation layer 22 and the n-well 12a and p-well 12b of the substrate 12 are removed, as shown FIGS. 14A-C. The isolation layer 22 may be removed using a suitable selective etch process. After removal of the isolation layer 22, portions of the backside 38b, 40b of the source/drain features 38, 40, the CESL 42, the filler dielectric material 54 in the dummy gate structures 52, 52c, the gate dielectric layer 46 in the gate structure 50b, and segments of the inner spacers 36 are exposed.

Figure 15A:
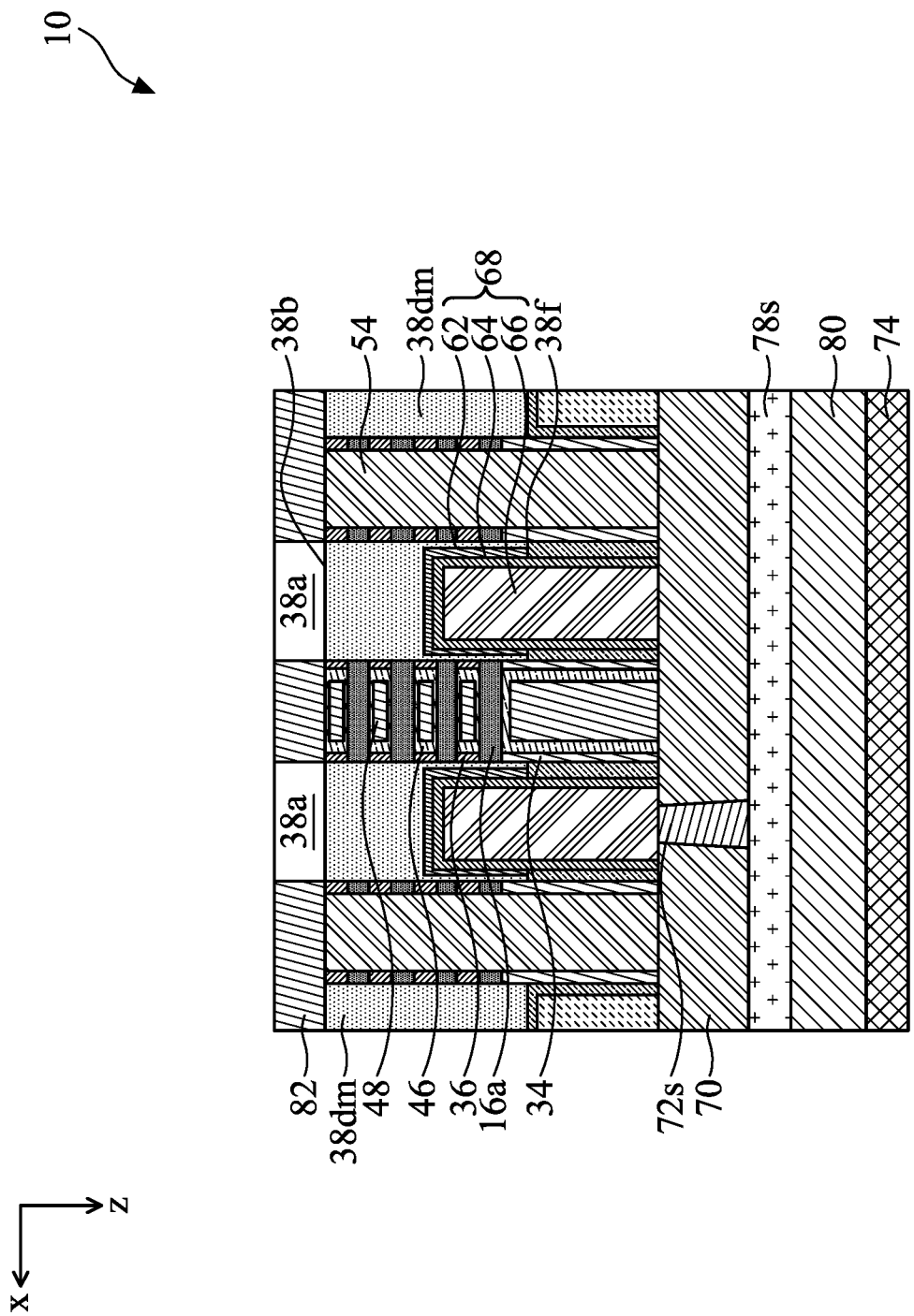
Figure 15C:
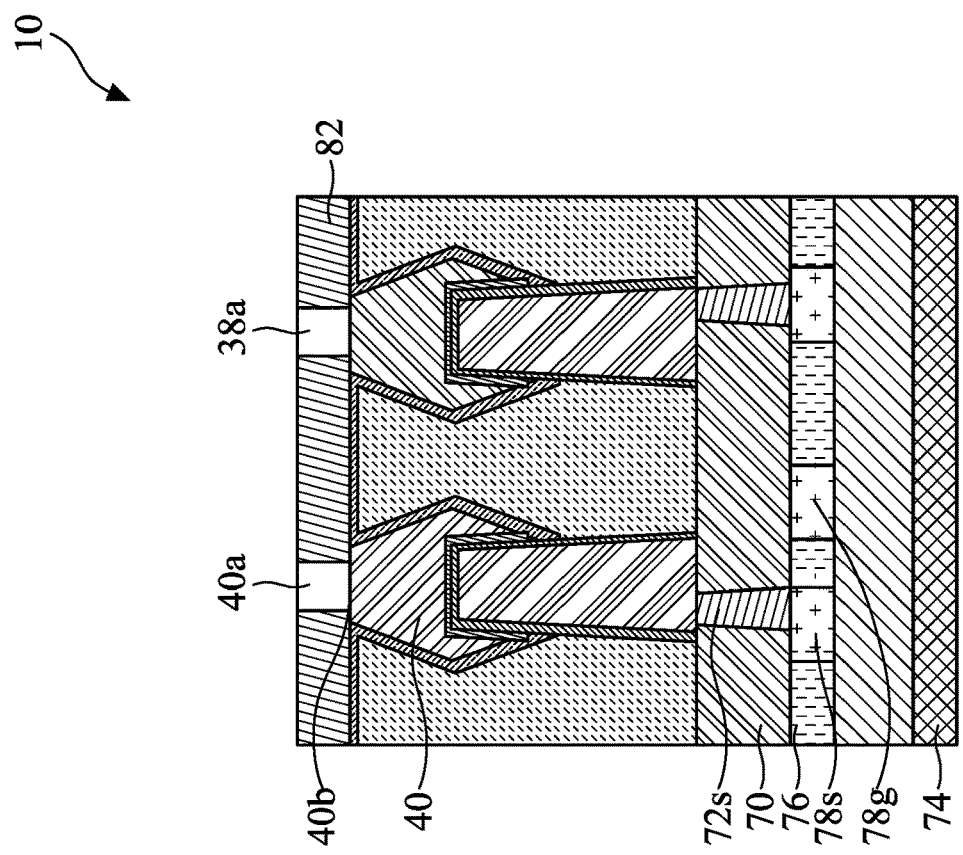
Figure 15B:
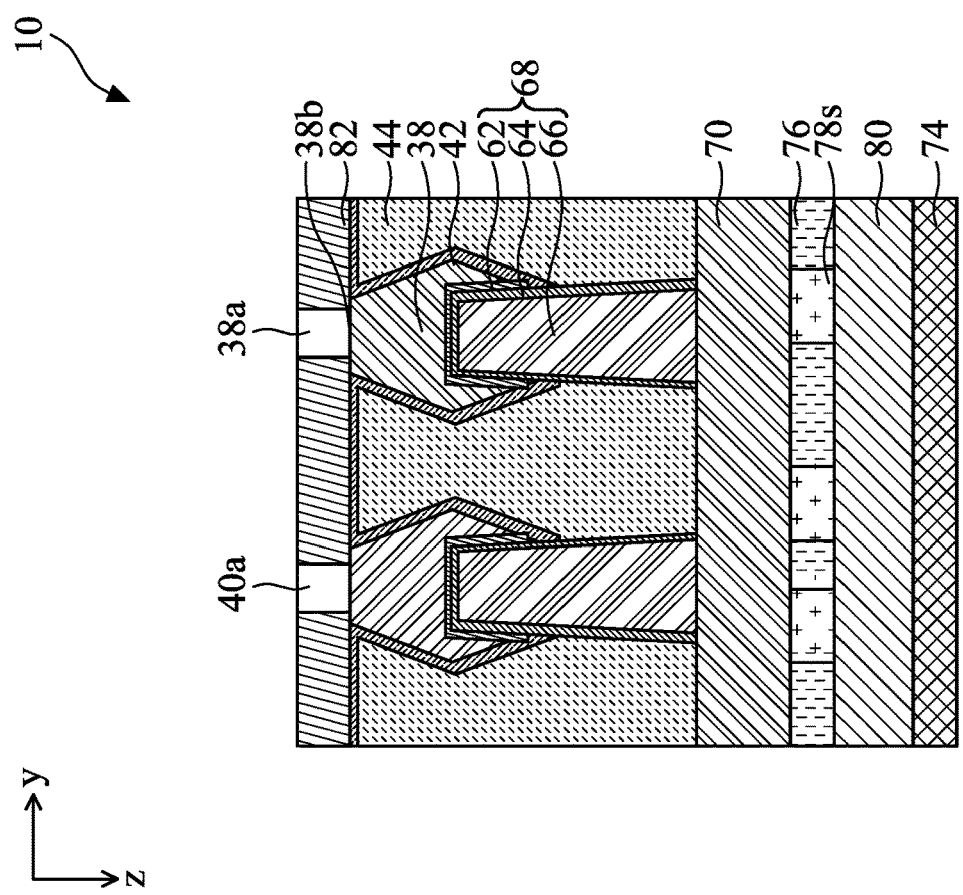

In operation 128, a refill dielectric layer 82 is formed in cavities vacated by the isolation layer 22, the n-well 12a, and the p-well 12b, and a planarization process is followed to expose the backside contact alignment features 38a, 40a, as shown in FIGS. 15A-15B. The remaining portions of the backside contact alignment features 38a, 40a are embedded in the refill dielectric layer 82. The refill dielectric layer 82 is in contact with portions of the backside 38b, 40b of the source/drain features 38, 40, the CESL 42, the filler dielectric material 54 in the dummy gate structures 52, 52c, the gate dielectric layer 46 in the gate structure 50b, and segments of the inner spacers 36.

In some embodiments, the refill dielectric layer 82 includes a dielectric material that has etch selectivity over subsequently formed dielectric layers and functions as an etch stop layer when patterning the subsequently formed dielectric layers. In some embodiments, the refill dielectric layer 82 may include $Si_3N_4$, SiON, SiCN or any other suitable material, and may be formed by CVD, PVD, or ALD, or other suitable material.

Figure 16A:
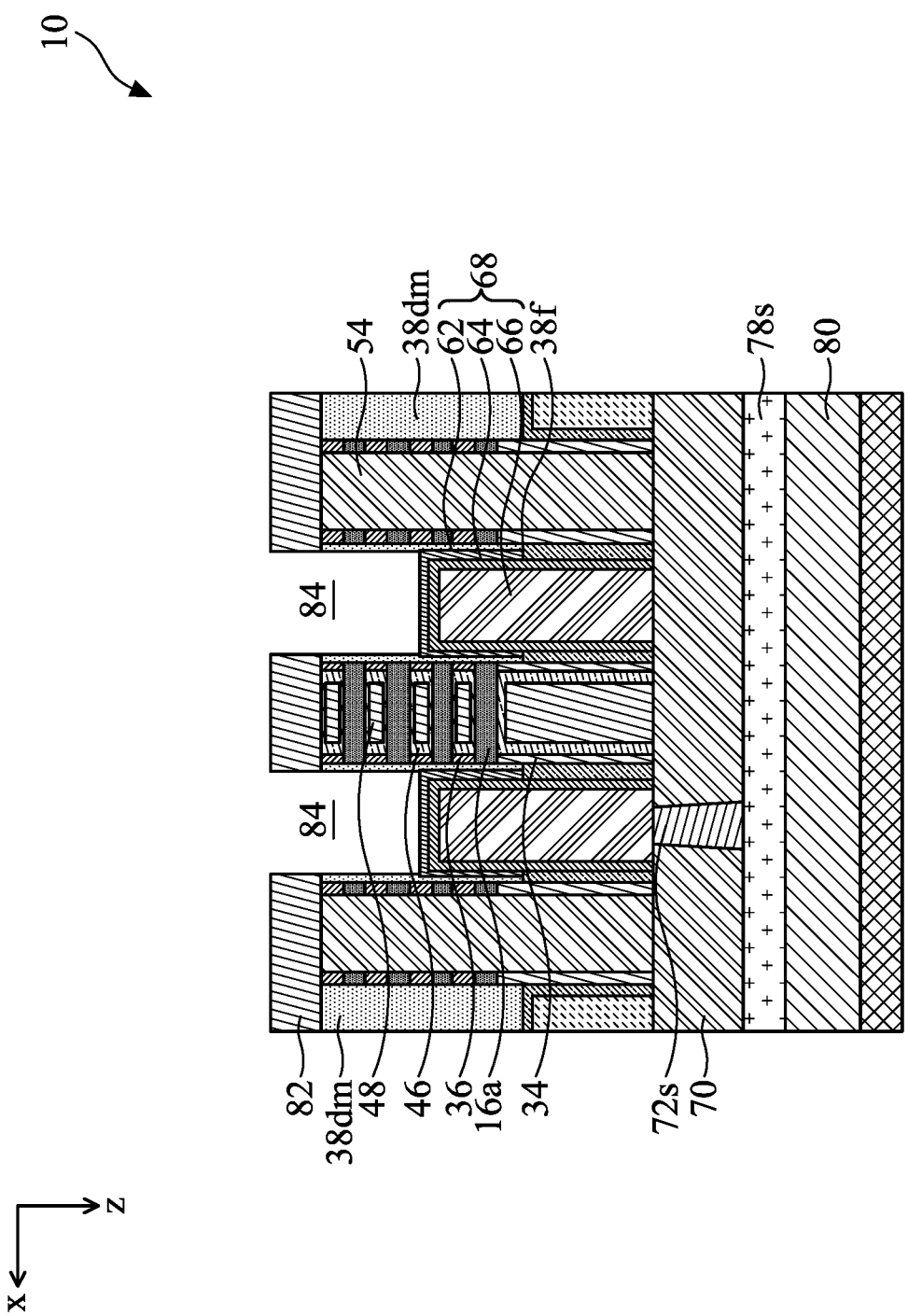
Figure 16C:
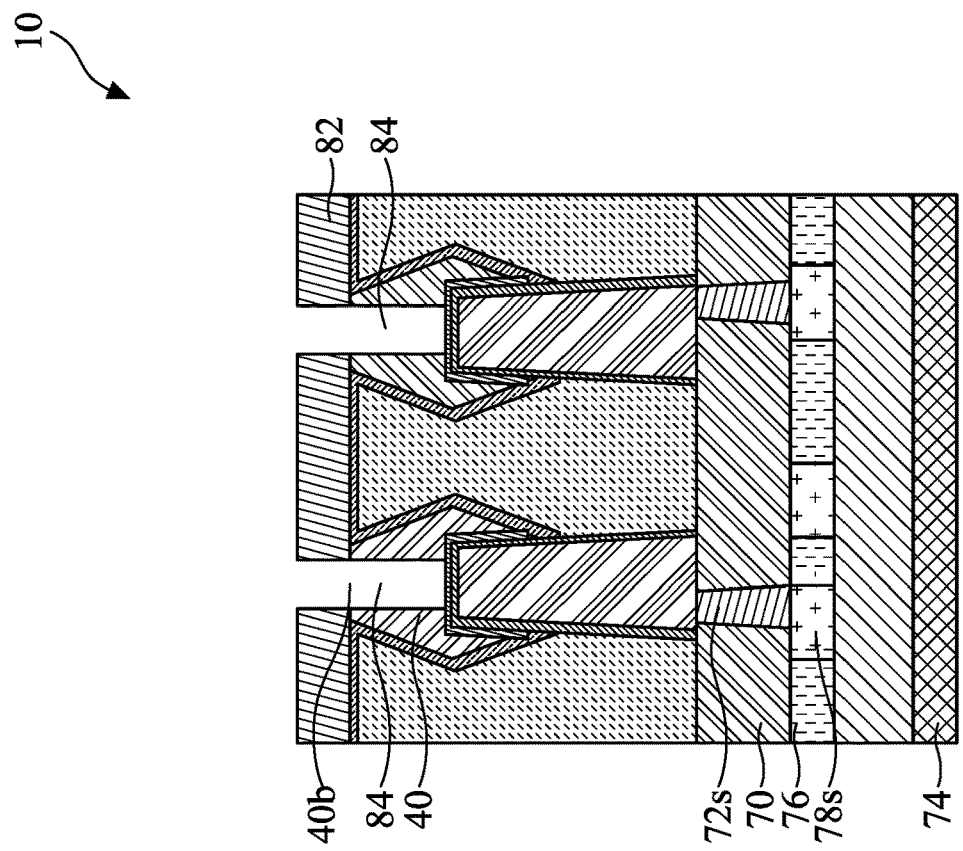
Figure 16B:
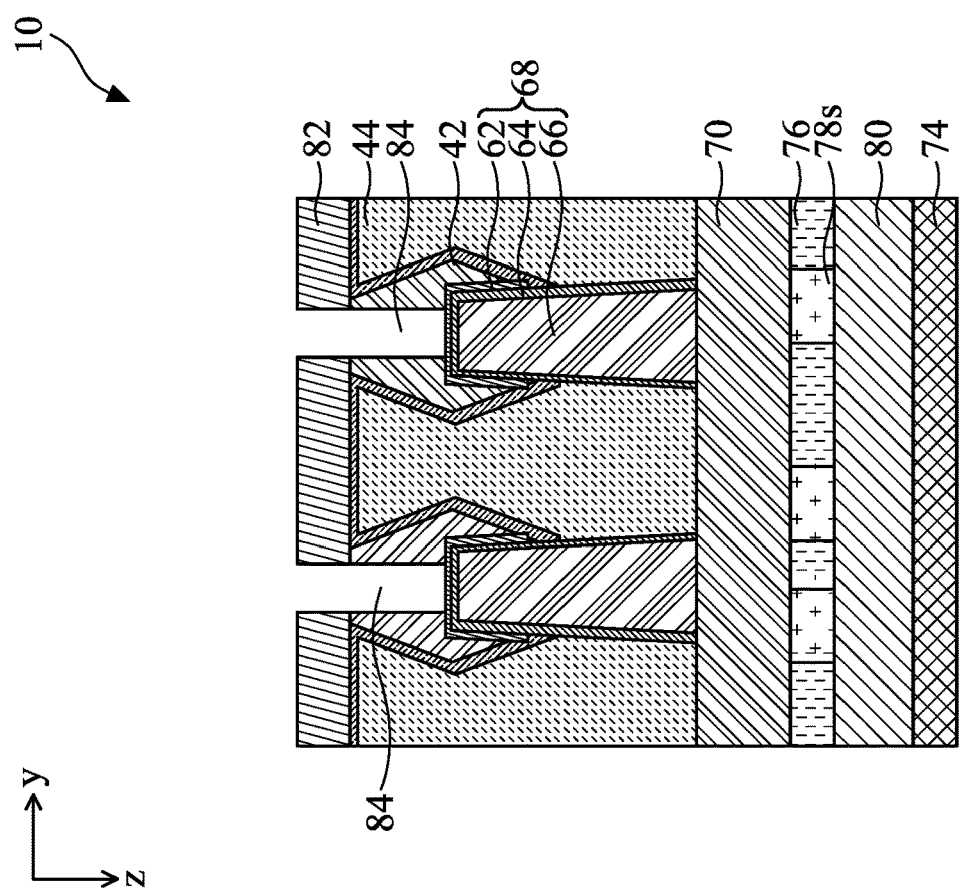

In operation 130, backside contact openings 84 are formed by one or more etch processes, as shown in FIGS. 16A-C. The backside contact alignment features 38a, 40a are first removed by any suitable etch process to expose the epitaxial source/drain features 38, 40. The epitaxial source/drain features 38, 40 are recessed to form the backside contact openings 84. In some embodiments, the epitaxial source/drain features 38, 40 may be recessed by the same etch process used to remove backside contact alignment features 38a, 40a. In other embodiments, the epitaxial source/drain features 38, 40 may be recessed by a suitable and different etch process.

As shown in FIGS. 16A-C, the epitaxial source/drain features 38, 40 are recessed until the front side source/drain contact features 68 are exposed to the backside contact openings 84. In some embodiments, the backside contact openings 84 expose the silicide layer 62 of the front side source/drain contact features 68. In other embodiments, additional etch process is performed so that the metal feature 66 in the front side source/drain contact features 68 is exposed to the backside contact openings 84.

Figure 17A:
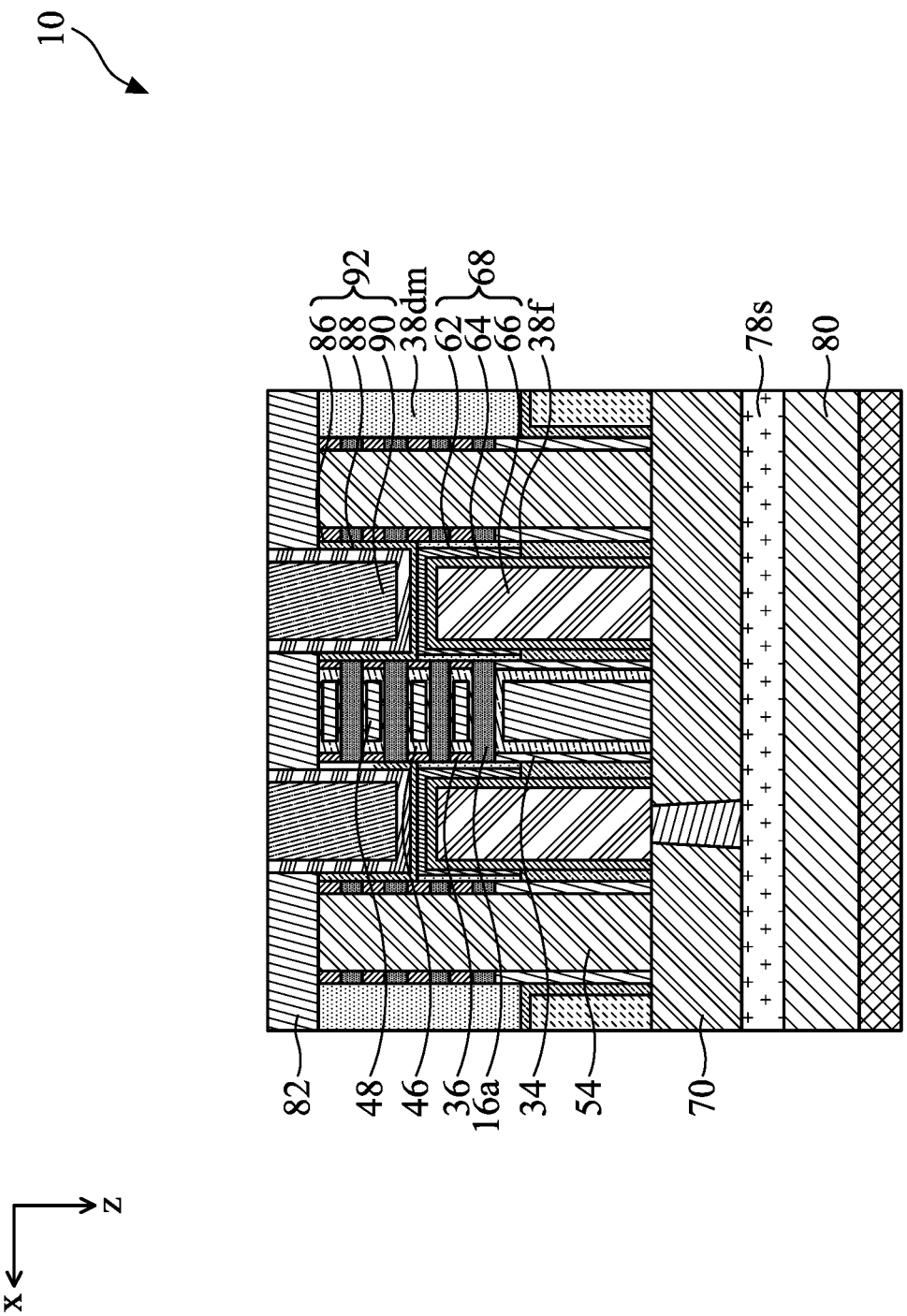
Figure 17C:
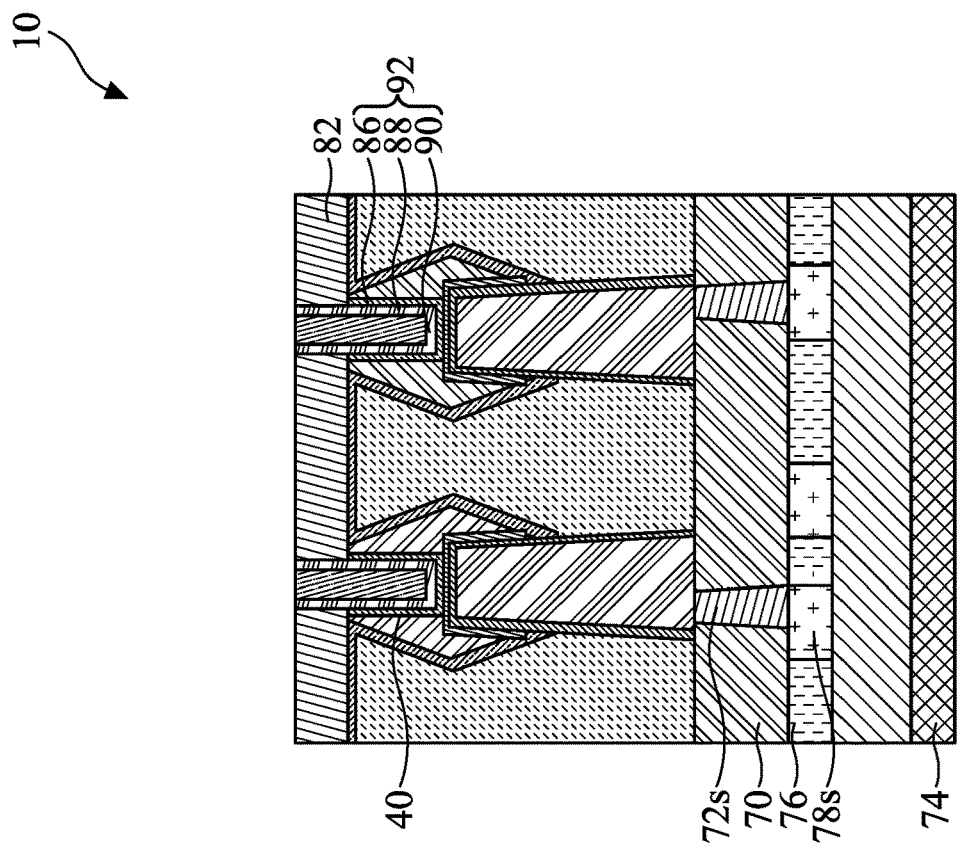
Figure 17B:
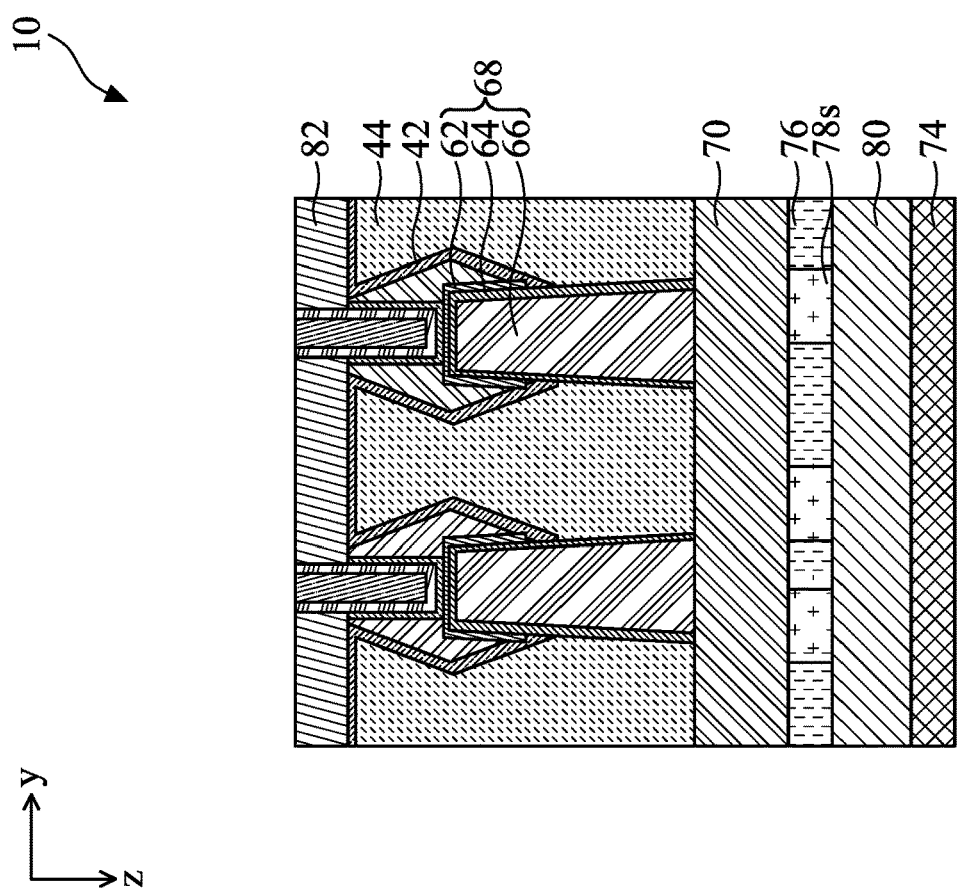

In operation 132, backside source/drain contact features 92 are formed in the backside contact openings 84, as shown in FIGS. 17A-C. In some embodiments, the backside source/drain contact feature 92 may include a silicide layer 86, a barrier layer 88, and a metal feature 90. In other embodiments, the silicide layer 86 and/or the barrier layer 88 may be omitted.

The silicide layer 86 is formed on exposed surfaces of the epitaxial source/drain features 38, 40. The silicide layer 86 may include one or more of WSi, CoSi, NiSi, TiSi, MoSi, and TaSi. In some embodiments, the silicide layer 86 may be formed at a temperature lower than about 500° C.

The barrier layer 88 may be optionally formed over the exposed surfaces on the contact openings 84. The barrier layer 88 may include titanium, titanium nitride, tantalum, tantalum nitride, or the like. The metal feature 90 is then formed by filling the contact openings 84 with a conductive material. In some embodiments, the conductive material for the gate contact may be formed by CVD, PVD, plating, ALD, or other suitable technique. In some embodiments, the conductive material may include TiN, TaN, Ta, Ti, Hf, Zr, Ni, W, Co, Cu, Ag, Al, Zn, Ca, Au, Mg, Mo, Cr, or the like. Subsequently, a CMP process is performed to remove excessive conductive material and expose the refill dielectric layer 82.

As shown in FIGS. 17A-C, the front side source/drain contact features 68 are in contact with the corresponding backside source/drain contact features 92 forming a conductive path through the source/drain features 38, 40. The front side source/drain contact feature 68 and the corresponding backside source/drain contact feature 92 may be collectively referred to as a metal plug through the source/drain feature 38, 40.

Figure 18A:
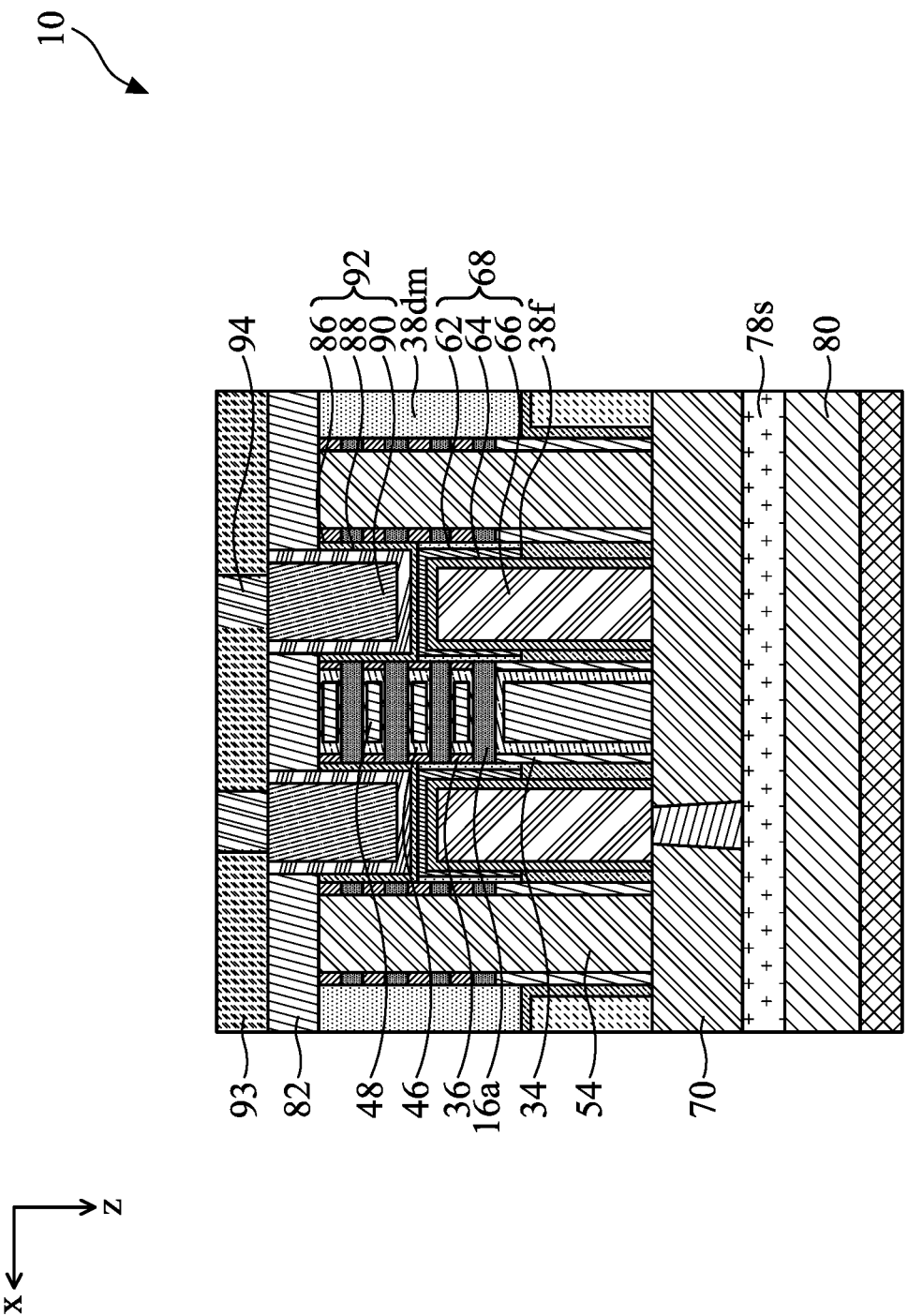

In operation 134, a backside routing layer 93 with routing features 94 are formed, as shown in FIGS. 18A-C. The backside routing layer 93 includes one or more layers of dielectric materials. The one or more layers of dielectric materials are first deposited and then patterned to form openings for routing features 94. The routing features 94 are formed by filling the routing openings in the backside routing layer 93 with a conductive material. Subsequently, a CMP process is performed to remove excessive conductive material. Each routing feature 94 may be in contact with a backside source/drain contact feature 92. The routing features 94 are metal lines designed to redistribute metal lines.

Figure 19A:
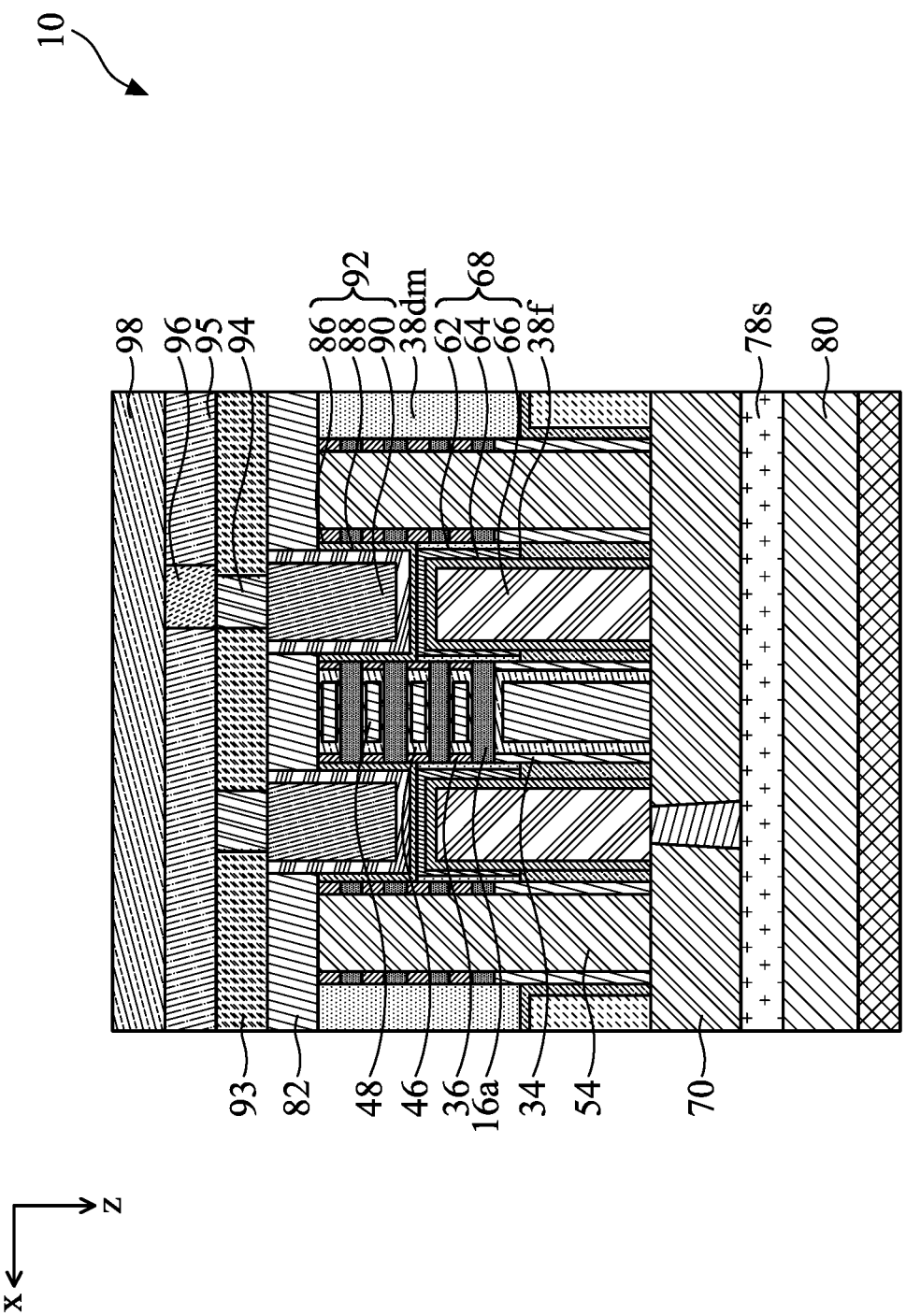

In operation 136, contact vias 96 connecting to the routing features 94 and metal lines 98 in connection with the contact vias 96 are formed, as shown in FIGS. 19A-C. The contact vias 96 are formed in a backside ILD layer 95. The metal lines 98 are formed in a backside metal layer 97.

The backside ILD layer 95 is formed by depositing a dielectric material over the backside routing layer 93. The backside metal layer 97 is the formed over the backside ILD layer 95 by depositing one or more layers of dielectric material layers. In some embodiments, the backside metal layer 97 may include an etch stop layer to enable a patterning process, such as a damascene patterning process, through the backside ILD layer 95 and the backside metal layer 97. In some embodiments, the backside metal layer 97 may be formed from materials that can be selectively etched from the backside ILD layer 95. In other embodiments, one or more etch stop layers are formed between the backside ILD layer 95 and the backside metal layer 97. A patterning process, such as a damascene process, is performed to form contact openings for the contact vias 96 in the backside ILD layer 95 and for the metal lines 98 in the backside metal layer 97.

In some embodiments, a barrier layer, (not shown) may be formed in the contact openings for the contact vias and the metal lines prior to formation of the contact vias 96 and metal lines 98. The barrier layer may include titanium, titanium nitride, tantalum, tantalum nitride, or the like. The contact vias 96 and metal lines 98 are formed by filling the contact openings with a conductive material. In some embodiments, the conductive material for the gate contact may be formed by CVD, PVD, plating, ALD, or other suitable technique. In some embodiments, the conductive material may include TiN, TaN, Ta, Ti, Hf, Zr, Ni, W, Co, Cu, Ag, Al, Zn, Ca, Au, Mg, Mo, Cr, or the like.

In some embodiments, arrangement, location and dimension, of the metal lines 98 in the backside metal layer 97 are similar to the arrangement indicated by the bar group 60 in FIG. 9B.

FIGS. 19B-C schematically illustrate how the routing features 94 in the backside routing layer 93 distribute backside connections to a wider region. As shown in FIG. 19B, the source/drain features 38, 40 on the source side (FIG. 9B) are connected to the metal lines 98p through the routing features 94 and contact vias 96. The metal lines 98p are wider lines positioned near edge regions of the semiconductor device 10. In some embodiments, the metal lines 98p may be connected to a power supply, or power rail directly or through a backside interconnect structure to be formed.

As shown in FIG. 19C, the source/drain features 38, 40 on the drain side (FIG. 9B) are connected to the signal lines 98s through the routing features 94 and contact vias 96. The signal lines 98s are narrower lines positioned near central region of the semiconductor device 10. In some embodiments, the signal lines 98s may be signal lines or connected to signal lines through a backside interconnect structure to be formed.

As shown in FIG. 19B, the source/drain features 38, 40 in the source side may be connected to a power rail through the backside contacts features 92. As shown in FIG. 19C, the signal lines 78s in the front side metal layer 76 are connected to the signal lines 98s in the backside metal layer 97 via a conductive path formed through the source/drain features 38, 40. Particularly, the conductive path through the source/drain features 38, 40 includes the front side source/drain contact feature 68, which is partially embedded in a source/drain feature 38, 40, and extending from the front side 38f, 40f of the source/drain feature 38, 40, and the backside source/drain contact feature 92, which is partially embedded in the source/drain feature 38, 40 and extending from the backside 38b, 40b of the source/drain feature 38, 40. The front side source/drain contact feature 68 is in contact with the backside source/drain contact feature 92.

Figure 20A:
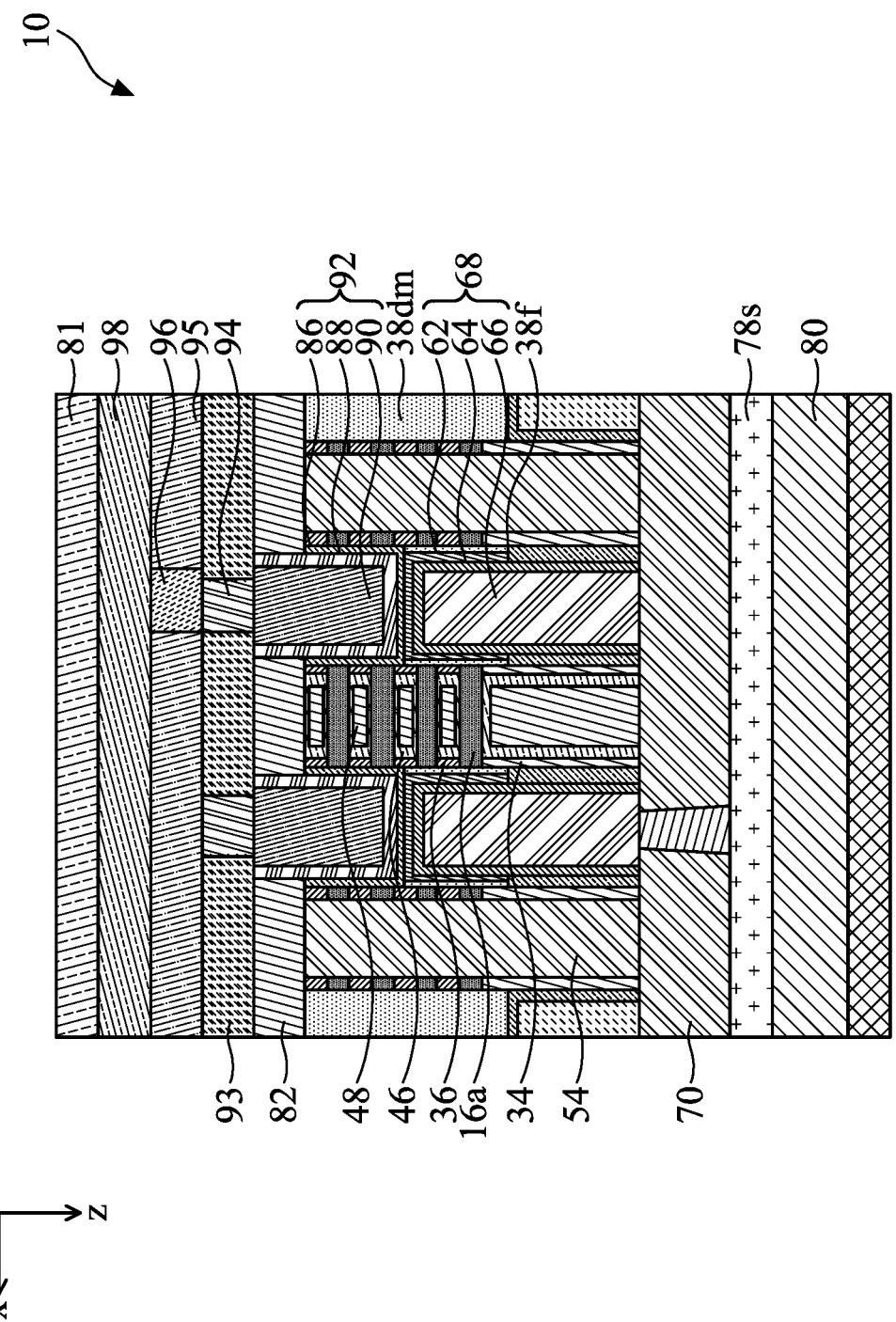

In operation 138, a backside interconnect structure 81 is formed to provide connection to the metal lines 98 in the backside metal layer 97, as shown in FIGS. 20A-C. As discussed above, the metal lines 98p are configured to connect the epitaxial source/drain feature 38, 40 to power rails, such as a positive voltage rail (VDD) and a ground rail (GND) through the backside interconnect structure 81. In some embodiments, the backside interconnect structure 81 may include power rails or be part of a power rail.

In the embodiment of FIGS. 2-20, the conductive path is formed through a source/drain feature in the standard cell. In other embodiments, a conductive path from the front side to the backside may be formed through a source/drain feature in the filler cell.

FIGS. 21A-D to FIGS. 25A-C schematically illustrate various stages of manufacturing a semiconductor device 10a according to embodiments of the present disclosure. The semiconductor device 10a is similar to the semiconductor device 10 except that conductive paths from the front side to the backside is formed through source/drain features 38dm and/or 40dm in the filler cells 57s, 57d. The semiconductor device 10a may be manufactured using a method similar to the method 100 using different patterns when forming conductive features, contact vias, and metal lines.

Figure 21A:
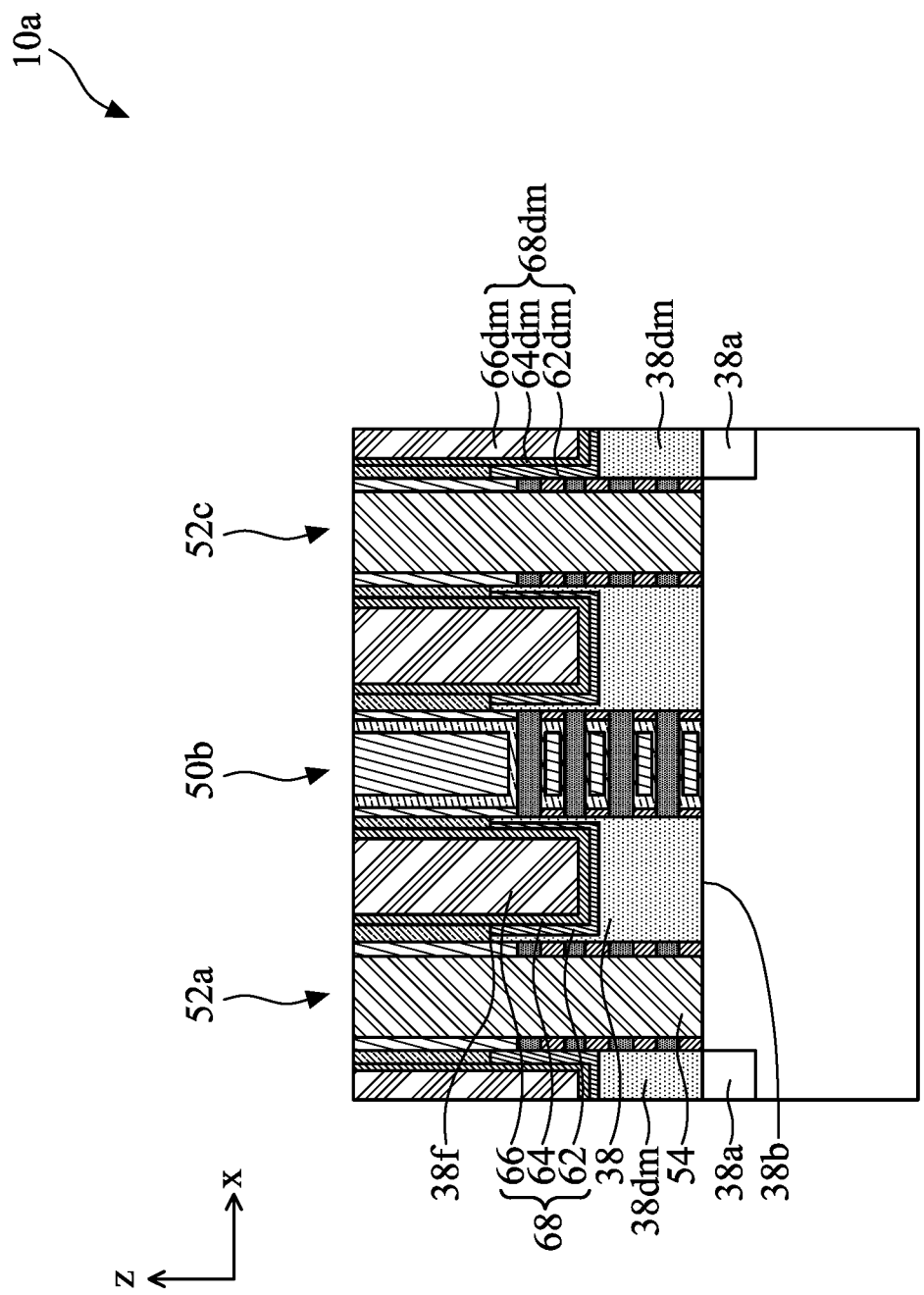
FIGS. 21A-D to FIGS. 25A-C schematically illustrate various stages of manufacturing a semiconductor device according to embodiments of the present disclosure.
Figures 21B, 21C:
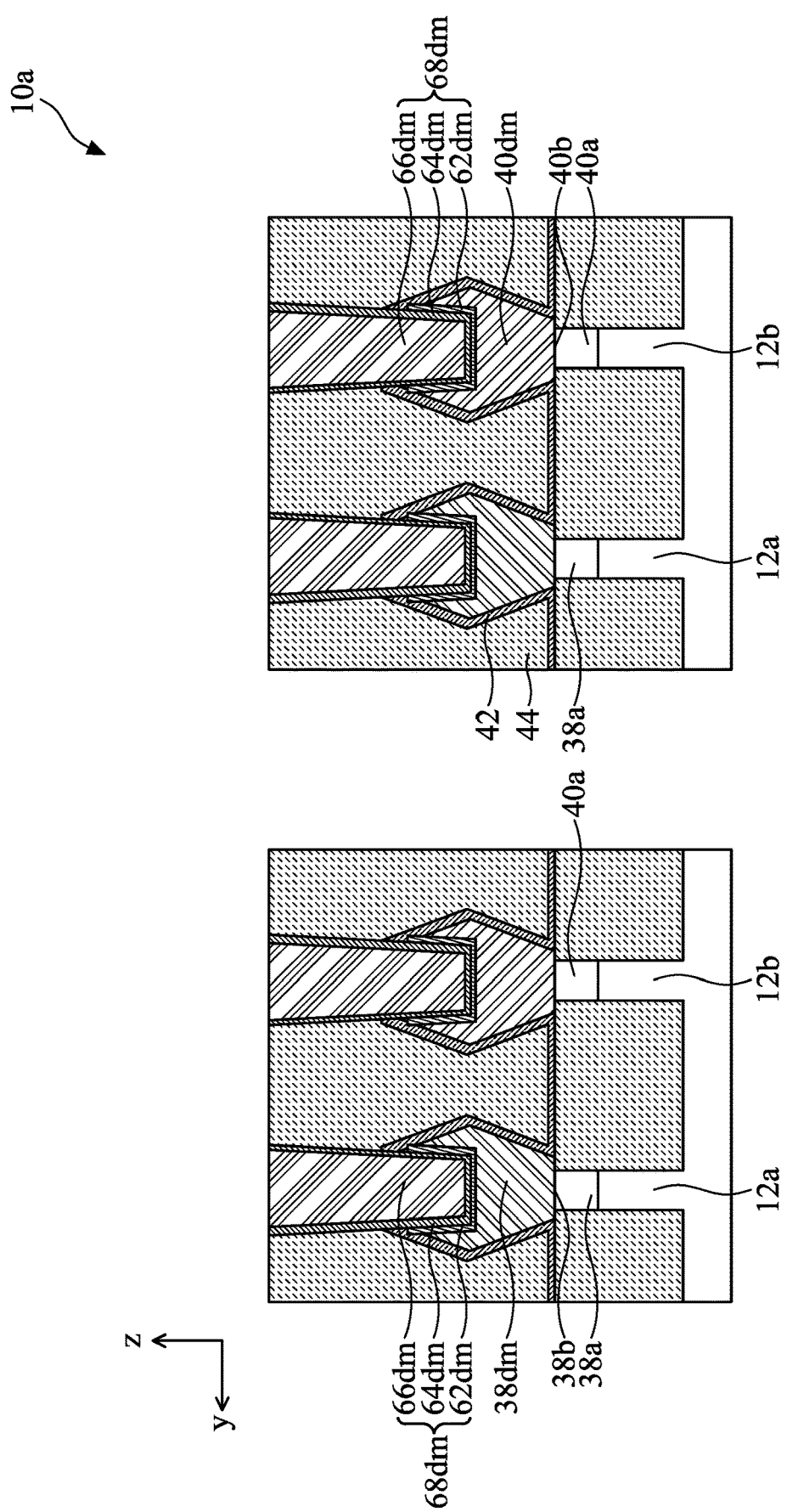
Figure 21D:
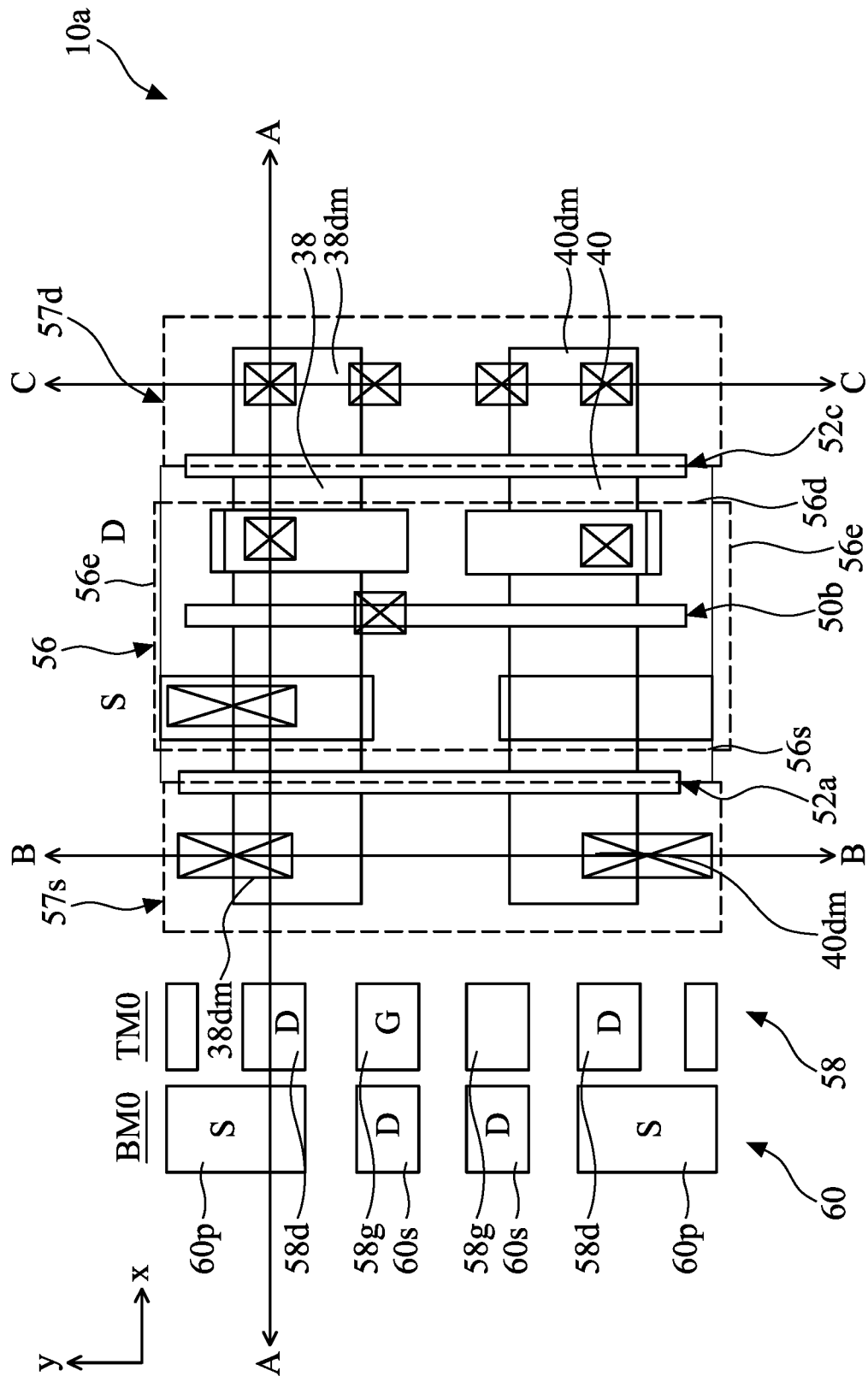

FIGS. 21A-C are sectional views of the semiconductor device 10a after operation 116. FIG. 21D is a schematic plan view of the semiconductor device 10a. Lines A-A, B-B, C-C in FIG. 21D indicate cut lines of various views in FIGS. 21A-C to FIGS. 25A-C described below. Particularly, FIGS. 21A-25A are schematic cross-sectional views along lines A-A in FIG. 21D, FIGS. 21B-25B are schematic cross-sectional views along lines B-B in FIG. 21D, and FIGS. 21C-21C are schematic cross-sectional views along lines C-C in FIG. 21D. FIGS. 21A-25A are sectional view of X-cut views in the p-type device. FIGS. 21B-25B are Y-cut of the filler cell 57s and FIGS. 21C-26C are Y-cut views of the filler cell 57d.

As shown in FIGS. 21A-21C, front side source/drain contact features 68dm are formed in the filler cells 57s, 57m. Each of the front side source/drain contact features 68dm may include a silicide layer 62dm, a barrier layer 64dm, and a metal feature 66dm.

Figure 22A:
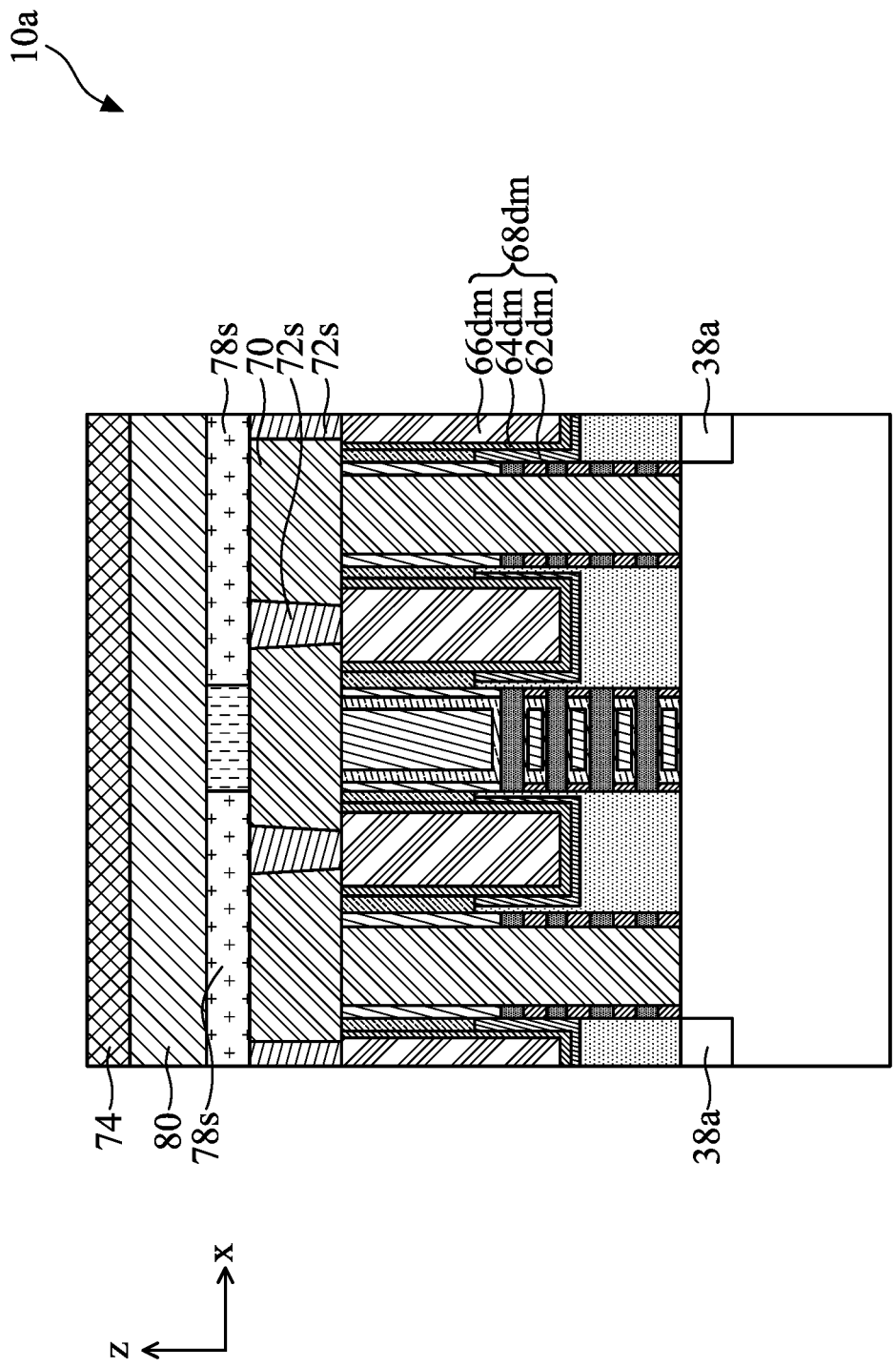
Figure 22C:
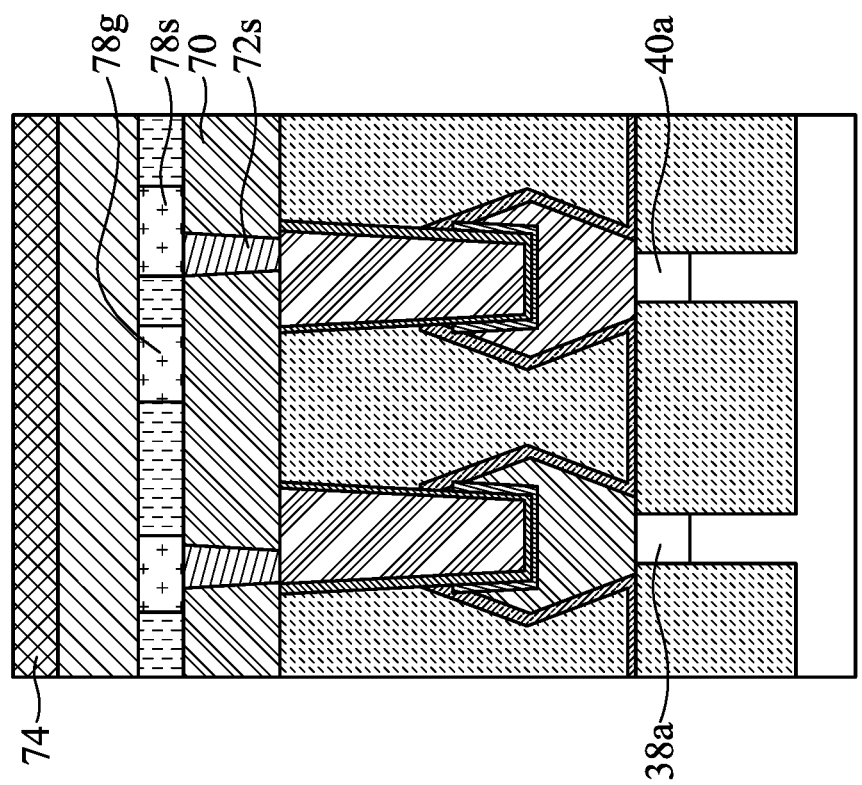
Figure 22B:
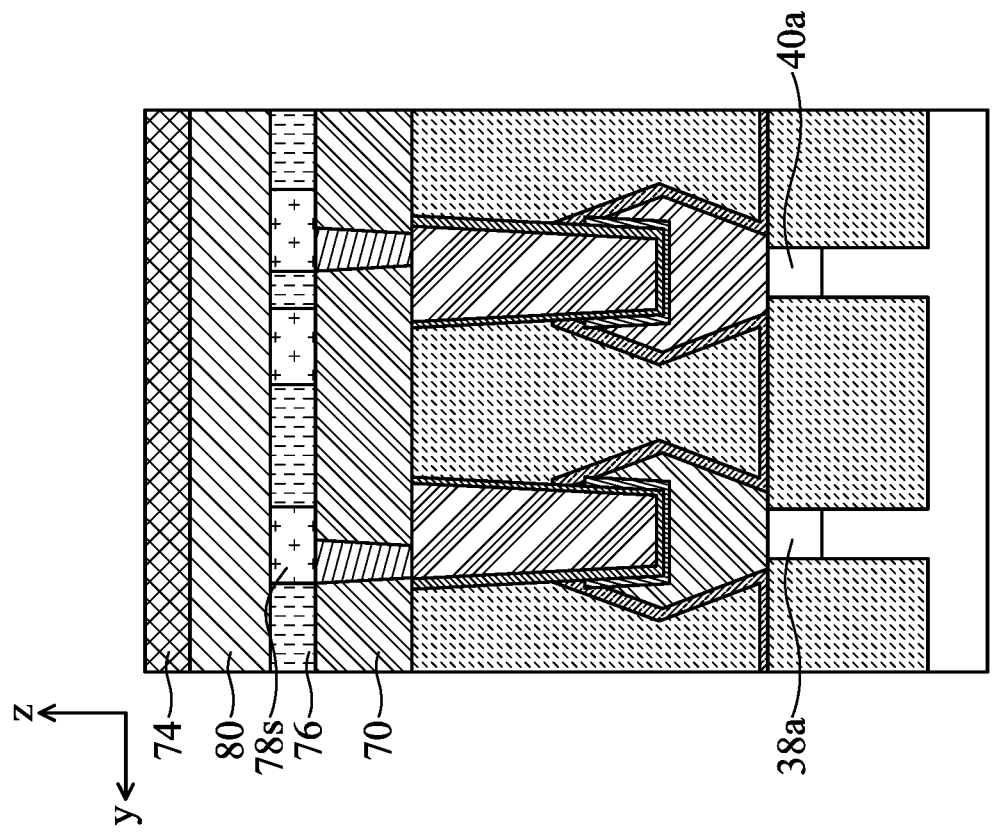

FIGS. 22A-C schematically show sectional views of the semiconductor device 10a after operation 118. As shown in FIG. 22A, the front side source/drain contact features 68dm in the filler cell 57s is connected to the front side source/drain contact features 68 in the source side of the standard cell 56 through the contact vias 72s and metal lines 78s. Similarly, the front side source/drain contact features 68dm in the filler cell 57d is connected to the front side source/drain contact features 68 in the drain side of the standard cell 56 through the contact vias 72s and metal lines 78s.

Figure 23A:
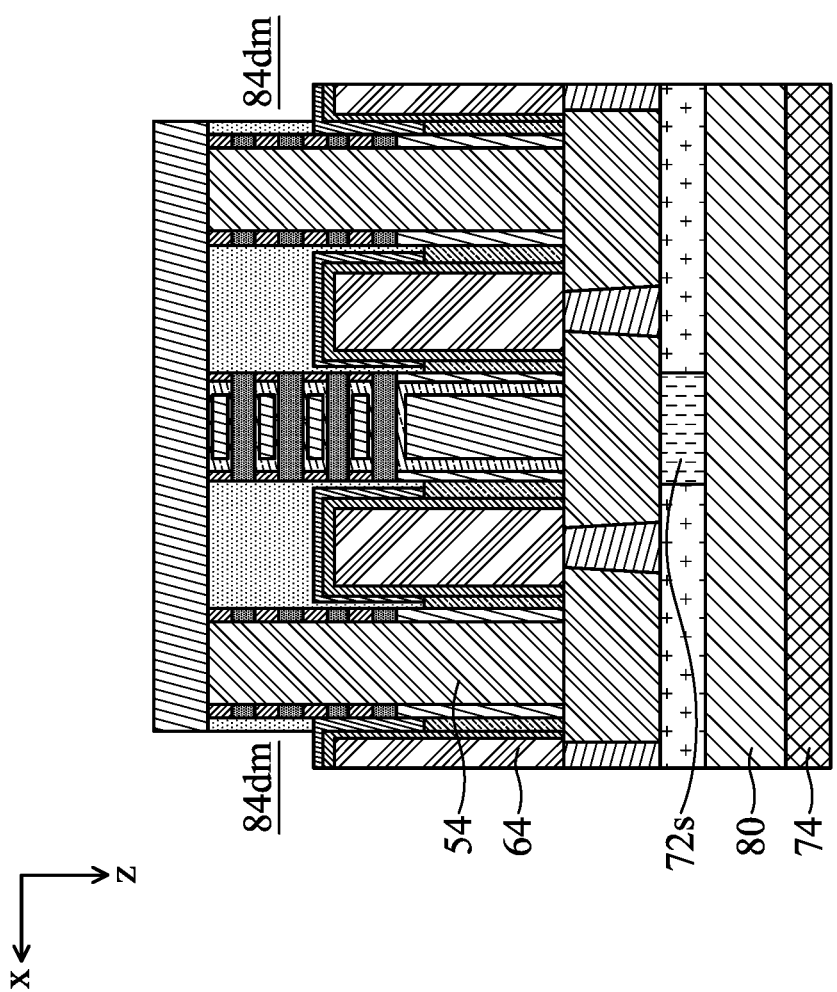

FIGS. 23A-C schematically show sectional views of the semiconductor device 10a after operation 134. Contact openings 84dm are formed in the source/drain features 38dm, 40dm in the filler cells 57s, 57d.

Figure 24A:
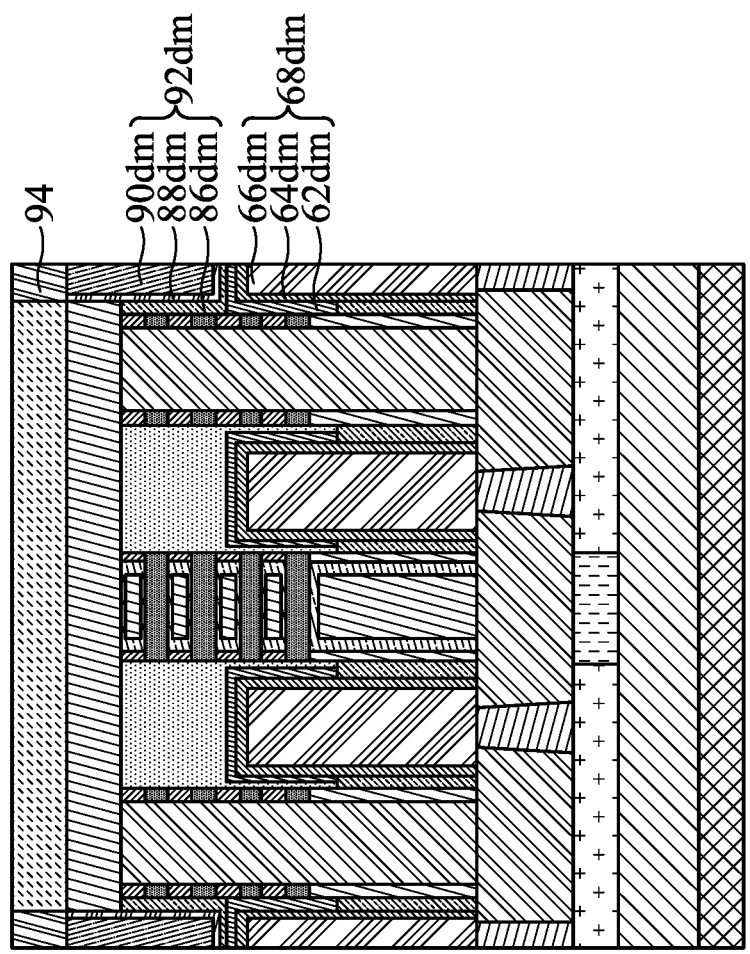

FIGS. 24A-C schematically show sectional views of the semiconductor device 10a after operation 134. Backside source/drain contact features 92dm are formed in the contact openings 84dm and the routing features 94 are connected to the backside source/drain contact features 92dm. Conductive paths are formed through the source/drain features 38dm, 40dm in the filler cells 57s, 57d. In some embodiments, the backside source/drain contact feature 92dm may include a silicide layer 86dm, a barrier layer 88dm, and a metal feature 90dm. In other embodiments, the silicide layer 86dm and/or the barrier layer 88dm may be omitted.

Figure 25A:
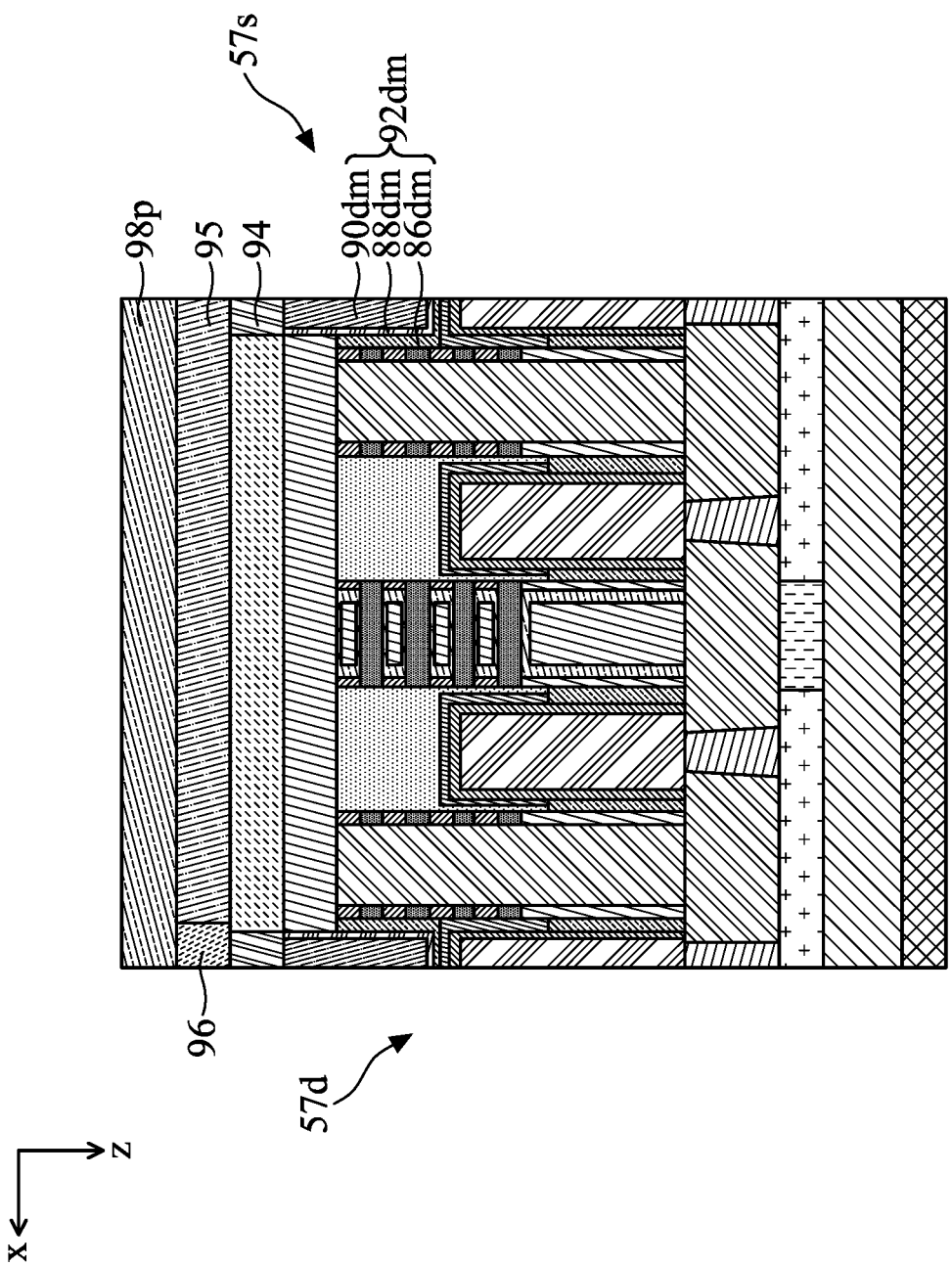
Figure 25C:
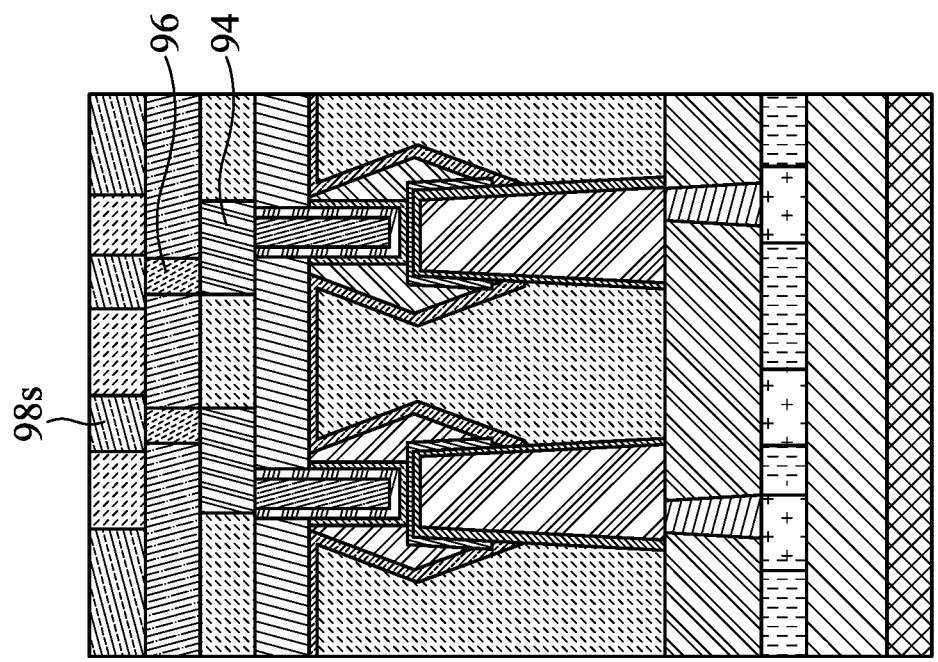
Figure 25B:
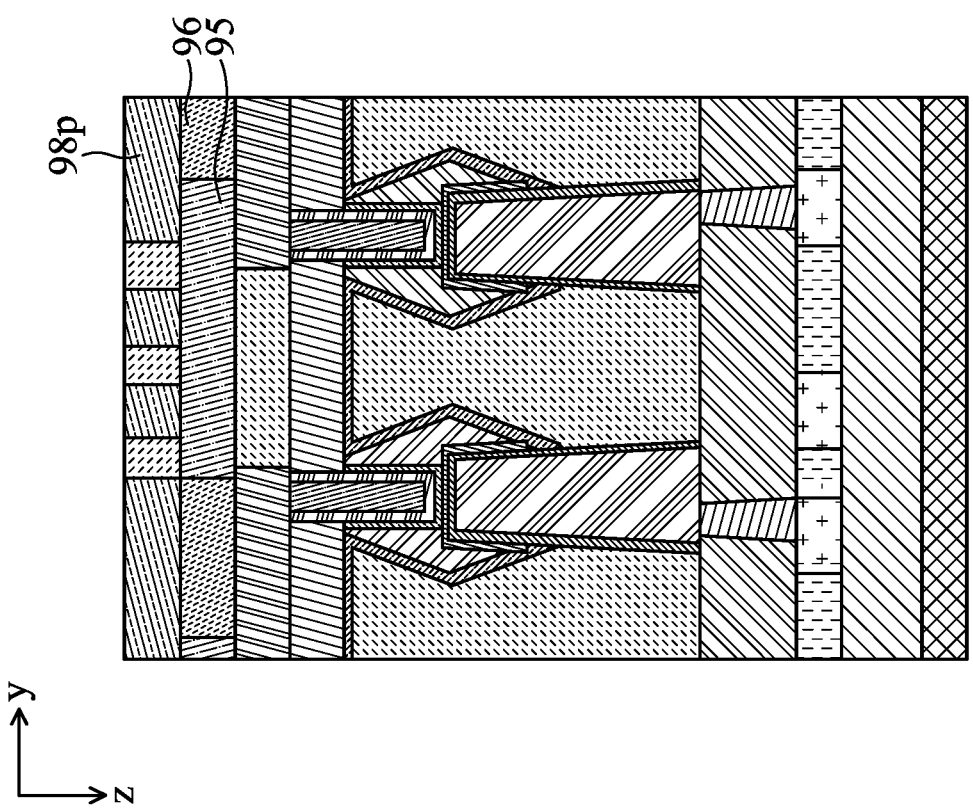

FIGS. 25A-C schematically show sectional views of the semiconductor device 10a after operation 136. As shown in FIG. 25B, the source/drain contact features 92dm in the filler cell 57s may be connected to a power rail through the routing features 94, the contact vias 96, and the metal lines 98p. The backside source/drain contact features 92dm in the filler cell 57s are connected to the front side source/drain contact features 68dm, which are in electrical connection with the source/drain features 38, 40 in the source side of the standard cell 56. Thus, the standard cell 56 is connected to a power rail through the conductive paths through the filler cell 57s.

As shown in FIG. 25C, the source/drain contact features 92dm in the filler cell 57d may be connected to signal lines through the routing features 94, the contact vias 96, and the signal lines 98s. The backside source/drain contact features 92dm in the filler cell 57d are connected to the front side source/drain contact features 68dm, which are in electrical connection with the source/drain features 38, 40 in the drain side of the standard cell 56. Thus, the standard cell 56 may be connected to signal lines through the conductive paths through the filler cell 57d.

In the above embodiments, conductive paths formed through source/drain features in a standard cell or a filler cell may be used to connect a transistor to power rails or to signal lines. In other embodiments, the conductive paths form through the source/drain features may be used to achieve local interconnection.

Figure 26A:
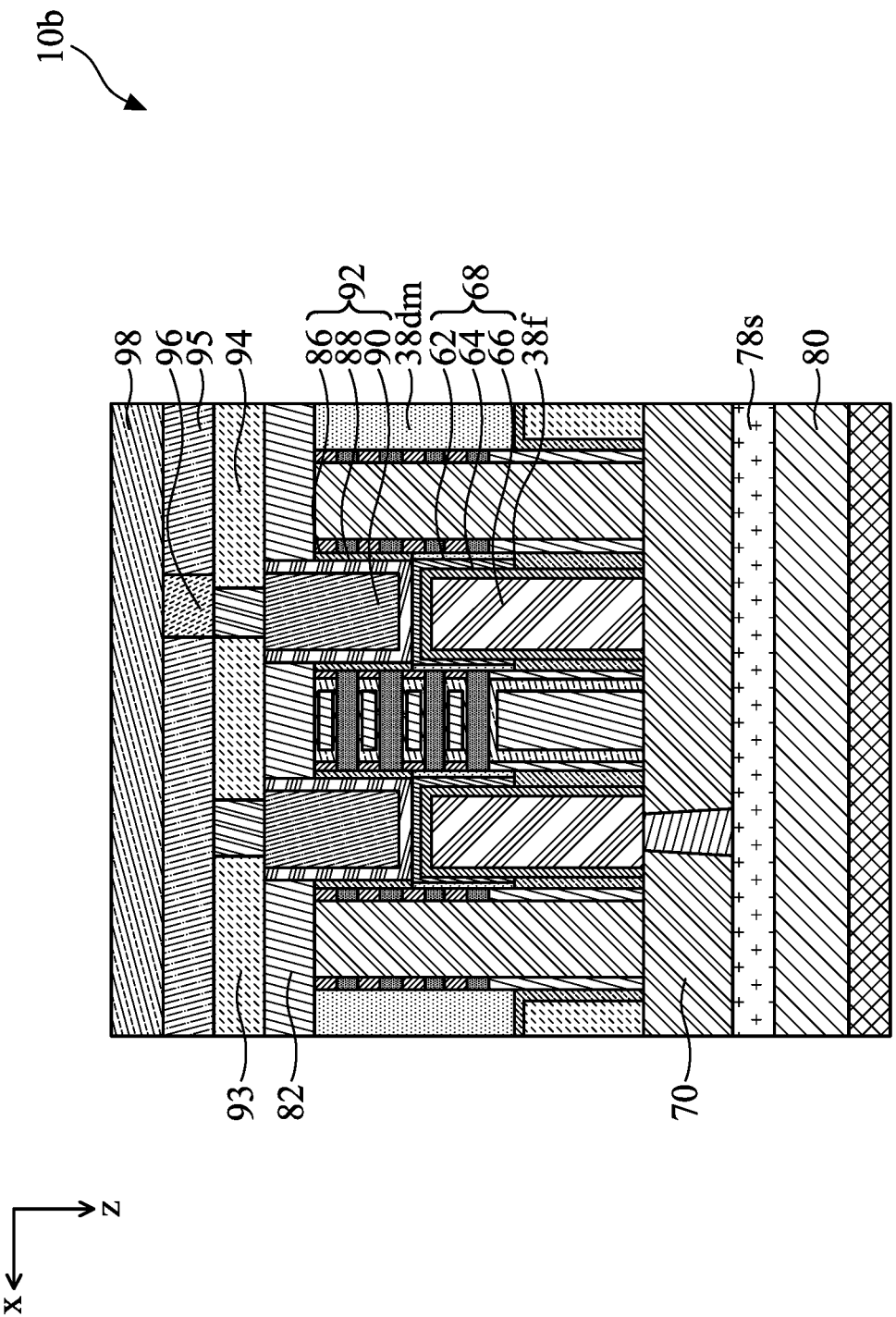
FIGS. 26A-C schematically illustrate a semiconductor device according to embodiments of the present disclosure.
Figure 26B:
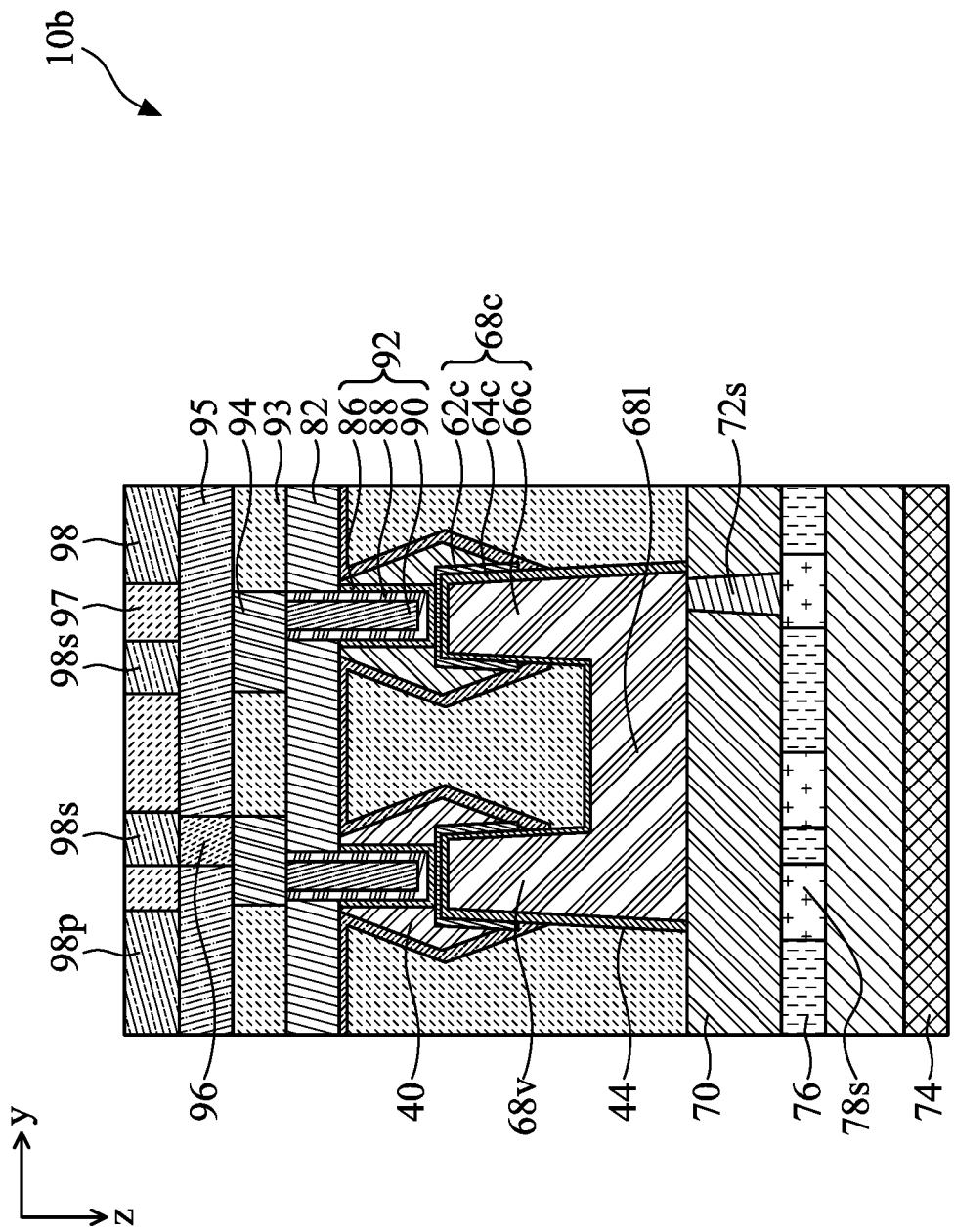
Figure 26C:
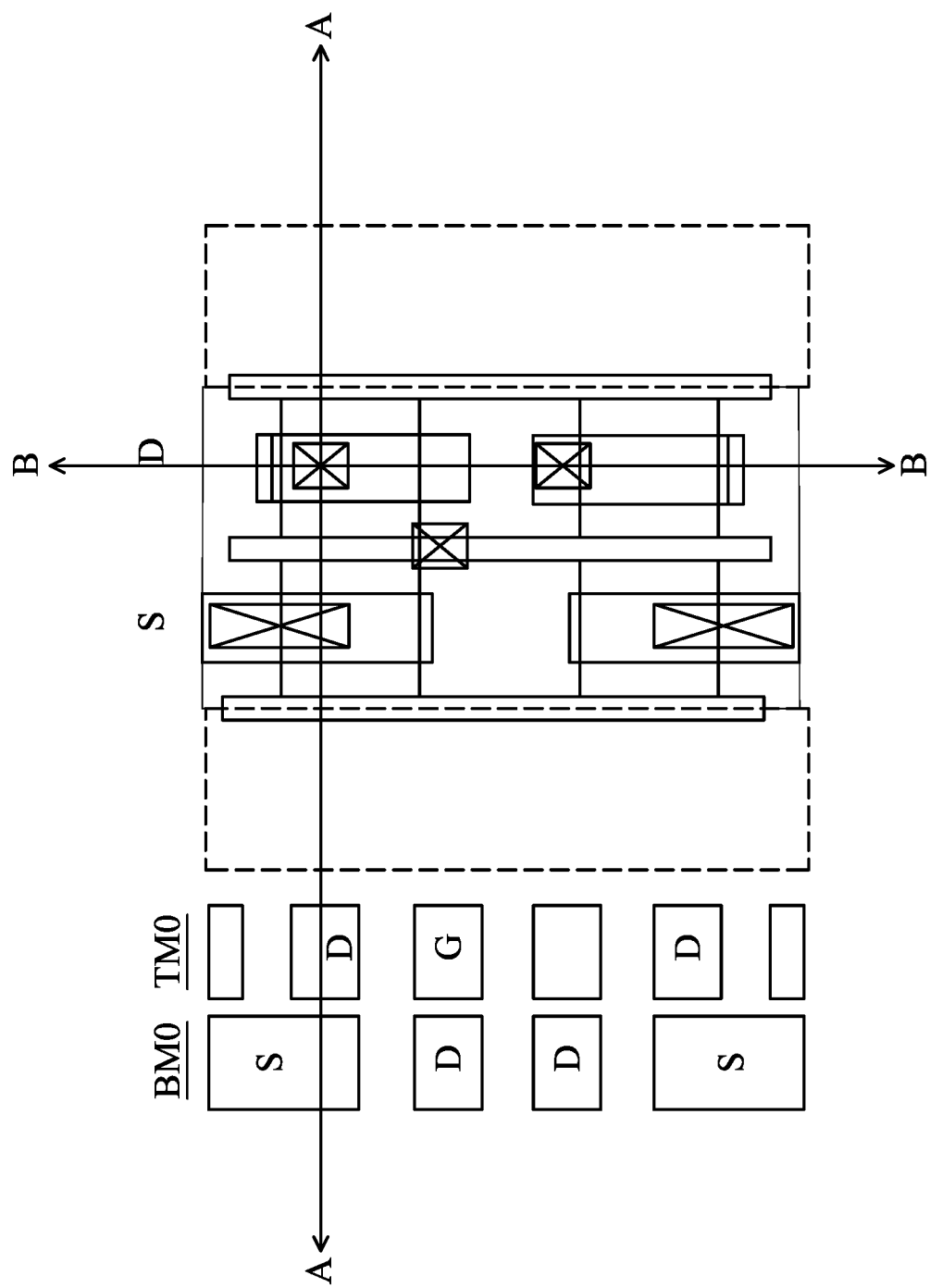

FIGS. 26A-C schematically illustrate a semiconductor device 10b according to embodiments of the present disclosure. The semiconductor device 10b uses conductive paths formed through source/drain features for local interconnect. The semiconductor device 10b is similar to the semiconductor device 10 except that conductive paths from the front side to the backside are connected to a local interconnect line. The semiconductor device 10b may be manufactured using a method similar to the method 100 using different patterns when forming conductive features, contact vias, and metal lines.

FIGS. 26A-B schematically show sectional views of the semiconductor device 10b after operation 136. FIG. 26C is a schematic layout view of the semiconductor device 10b.

FIG. 26A is a schematic sectional view of the semiconductor device 10b along the A-A line in FIG. 26C. FIG. 26B is a schematic sectional view of the semiconductor device 10b along the B-B line in FIG. 26B.

As shown in FIGS. 26A-B, the semiconductor device 10b includes a front side source/drain contact feature 68c. The front side source/drain contact feature 68c also functions as local interconnect line at the transistor level. Each of the front side source/drain contact features 68 may include a silicide layer 62c, a barrier layer 64c, and a metal feature 66c. In some embodiments, the barrier layer 64c may be omitted.

In the example of FIGS. 26A-C, the front side source/drain contact feature 68c joins both the source/drain feature 38 from the p-type device and the source/drain feature 40 of the n-type device, therefore, connecting the drain regions of the p-type device and the n-type device. Particularly, the front side source/drain contact feature 68c includes two vertical portions 68v and a line portion 68l. The two vertical portions 68v extend from the source/drain features 38, 40 respectively. The line portion 68l is formed in the ILD layer 44 and connects the two vertical portions 68v. The front side source/drain contact feature 68 is formed by varying the pattern when forming front side contact openings, such as during operation 116 in the method 100. The front side source/drain contact feature 68c may be of other form to achieve desired local connectivity.

As shown in FIG. 26B, the front side source/drain contact feature 68c is connected to the contact via 72s at the front side 38f of source/drain feature 38 of the p-type device. The contact via 72s is further connected to the signal line 78s in the front side metal layer 76. Even though the front side source/drain contact feature 68c is connected to the backside source/drain contact 92 extending to the backside 38b of the source/drain feature 38 of the p-type device, the backside source/drain contact 92 of the p-type device is not further connected to the backside metal layer 97. Instead, the side source/drain contact feature 68c is connected to the signal line 98s in the backside metal layer 97 through the backside source/drain contact feature 92 extending from the n-type device. As a result, the signal line in the front side metal layer 76, which aligns with the p-type device, is connected to the signal line in the backside metal line, which aligns with the n-type device.

Figure 27A:
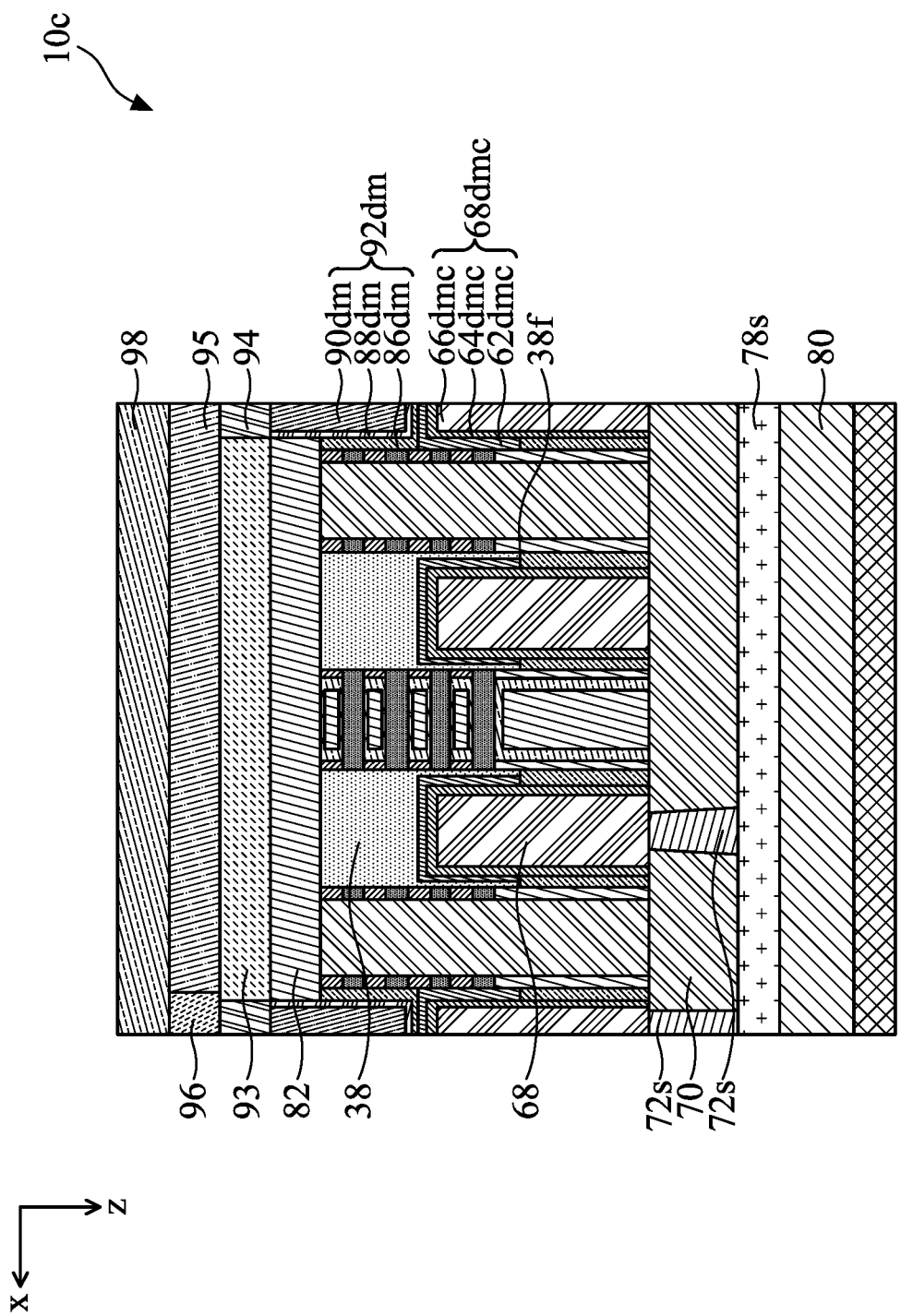
FIGS. 27A-C schematically illustrate a semiconductor device according to embodiments of the present disclosure.
Figure 27B:
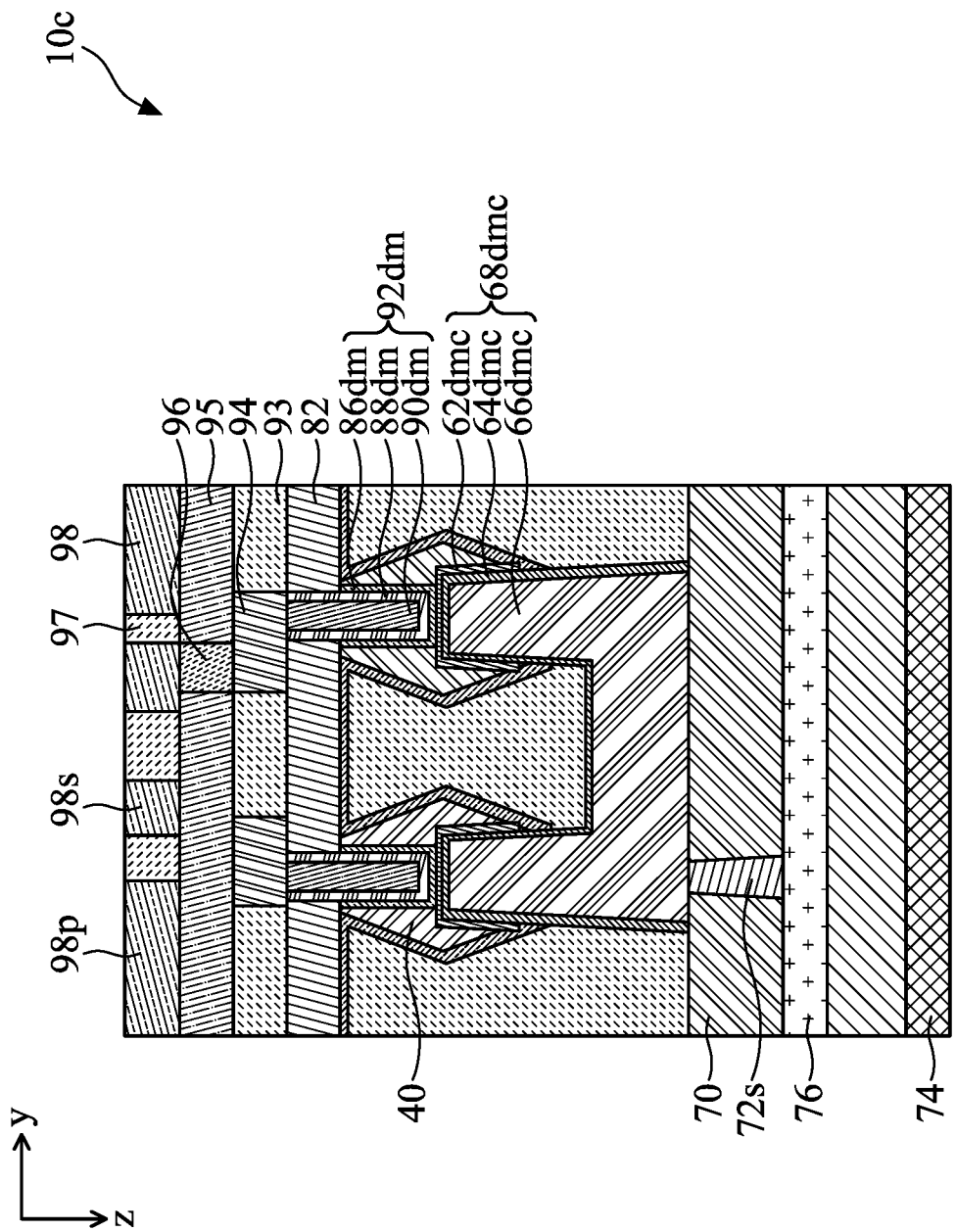
Figure 27C:
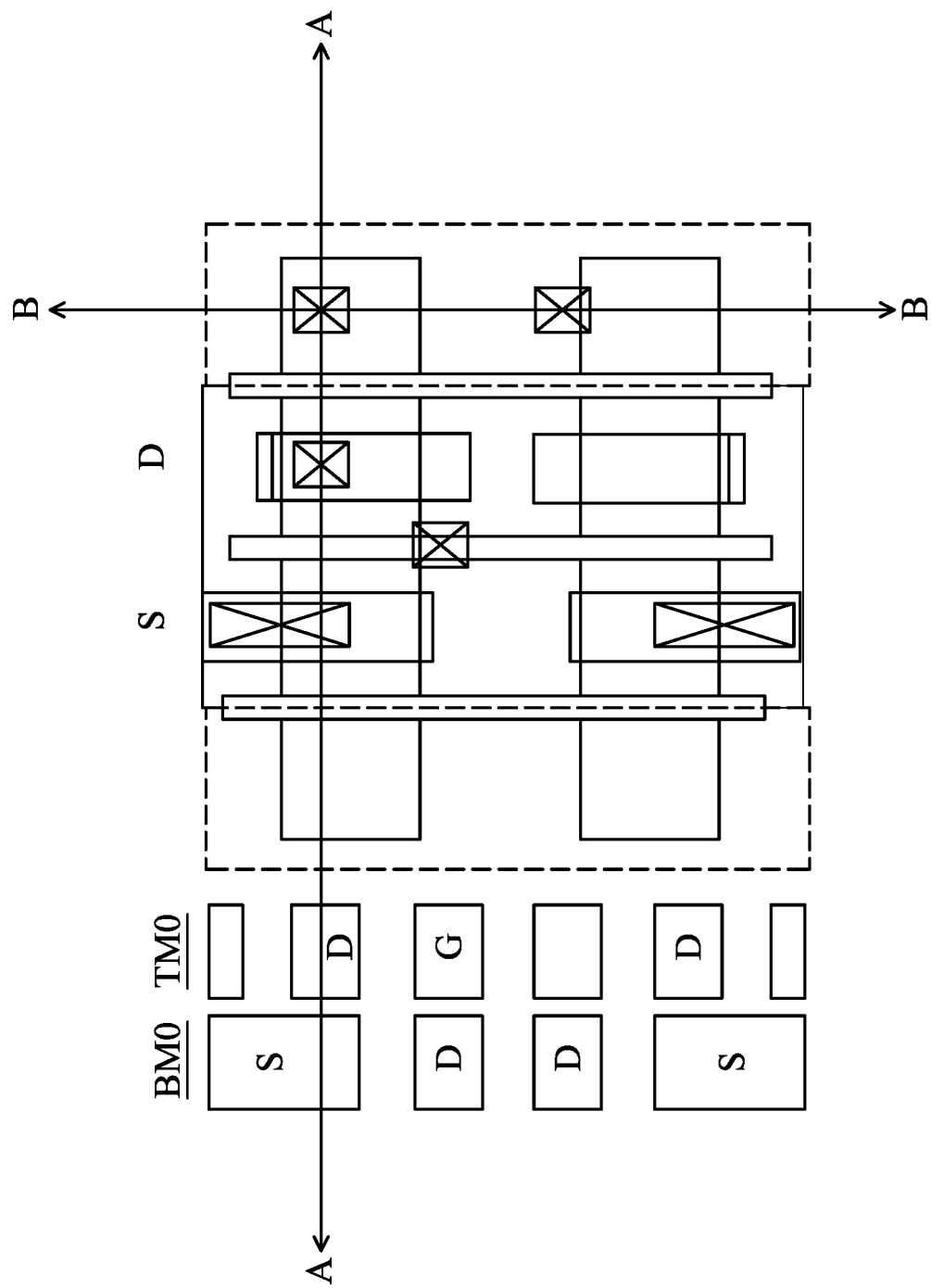

FIGS. 27A-C schematically illustrate a semiconductor device 10c according to embodiments of the present disclosure. The semiconductor device 10c uses conductive paths formed through source/drain features for local interconnect. The semiconductor device 10c is similar to the semiconductor device 10b except that conductive paths from the front side to the backside formed in filler cells. The semiconductor device 10c may be manufactured using a method similar to the method 100 using different patterns when forming conductive features, contact vias, and metal lines.

FIGS. 27A-B schematically show sectional views of the semiconductor device 10c after operation 136. FIG. 27C is a schematic layout view of the semiconductor device 10c. FIG. 27A is a schematic sectional view of the semiconductor device 10c along the A-A line in FIG. 27C. FIG. 27B is a schematic sectional view of the semiconductor device 10c along the B-B line in FIG. 27C.

As shown in FIGS. 27A-B, the semiconductor device 10c includes a front side source/drain contact feature 68dmc formed in the filler cell 57d. The front side source/drain contact feature 68dmc also functions as local interconnect line at the transistor level. Each of the front side source/drain contact features 68dmc may include a silicide layer 62dmc, a barrier layer 64*dmc*, and a metal feature 66*dmc*. In some embodiments, the barrier layer 64*dmc* may be omitted. As shown in FIG. 27B, similar to the front side source/drain contact feature 68*c*, the front side source/drain contact feature 68*dmc* connects the signal line in the front side metal layer 76, which aligns with the p-type device, is connected to the signal line in the backside metal line, which aligns with the n-type device. Referring to FIG. 27A, the front side source/drain contact features 68*dmc*, which are connected to the source/drain feature 38 in the drain side of the standard cell 56. Thus, the standard cell 56 may be connected to signal lines through the conductive paths through the filler cell 57*d*.

Various embodiments or examples described herein offer multiple advantages over the state-of-art technology. Semiconductor devices includes a front side to backside conductive path formed through a source/drain feature. The conductive path can be formed in a standard cell or in a filler transistor cell. The front side to backside conductive path enables flexible routing for local connections, backside signal connections, and backside power rail connection. Flexible routing leads to effective use of spaces in the metal layers, thus, allowing wider metal lines, and/or better compliance to design rules.

It will be understood that not all advantages have been necessarily discussed herein, no particular advantage is required for all embodiments or examples, and other embodiments or examples may offer different advantages.

Some embodiments of the present provide a semiconductor device. The semiconductor device includes a first source/drain feature having a first side and a second side opposing the first side, an ILD (interlayer dielectric) layer disposed over the first source/drain feature, wherein the ILD layer covers the first source/drain feature from the first side, an etch stop layer disposed on the second side of the first source/drain feature, a first contact feature, wherein a first end of the first contact feature is embedded in the first source/drain feature, and a second end of the first contact feature extends from the first source/drain feature through the ILD layer, and a second contact feature, wherein a first end of the second contact feature is embedded in the first source/drain feature and in contact with the first end of the first contact feature, and a second end of the second contact feature extends from the first source/drain feature through the etch stop layer.

Some embodiments of the present disclosure provide a semiconductor device. The semiconductor device includes a first source/drain feature, a first metal plug formed through the first source/drain feature, a second source/drain feature, a gate structure adjacent the first and second source/drain features, a first metal line disposed in a front side metal layer disposed above the gate structure, and a second metal line disposed in a backside metal layer disposed below the gate structure, wherein the first metal line and second metal line are electronically connected through a first conductive path including the first metal plug.

Some embodiments of the present disclosure provide a method for forming a semiconductor device. The method includes forming one of more transistors including source/drain features on a front side of a substrate, forming front side source/drain contact features in the source/drain features, forming a front side interconnect structure over the front side source/drain contact features, flipping the substrate over to process a backside of the substrate, forming backside contact openings in the source/drain features to expose the front side sourced/drain contact features, forming backside source/drain contact features in contact with the front side source/drain contact features, and forming a backside interconnect structure over the backside source/drain contact features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device, comprising:
    forming one of more transistors including source/drain features on a front side of a substrate;
    forming front side source/drain contact features in the source/drain features;
    forming a front side interconnect structure over the front side source/drain contact features;
    flipping the substrate over to process a backside of the substrate;
    forming backside contact openings in the source/drain features to expose the front side sourced/drain contact features;
    forming backside source/drain contact features in contact with the front side source/drain contact features; and
    forming a backside interconnect structure over the backside source/drain contact features.

2. The method of claim 1, further comprising:
    forming an etch stop layer after flipping the substrate and prior to forming the backside contact openings.

3. The method of claim 2, further comprising:
    forming a routing layer over the etch stop layer prior to forming the backside interconnect structure.

4. The method of claim 1, further comprising, prior to forming the front side source/drain contacts:
    removing a gate structure disposed against a sidewall spacer in contact with the source/drain features; and
    depositing a filler dielectric material in a cavity vacated by the gate structure.

5. The method of claim 1, wherein forming front side source/drain contact features comprises:
    recess-etching the source/drain features from the front side to form front side contact openings; and
    forming a line opening connecting two front side contact openings.

6. A method, comprising:
    forming a first source/drain feature having a first side and a second side opposing the first side;
    depositing an ILD (interlayer dielectric) layer over the first source/drain feature, wherein the ILD layer covers the first source/drain feature from the first side;
    forming a first contact feature, wherein a first end of the first contact feature is embedded in the first source/drain feature, and a second end of the first contact feature extends from the first source/drain feature through the ILD layer;
    depositing an etch stop layer on the second side of the first source/drain feature; and
    forming a second contact feature, wherein the second contact feature comprises a metal material, a first end of the second contact feature is embedded in the first source/drain feature and in contact with the first end of the first contact feature, and a second end of the second contact feature extends from the first source/drain feature through the etch stop layer.

7. The method of claim 6, wherein forming the first contact feature comprises:
forming a silicide layer; and
depositing a metal feature, wherein the silicide layer is around a portion of the metal feature, and the silicide layer is in contact with the first source/drain feature and the second contact feature.

8. The method of claim 7, further comprising forming a barrier layer, wherein the barrier layer is in contact with the metal feature and the silicide layer.

9. The method of claim 6, further comprising:
forming a first metal layer comprising a first metal line over the first side of the first source/drain feature; and
forming a second metal layer comprising a second metal line on the second side of the first source/drain feature, wherein the first metal line is electrically connected to the second metal line through a conductive path including the first contact feature and the second contact feature.

10. The method of claim 9, wherein the first metal line and second metal line are signal lines.

11. The method of claim 9, wherein the second metal line is connected to a power rail.

12. The method of claim 9, further comprising:
forming a routing layer between the etch stop layer and the second metal layer.

13. The method of claim 6, wherein the first source/drain feature is located in a filler cell.

14. A method, comprising:
forming a first source/drain feature and a second source/drain feature;
forming a first metal plug through the first source/drain feature;
forming a gate structure adjacent the first and second source/drain features;
forming a first metal line in a front side metal layer above the gate structure; and
forming a second metal line in a backside metal layer below the gate structure,
wherein the first metal line and second metal line are electronically connected through a first conductive path including the first metal plug,
wherein forming the first metal plug comprises:
forming a first front side source/drain contact feature partially in the first source/drain feature; and
forming a first backside source/drain contact feature in contact with the first front side source/drain contact feature.

15. The method of claim 14, further comprising:
forming a first sidewall spacer on a first side of the gate structure; and
forming a second sidewall spacer formed on a second side of the gate structure,
wherein the first sidewall spacer is in contact with the first source/drain feature and second source/drain feature.

16. The method of claim 15, wherein the first front side source/drain contact feature comprises:
a first vertical portion extending from the first source/drain feature;
a second vertical portion extending from the second source/drain feature; and
a line portion connecting the first and second vertical portion,
wherein the first metal line is connected to the first vertical portion through the second vertical portion and the line portion.

17. The method of claim 15, wherein the gate structure is a dummy gate structure comprising a filler dielectric material disposed between the first sidewall spacer and second sidewall spacer.

18. The method of claim 15, further comprising:
forming a first sidewall spacer on a first side of the gate structure;
forming a second sidewall spacer on a second side of the gate structure, wherein the first sidewall spacer is in contact with the first source/drain feature, and the second sidewall is in contact with the second source/drain feature;
forming a second metal plug through the second source/drain feature; and
forming a third metal line in the backside metal layer, wherein the third metal line is electronically connected to the second metal plug.

19. The method of claim 18, wherein the first and second metal lines are signal lines, and the third metal line is connected to a power rail.

20. The method of claim 14, wherein the first front side source/drain contact feature comprises a silicide layer.

\* \* \* \* \*